United States Patent [19]

Babbs et al.

[11] Patent Number: 5,834,915
[45] Date of Patent: Nov. 10, 1998

[54] SUSTRATE HOUSING AND DOCKING SYSTEM

[75] Inventors: Daniel A. Babbs; Richard E. Shultz; John Van Strien, all of Austin, Tex.

[73] Assignee: Progressive System Technologies, Inc., Austin, Tex.

[21] Appl. No.: 646,475

[22] Filed: May 8, 1996

Related U.S. Application Data

[62] Division of Ser. No. 320,947, Oct. 11, 1994.

[51] Int. Cl.⁶ ...................................................... H02D 1/00
[52] U.S. Cl. .......................... 318/282; 414/935; 414/940; 414/788; 206/565; 206/804
[58] Field of Search ...................................... 414/935, 940, 414/788; 318/282; 206/565, 804

[56] References Cited

U.S. PATENT DOCUMENTS

| 4,790,921 | 12/1988 | Bloomquist et al. | 414/935 X |
| 5,313,596 | 5/1994 | Swindler et al. | 414/935 X |
| 5,604,443 | 2/1997 | Kitamura et al. | 414/788 X |

*Primary Examiner*—Karen Masih
*Attorney, Agent, or Firm*—Akin, Gump, Strauss, Hauer & Feld, L.L.P.

[57] ABSTRACT

A modular, transportable housing for storing substrates, such as semi-conductor wafers and masks, and for maintaining such substrates in a substantially clean environment. Substrates are supported within the housing by a plurality of combs which maintain the substrates in spaced relationship relative to each other. Access to the interior of the housing is permitted by a pivotal door assembly. A docking unit permits interface of the housing with a clean environment. Control circuitry provided in the docking unit detects the presence of a housing and loads/unloads the housing as directed by a host computer through a communication link. A memory device is preferably mounted to the housing for storing history and other information about the substrates within the housing. The host computer directs the control circuitry to retrieve the substrate information from the memory and relay the information to the host computer. During or after processing of the substrates, the host computer updates the memory as desired. In this manner, the host computer controls and tracks one or more docking units and associated substrate housings.

29 Claims, 55 Drawing Sheets

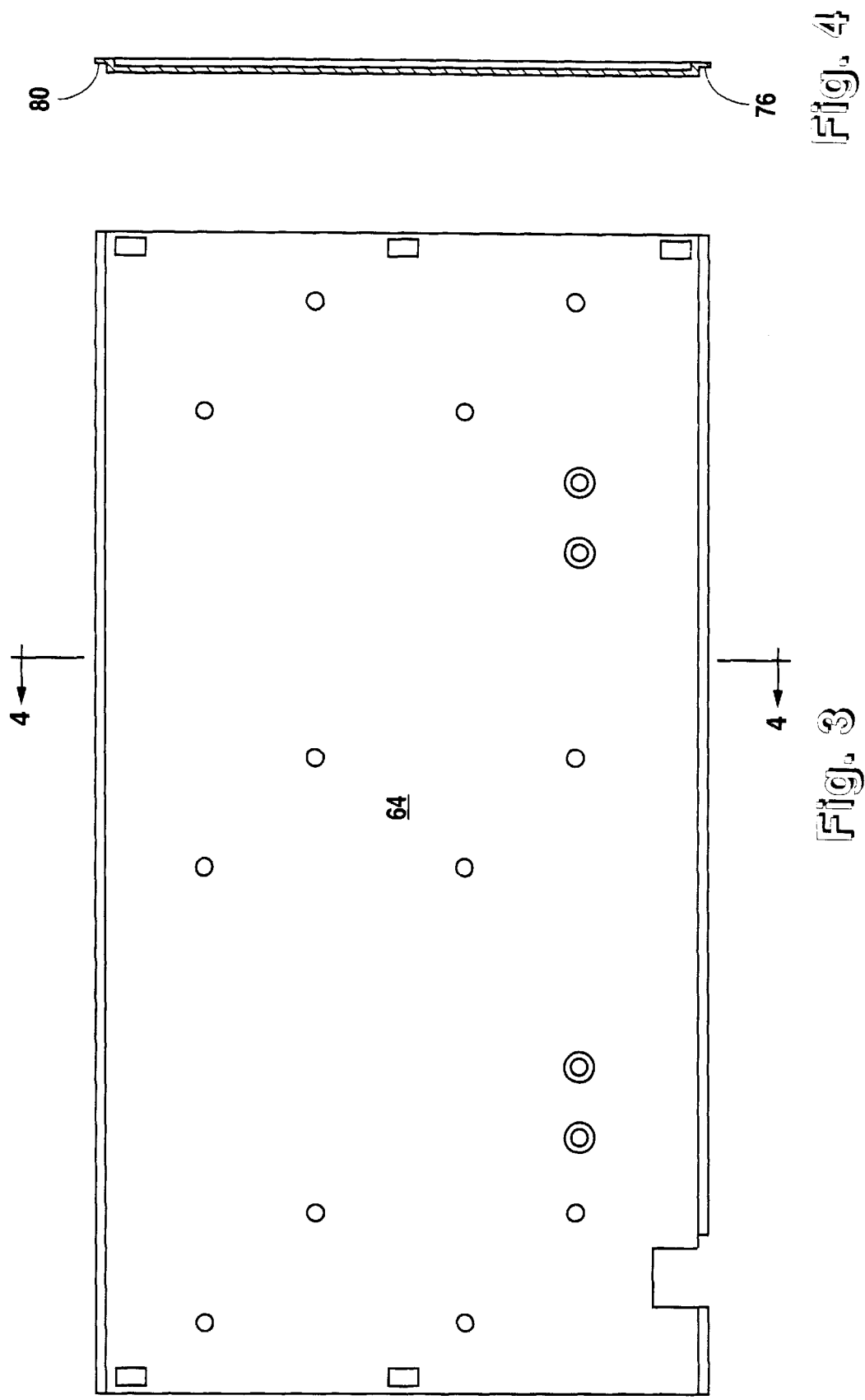

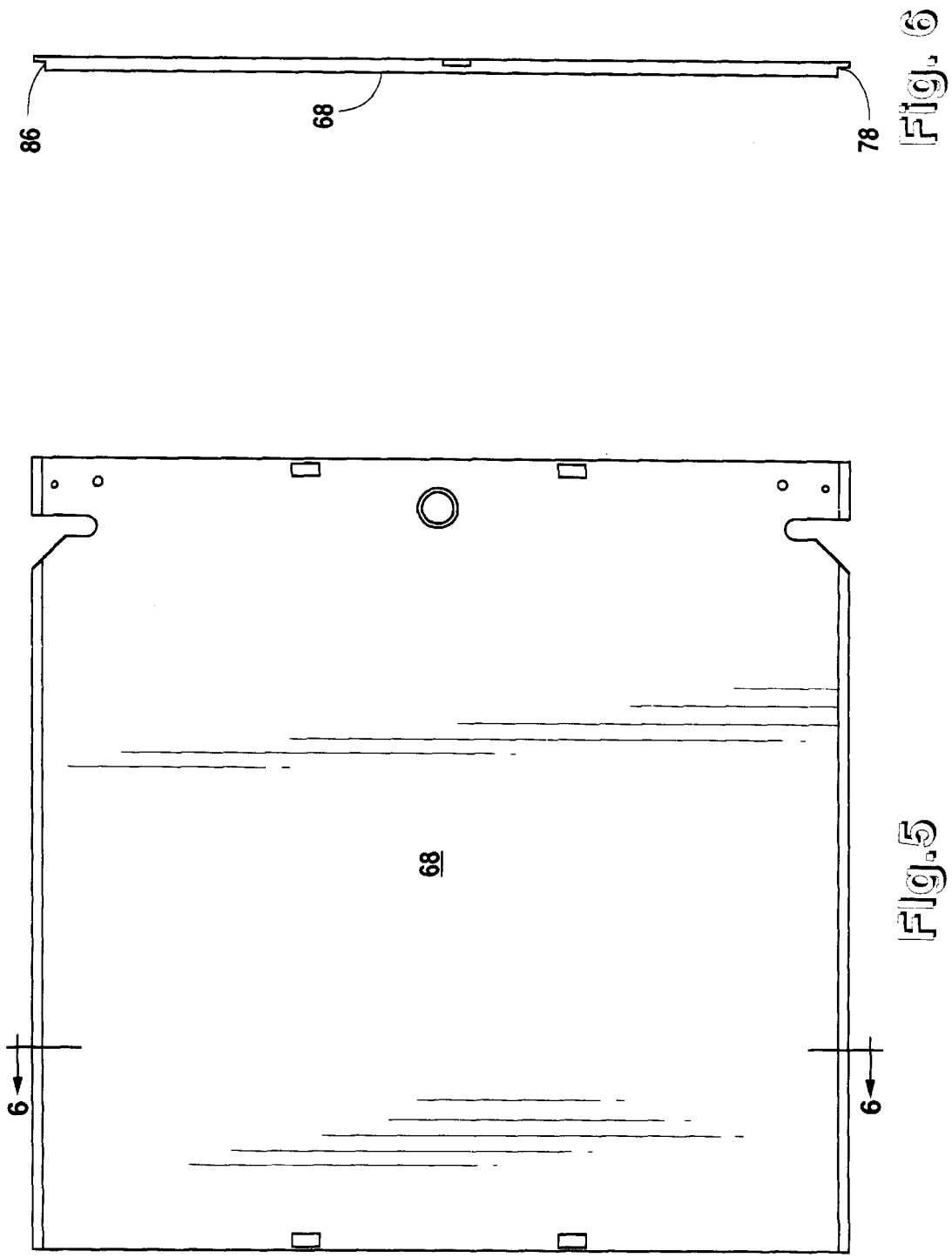

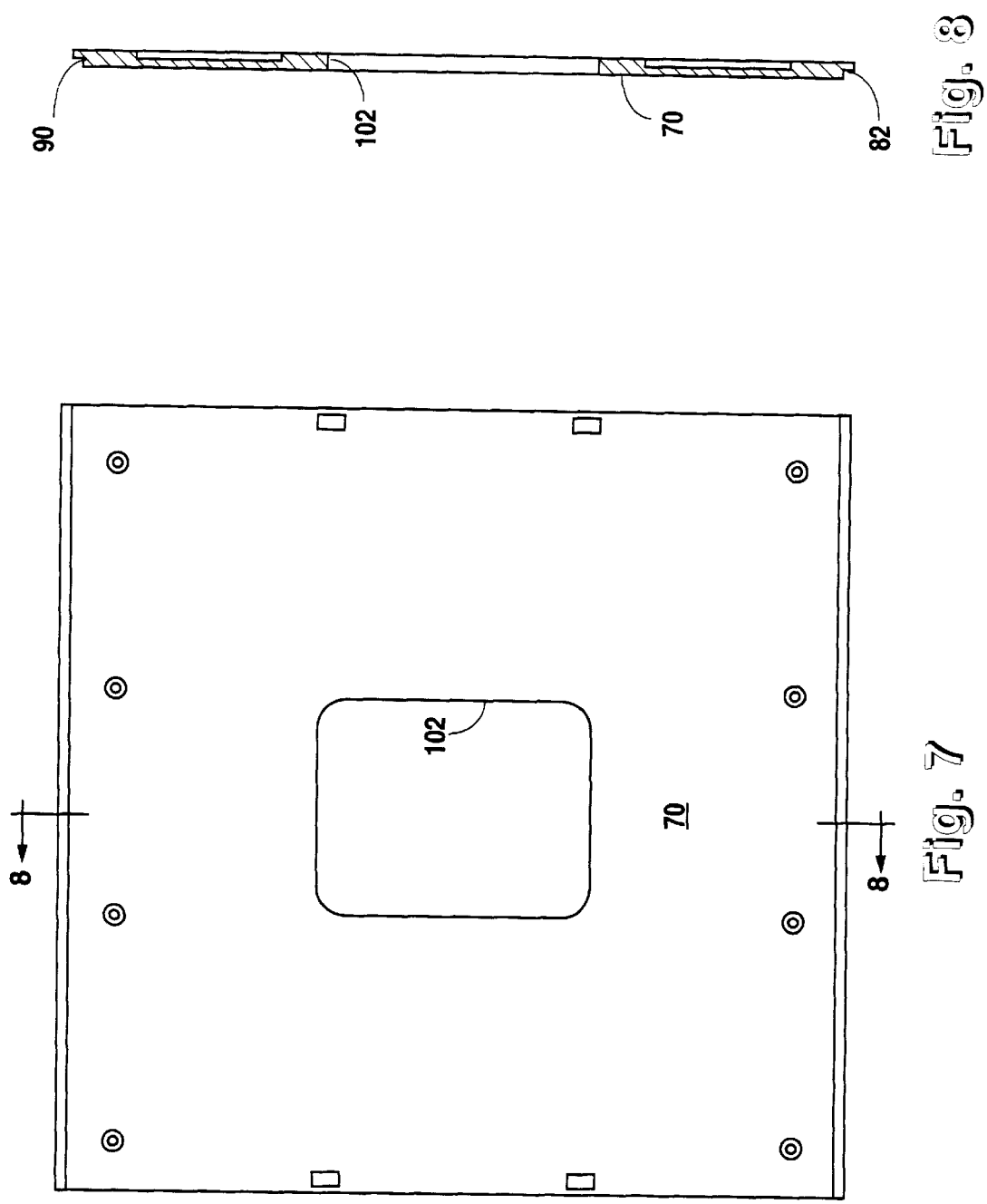

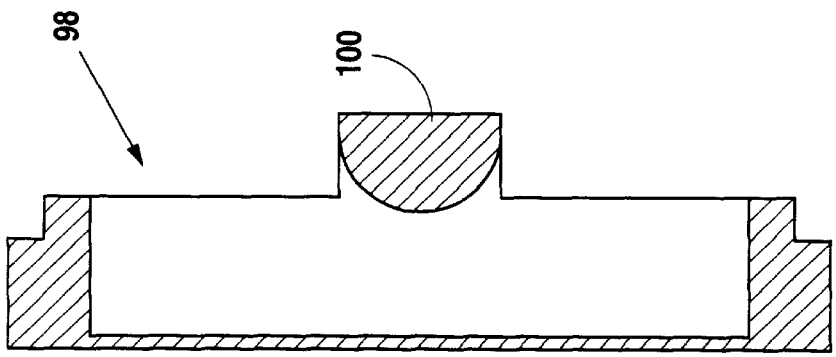
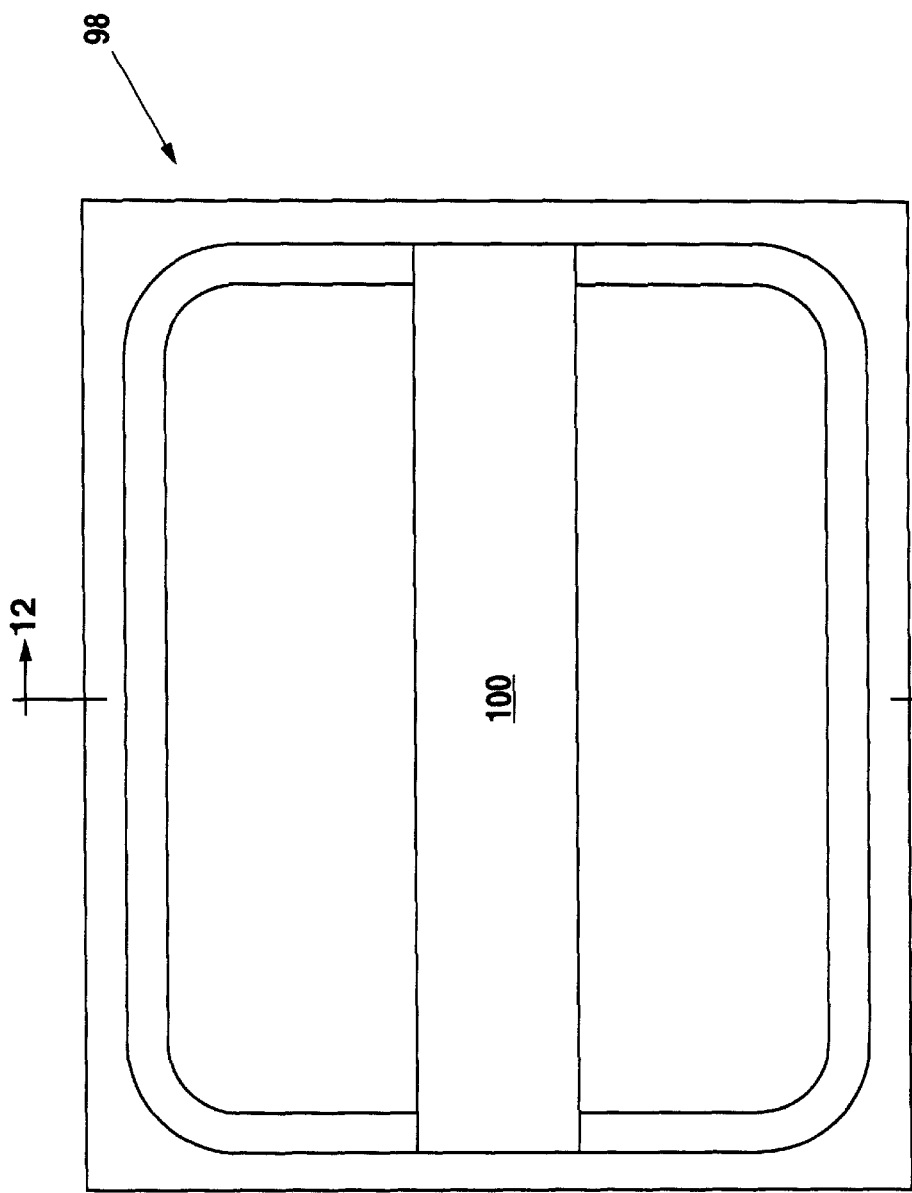
Fig. 12
Fig. 11

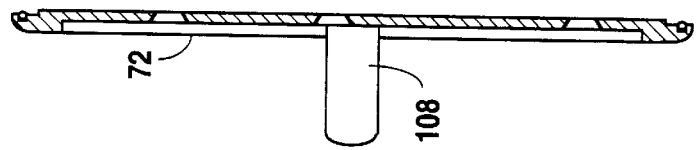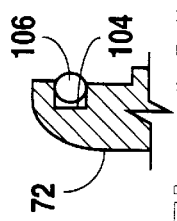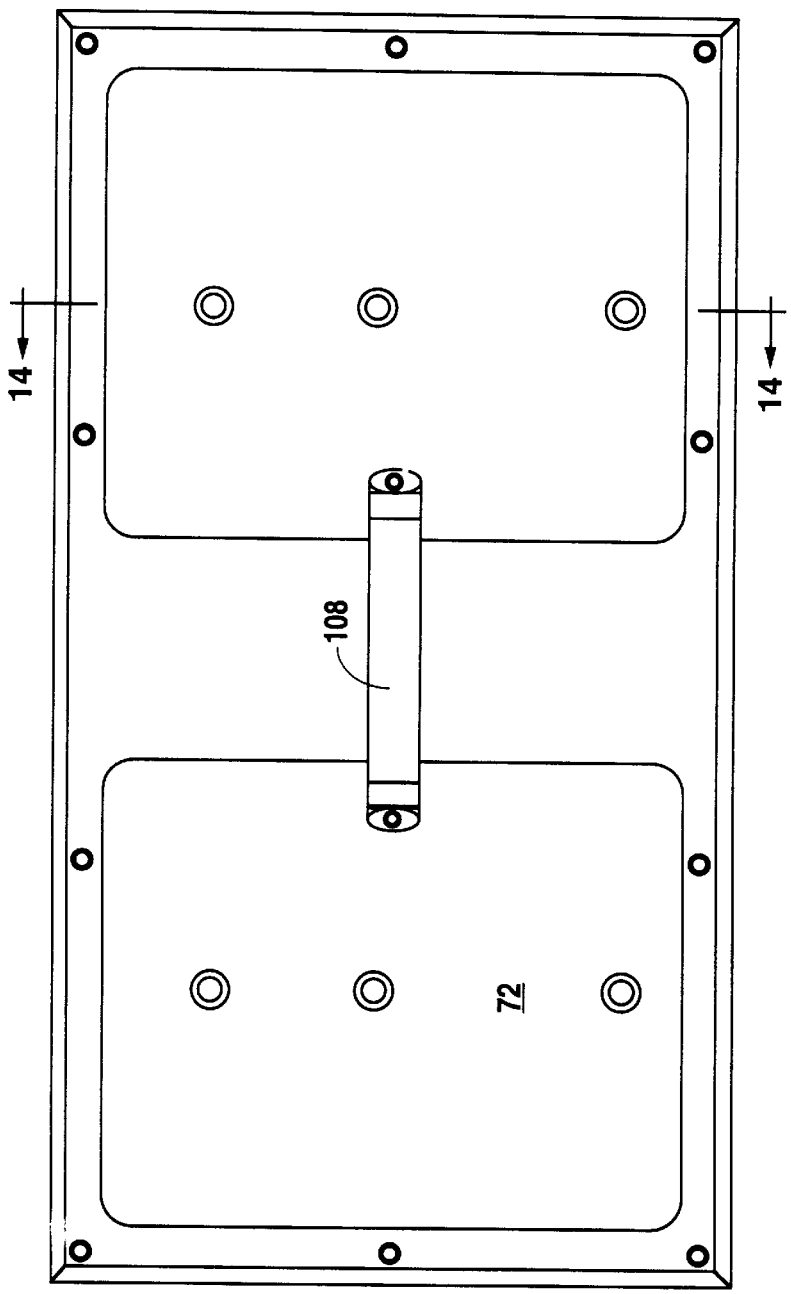

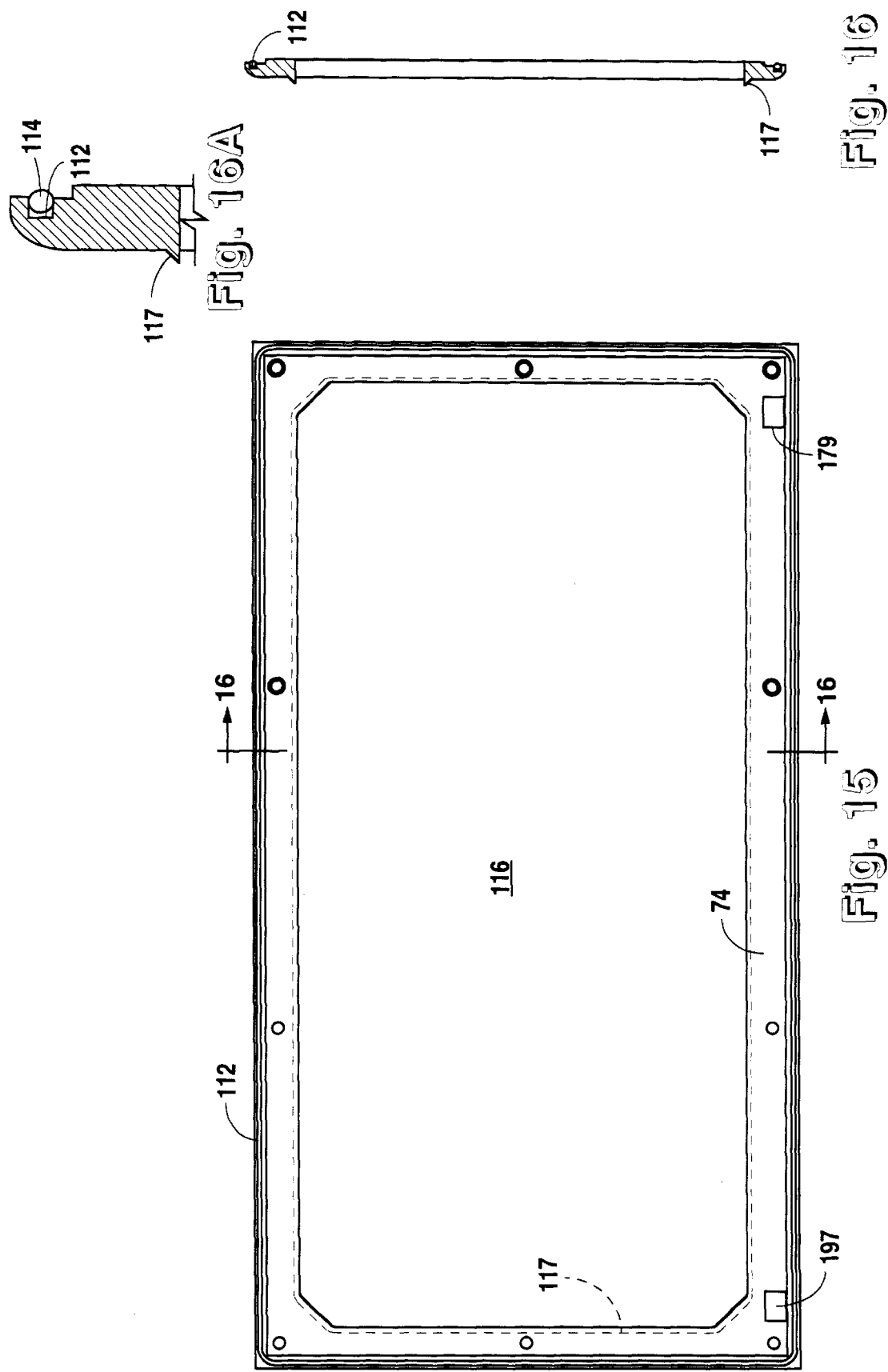

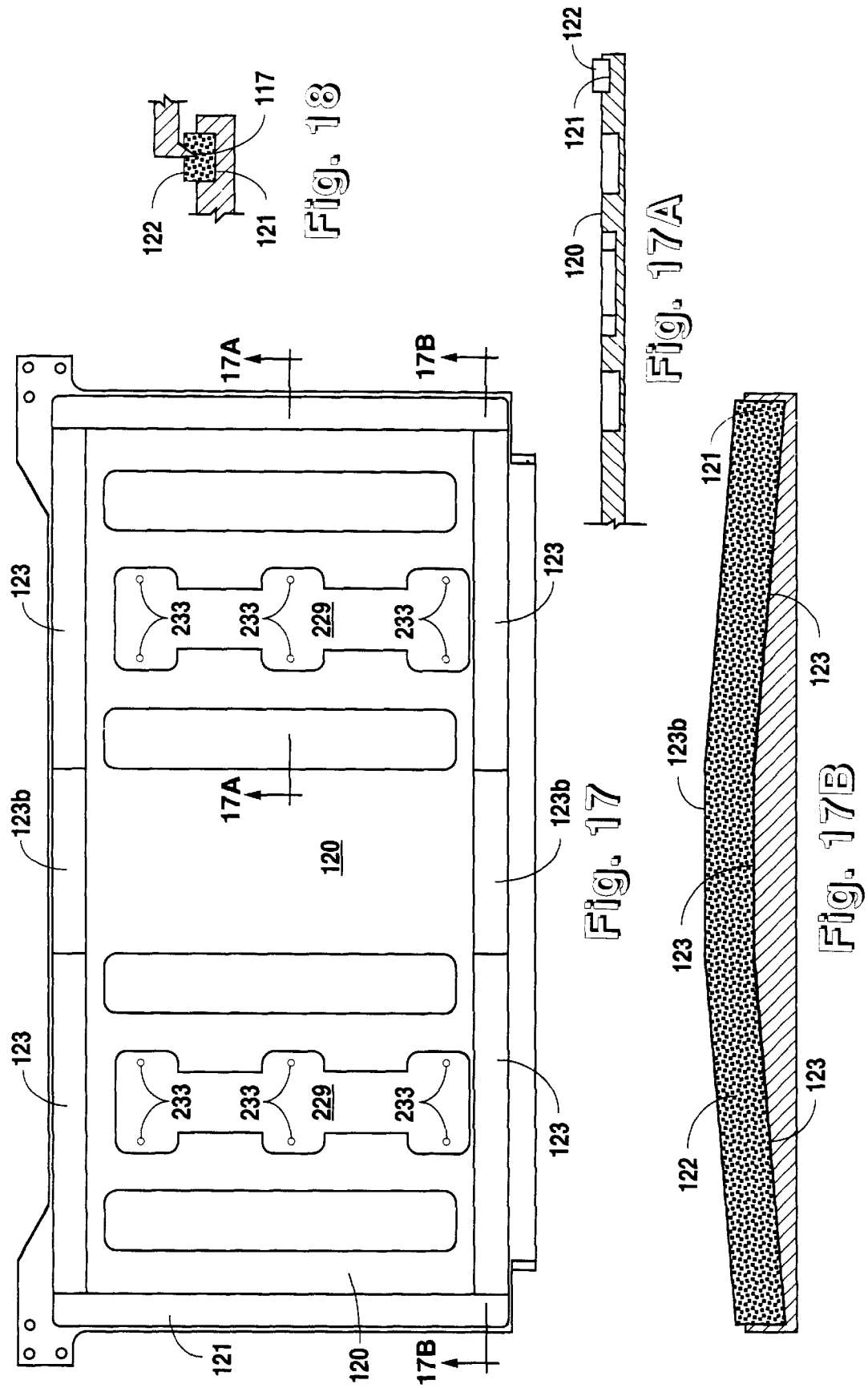

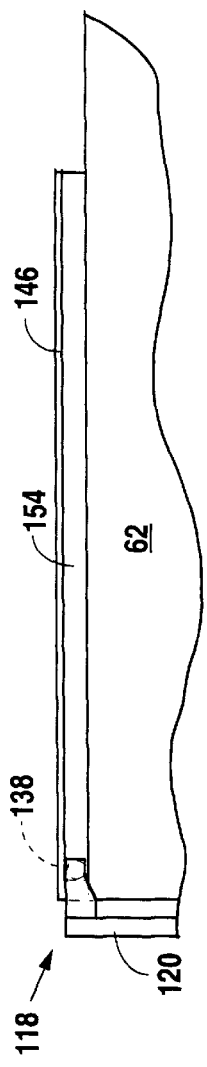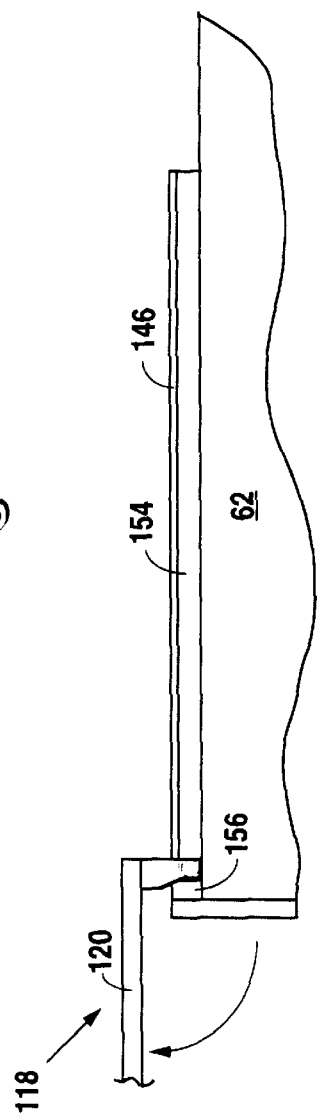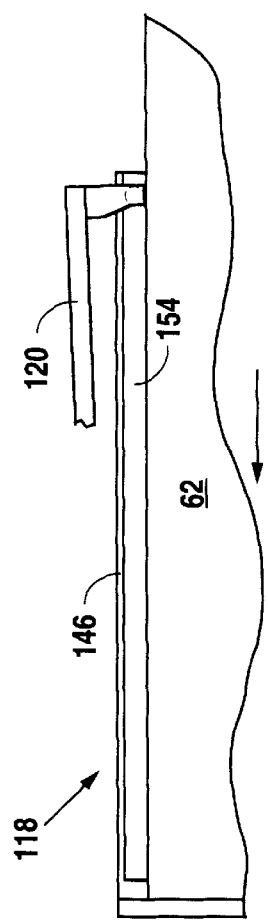

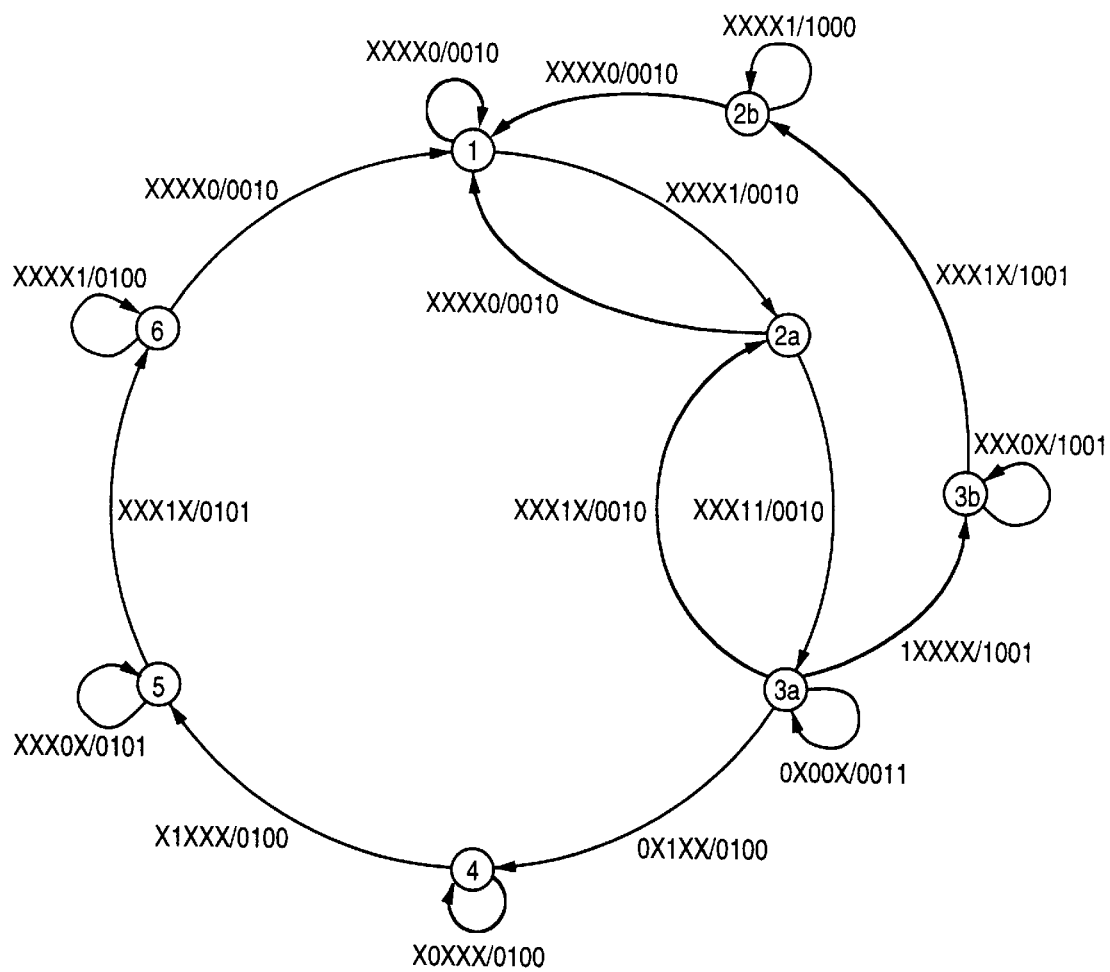
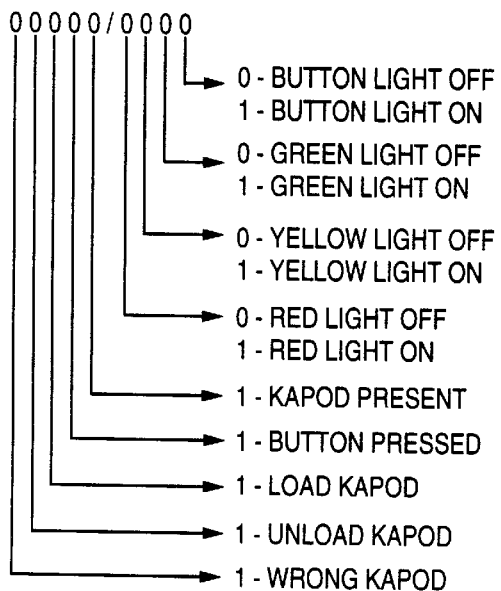
Fig. 61
STATE DEFINITIONS
1 - READY FOR KAPOD (NO KAPOD PRESENT).
2a - KAPOD DETECTED ON TRAY AND NO PREVIOUS ERRORS.
2b - KAPOD DETECTED ON TRAY, BUT WRONG ONE.
3a - KAPOD ENGAGED AND READY FOR LOADING.
3b - KAPOD ENGAGED, BUT WRONG ONE.
4 - KAPOD IN PROCESS (LOADING/UNLOADING OR LOADED)
5 - KAPOD ENGAGED AND READY TO BE REMOVED FROM ADU.
6 - KAPOD DETECTED ON TRAY, JUST COMPLETED PROCESSING.

SUSTRATE HOUSING AND DOCKING SYSTEM

RELATED APPLICATIONS

This is a division of application Ser. No. 08/320,947 filed on Oct. 11, 1994 to Babbs et al.

FIELD OF THE INVENTION

The present invention relates to a housing for articles and a docking unit for receiving the housing, and more particularly to a transportable housing for storing a plurality of substrates in a substantially clean environment and a docking unit for permitting interface of the housing with a clean environment.

DESCRIPTION OF THE RELATED ART

The processing of semi-conductor substrates, such as wafers and masks and flat panel displays, typically requires the storage of the substrates in a substantially clean environment before and after processing. Further, it is typically necessary for the substrates to be transported to or be in proximity with a "mini environment," which is a localized environment created by an enclosure to isolate the substrates from contamination and people. Typical semi-conductor processing equipment further includes means for transferring the housing or substrates into and out of a mini environment such as robotic equipment and the like.

Prior apparatus for handling substrates includes a housing having a removable cassette therein which receives the substrates. The entire housing must first be manually lifted to a significant height and placed onto an access apparatus adjacent the mini environment. Such manual lifting limits the acceptable maximum size and weight of a fully loaded housing. The housing bottom is unlatched and the cassette is vertically lowered with the bottom of the housing. Such bottom access renders the housing susceptible to a loss of the cassette in the event of a housing door failure. Further, in prior apparatus, the cassette must be manipulated by a robot or other apparatus after it is lowered from the housing to laterally relocate the cassette from the housing bottom to a location accessible from the mini environment for manipulation of the substrates. Thus, a rather complicated procedure is required to access the substrate. Further, the access apparatus consumes valuable floor space adjacent the mini environment due to a rather large footprint.

SUMMARY OF THE INVENTION

Accordingly, the present invention provides a modular, transportable housing for storing articles such as substrates, including semiconductor wafers, masks and flat panel displays, for example, and for maintaining such articles in a substantially clean environment. Preferably, the substrates are supported within the housing by a plurality of combs which are mounted within the housing and which maintain the substrates in a spaced relationship relative to each other. Access to the interior of the housing is permitted by a door assembly on the front of the housing. Latches are preferably provided on the housing to keep the door assembly in a locked position until access is desired. The door assembly preferably comprises a door pivotally mounted to the housing by a pair of tracks mounted on the top of the housing, thereby permitting relative movement of the housing and door.

A docking unit according to the present invention is located near or adjacent a mini environment allowing interface of the substrate housing to the mini environment. The docking unit comprises a frame having a movable tray for receiving the substrate housing when the tray is in a retracted position. In the preferred embodiment, the housing includes bearings for rollably engaging corresponding plates on the docking unit for horizontally guiding the housing onto the tray. The tray is manipulated by a motor assembly for positioning the tray in a retracted, middle and an inserted position. The docking unit further comprises a cam assembly for engaging the housing door latches when the tray is in the middle position and a port door assembly for simultaneously opening a port door on the docking unit and the housing door. The port and housing doors rotate 90° C. about a fixed common center of rotation (FCCR) at an upper front edge of the housing. Thus, the door is placed in a stowed, horizontal position clearing a path between the housing and the mini environment. The tray and housing are then moved to the inserted position to abut the docking unit bulkhead and permit access to the substrates from the mini environment. During insertion of the housing with substrate, the housing door remains stationary so that the tracks allow slideable movement of the housing relative to the door. In this manner, the door is stowed away in a convenient location without consuming valuable space.

In the preferred embodiment, control circuitry including a microcontroller is provided on the docking unit to automatically detect the presence of a substrate housing placed on the docking unit, and to prompt an operator to load the substrate housing for processing. A memory device is preferably mounted on the substrate housing for storing and updating history and other information of the housing and its substrates. A host computer preferably controls one or more such docking units by sending messages and commands through a communication link. The host computer controls operation by sending commands to load and unload the substrate housing and to retrieve the stored history information. In response, the control circuitry of the docking unit reads the memory device of the substrate housing and passes the requested information to the host computer through the communication link. Furthermore, during or after processing, the host computer sends updated information to the docking unit, and the control circuitry writes the updated information in the memory of the substrate housing. In this manner, a single host computer controls and tracks one or more docking units and associated substrate housings.

Due to the configuration of the docking unit and horizontal movement of the substrate housing, several docking units may be stacked on top of one another to achieve a multiple unit configuration. A top plate of one docking unit serves as the bottom plate of another. In this manner, multiple docking units are provided in the same floor space or footprint of a single unit.

Accordingly, a substrate housing and docking unit system according to the present invention provides several significant advantages over systems of prior art. A single integrated housing with support combs maintains the integrity of the substrates in a clean and secure environment with less probability of accidental compromise. The entire integrated housing is laterally inserted into the mini environment for direct access without intermediate removal of the substrate from the protective housing. Lateral movement of the housing for placement onto a docking unit eliminates lifting the housing above the docking and inserted position. Such movement also simplifies the loading procedure, substantially reduces the footprint of each docking unit and facilitates stacking of two or more units together.

BRIEF DESCRIPTION OF THE DRAWINGS

A better understanding of the present invention can be obtained when the following detailed description of the preferred embodiment is considered in conjunction with the following drawings, in which:

FIG. 3 is an elevational view of the inside of the left panel in the preferred embodiment of the substrate housing of the present invention;

FIG. 4 is a cross-sectional view taken along section lines 4—4 of FIG. 3;

FIG. 5 is a plan view of the inside of the bottom panel in the preferred embodiment of the substrate housing of the present invention;

FIG. 6 is a cross-sectional view taken along section lines 6—6 of FIG. 5;

FIG. 7 is a plan view of the inside of the top panel in the preferred embodiment of the substrate housing of the present invention;

FIG. 8 is a cross-sectional view taken along section lines 8—8 of FIG. 7;

FIG. 11 is a plan view of the handle in the preferred embodiment of the substrate housing of the present invention;

FIG. 12 is a cross-sectional view taken along section lines 12—12 of FIG. 11;

FIG. 13 is an elevational view of the outside of the rear panel in the preferred embodiment of the substrate housing of the present invention;

FIG. 14 is a cross-sectional view taken along section lines 14—14 of FIG. 13;

FIG. 14A is an enlarged view of the top of FIG. 14 illustrating the position of an O-ring gasket;

FIG. 15 is an elevational view of the inside of the front panel in the preferred embodiment of the substrate housing of the present invention;

FIG. 16 is a cross-sectional view taken along section lines 16—16 of FIG. 15;

FIG. 16A is an enlarged view of the top of FIG. 16 illustrating the position of an O-ring gasket;

FIG. 17 is an elevational view of the inside of the door in the preferred embodiment of the substrate housing of the present invention;

FIG. 17A is a center line cross-sectional view taken along section lines 17A—17A of FIG. 17 illustrating half of the housing door;

FIG. 17B is a cross-sectional view taken along section lines 17B—17B of FIG. 17;

FIG. 18 is a cross-sectional view illustrating the engagement of the front panel and housing door in the preferred embodiment of the substrate housing of the present invention;

FIG. 21A is a side view of the right door track in the preferred embodiment of the substrate housing of the present invention illustrating the door in the CLOSED position;

FIG. 21B is a side view of the preferred embodiment of the substrate housing of the present invention illustrating the door in the OPENED position;

FIG. 21C is a side view of the preferred embodiment of the substrate housing of the present invention illustrating the door in the stowed position;

FIG. 61 is a state diagram illustrating the general operation of the docking unit according to the present invention;

FIGS. 62A and 62B show a flowchart diagram illustrating a routine executed by the microcontroller of FIG. 60 when the docking unit is initially powered on;

DETAILED DESCRIPTION OF THE PREFERRED EMBODIMENT

Figure 1:
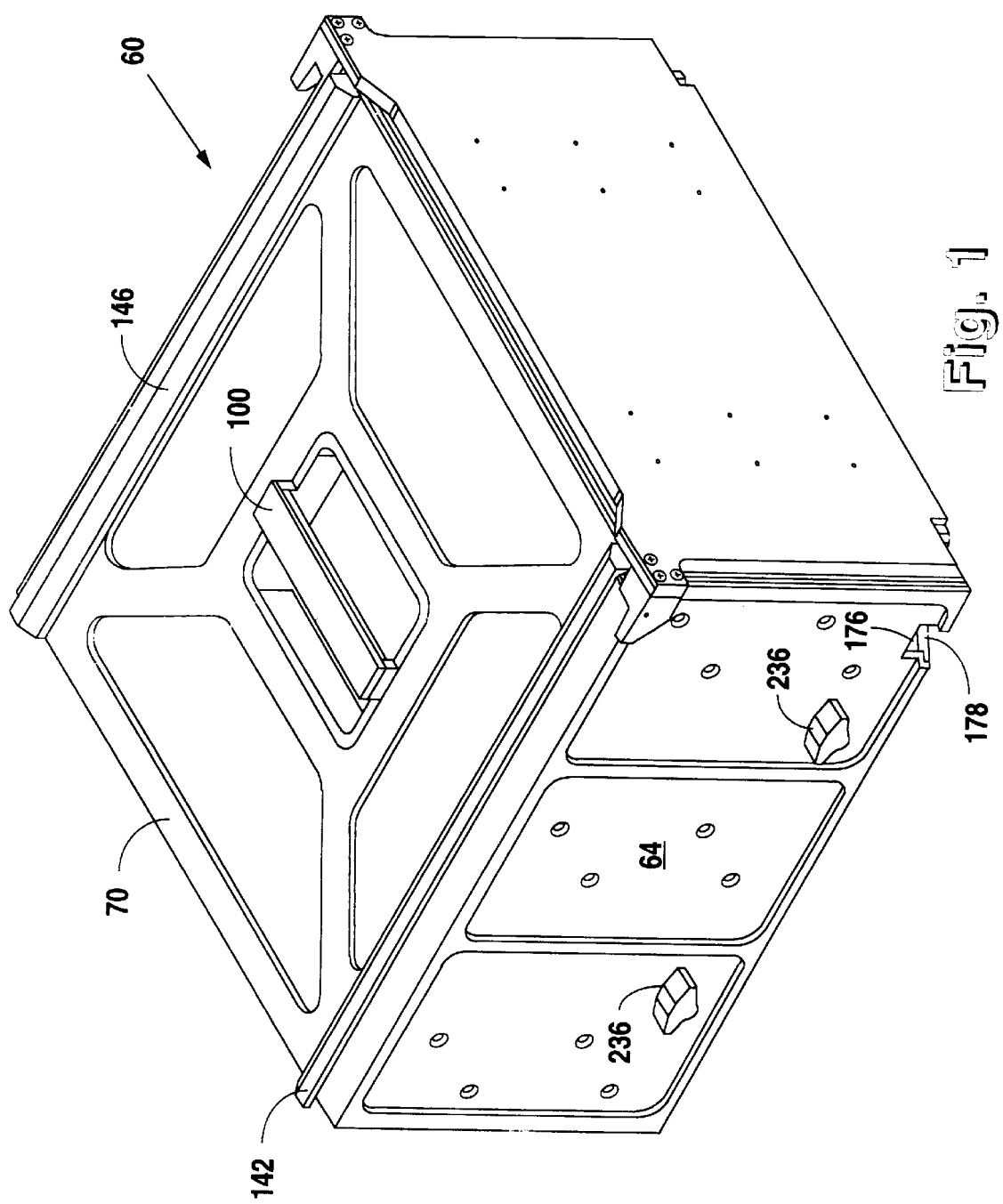
FIG. 1 is perspective view of the preferred embodiment of the substrate housing of the present invention.
Figure 2:
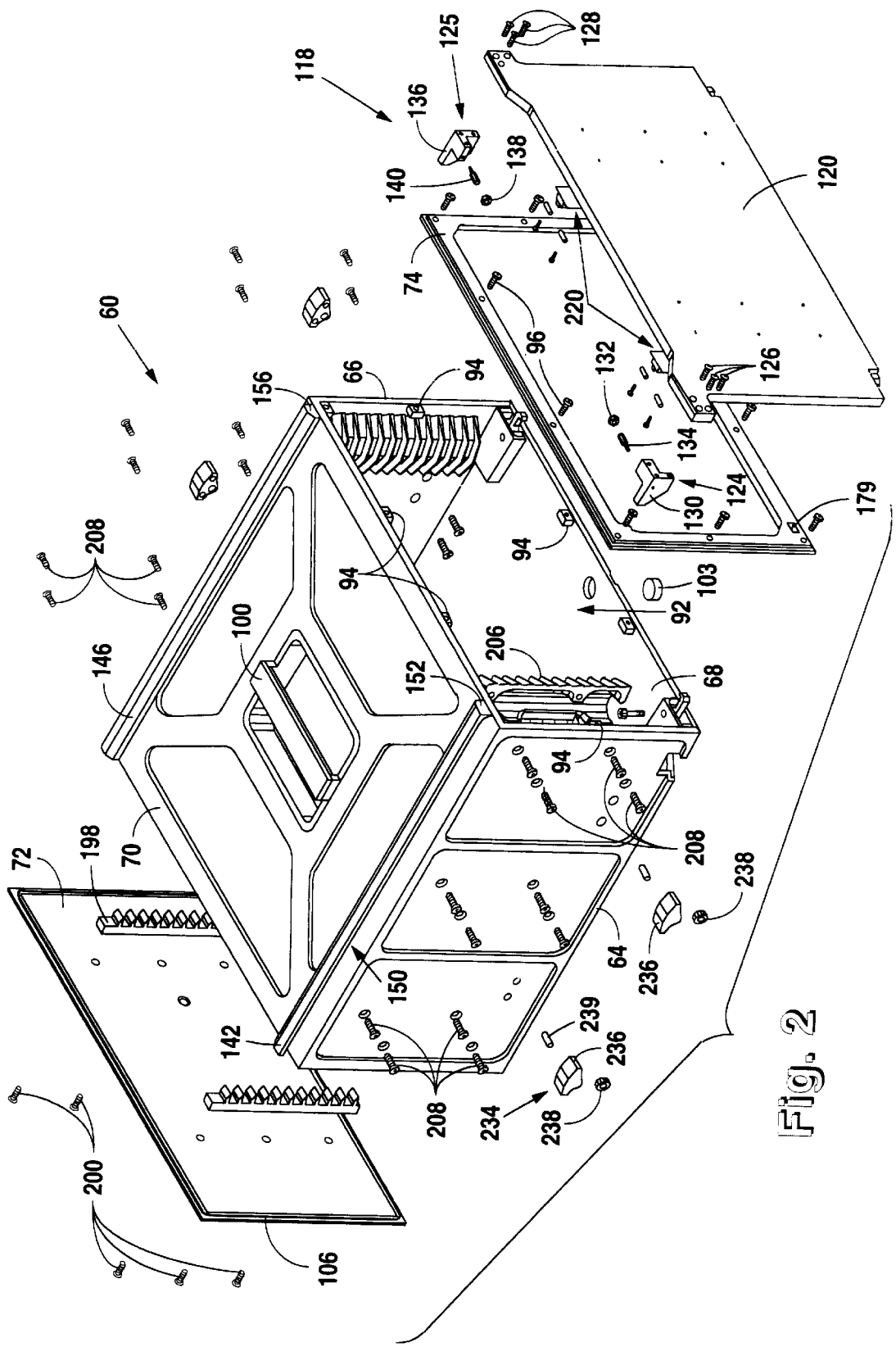
FIG. 2 is an exploded view of the preferred embodiment of the substrate housing of the present invention.
Figures 9, 10:
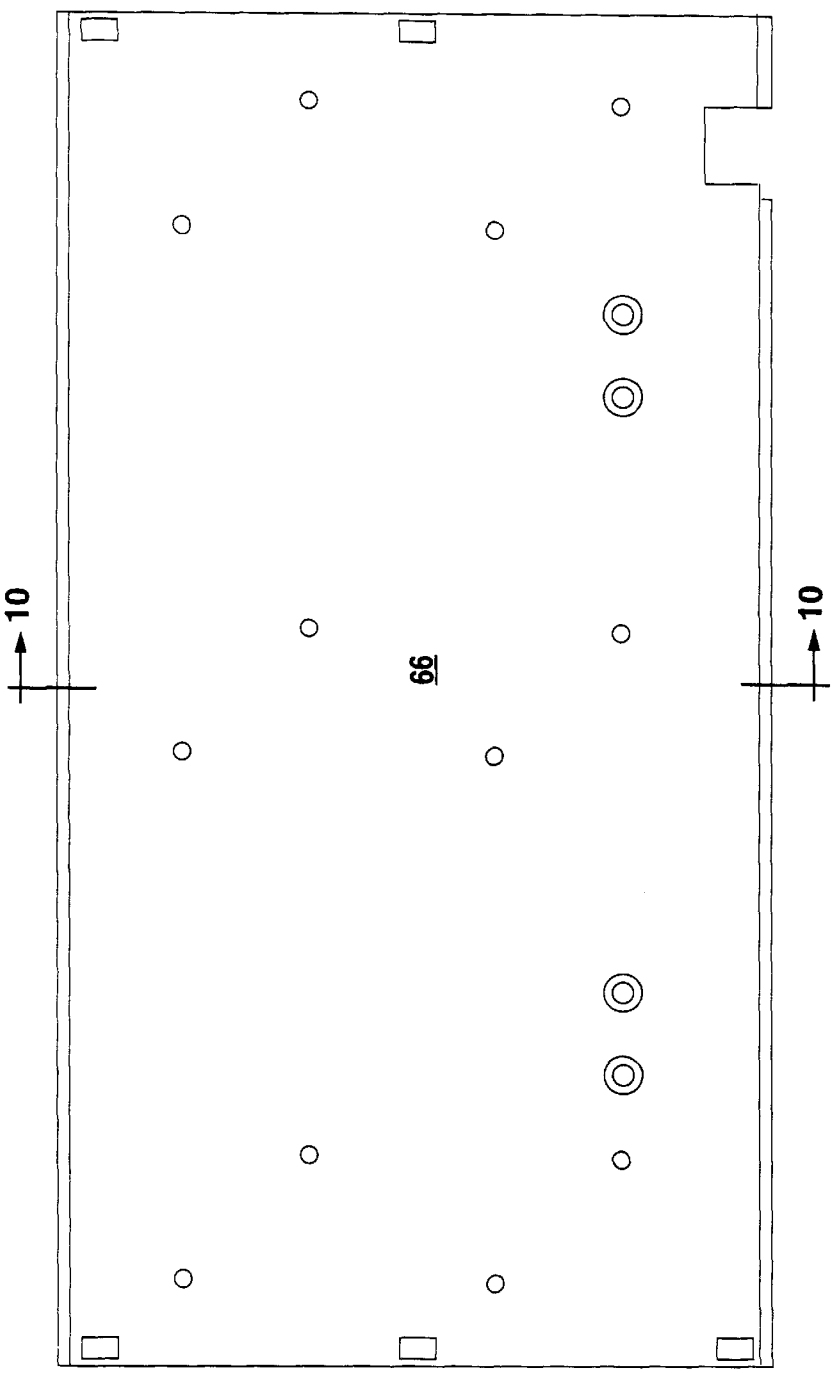
FIG. 9 is a elevational view of the inside of the right panel in the preferred embodiment of the substrate housing of the present invention.
FIG. 10 is a cross-sectional view taken along section lines 10—10 of FIG. 9.
Figure 19:
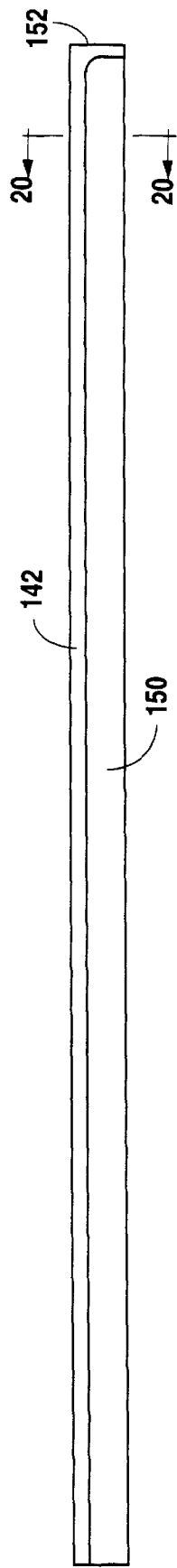
FIG. 19 is a side view of a left side door track in the preferred embodiment of the substrate housing of the present invention.
Figure 20:
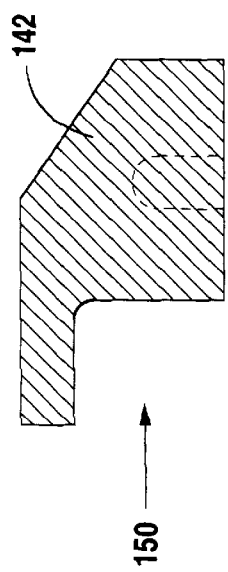
FIG. 20 is a cross-sectional view taken along section lines 20—20 of FIG. 19.

Referring to FIGS. 1 and 2, a substrate housing according to the present invention is identified by the number 60. Substrate housing 60 preferably comprises a box-like structure which includes a left side panel 64, a right side panel 66, a bottom panel 68, a top panel 70, a rear panel 72, and a front panel 74. As illustrated in FIGS. 3–8, left panel 64 has a lower lip 76 for mating with a groove 78 in bottom panel 68 and an upper lip 80 for mating with a groove 82 in top panel 70. As illustrated in FIGS. 5–10, right panel 66 has a lower lip 84 for mating with a groove 86 in bottom panel 68 and an upper lip 88 for mating with a groove 90 in top panel 70. Left panel 64 is chemically bonded to bottom panel 68 and top panel 70 and right panel 66 is chemically bonded to bottom panel 68 and top panel 70. Further, panels 64, 66, 68, 70, 72 and 74 are polycarbonate and define an interior space or cavity 92 within the substrate housing 60.

Referring again to FIG. 2, a plurality of mounting blocks 94 are mounted to the inside surfaces of panels 64, 66, 68, and 70. Front panel 74 is secured to panels 64, 66, 68 and 70 by a plurality of screws 96 which extend through panel 74 into respective passages within mounting blocks 94. Rear panel 72 is mounted to panels 64, 66, 68, and 70 in a similar manner. Referring to FIGS. 2, 7, 11 and 12, a handle 98 having a grip 100 is received within a passage 102 in top panel 70 and chemically bonded thereto. A touch memory 103 is mounted within bottom panel 68 and is used for storing information about the substrate housing 60 and its contents, as will be described more fully below.

Referring to FIGS. 2, 13, 14 and 14A, rear panel 72 has a groove 104 around the perimeter thereof for receiving an O-ring gasket 106. Further, a handle 108 may be secured to the outer surface of panel 72 by screws which extend through panel 72 and into handle 108. Referring to FIGS. 15, 16 and 16A, front panel 74 has a groove 112 around the perimeter thereof for receiving an 0-ring gasket 114. Front panel 74 also has an access port or passage 116 therein. Panel 74 has a sharp edge seal 117 around the perimeter of passage 116.

Referring to FIGS. 2, 17, 17A, 17B, 18–20 and 21A–21C, substrate housing 60 comprises a pivotal door assembly 118 comprising a door 120 having a groove 121 around the perimeter thereof which receives a sponge seal 122. Ramps 123 are formed on either side of the approximate center of the door 120 in groove 121 leading to a plateau center portion 123b. When door 120 is in its CLOSED position, edge 117 engages sponge seal 122 to form an airtight seal and thereby prevent particles from entering substrate housing 60, as illustrated in FIG. 18. Ramps 123 compensate for the flex of door 120 so that a substantially uniform force is applied between edge 117 and sponge 122 around the perimeter of door 120.

Door assembly 118 further comprises a pair of door actuator assemblies 124 and 125 which are secured to door 120 by screws 126 and 128, respectively. Door actuator assembly 124 comprises a bracket or actuator 130 having a bearing 132 mounted thereto by a bearing shaft 134. Bearing 132 is mounted on shaft 134 and shaft 134 is secured to actuator 130. Further, actuator 130 is secured to door 120 by screws 126 which extend through door 120 into actuator 130. Door actuator assembly 125 comprises a bracket or actuator 136 having a bearing 138 mounted thereto by a bearing shaft 140. Bearing 138 is mounted on shaft 140 and shaft 140 is secured to actuator 136. Actuator 136 is secured to door 120 by screws 128 which extend through door 120 into actuator 136.

Referring to FIGS. 2, 19, 20 and 21A–21C, a left or first track 142 is secured to top panel 70 by a plurality of screws. A right or second track 146 is also secured to top panel 70 by a plurality of screws. Track 142 defines a channel or passage 150 therein for receiving bearing 132 and has a forward abutment 152. Track 146 defines a channel or passage 154 therein for receiving bearing 138 and has a forward abutment 156.

Referring to FIGS. 21A, 21B, and 21C, the pivotal movement of door 120 will be described in greater detail. FIG. 21A illustrates door 120 in the CLOSED position with bearing 138 within passage 154 at the forward end of track 146. Bearing 132 (not shown in FIG. 21A) is likewise within passage 150 at the forward end of track 142. FIG. 21B illustrates door 120 pivoted to the OPENED position such that door 120, the actuator 130 and the actuator 136 pivot. FIG. 21C illustrates the movement of door 120 relative to box 62 by the passage of bearing 138 toward the rearward end of passage 154. Bearing 132 likewise passes toward the rearward end of channel 150. That is, door 120 may be moved rearward to the RETRACTED position as the substrate housing 60 is moved forward, as illustrated by the lower arrow in FIG. 21C, such that bearings 132, 138 are positioned at the rearward end of tracks 142, 146, respectively, and the relative positions of door 120 and box 62 have changed.

Figure 22:
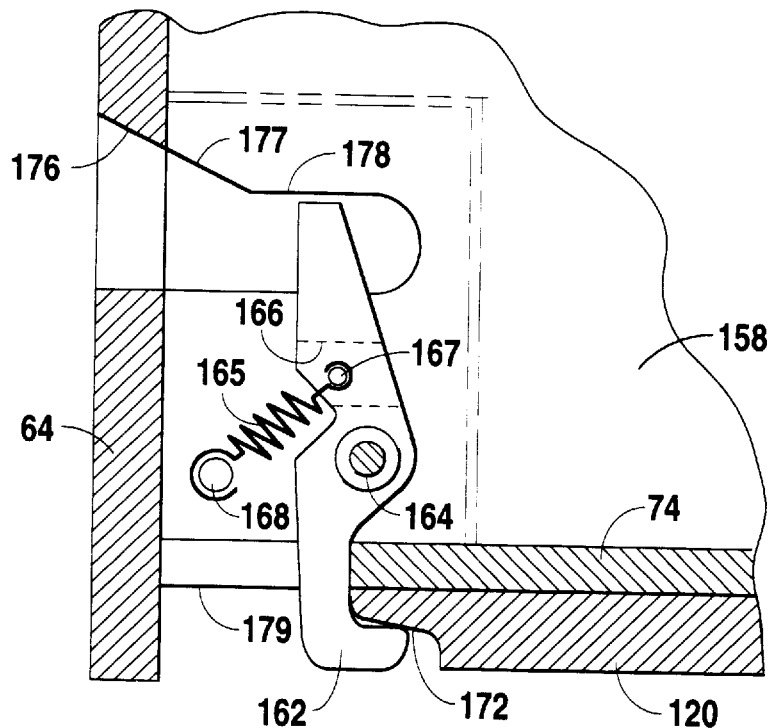
FIG. 22 is a plan view of a left side latch assembly in the preferred embodiment of the substrate housing of the present invention.
Figure 23:
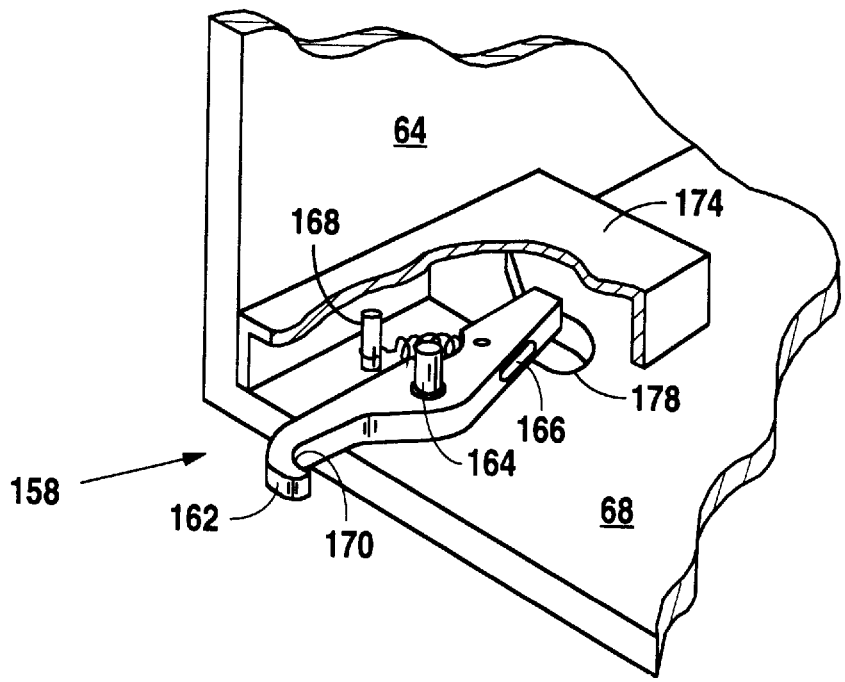
FIG. 23 is a perspective view of a left side latch assembly in the preferred embodiment of the substrate housing of the present invention.

Referring to FIGS. 2 and 22–25, door 120 may be maintained in a locked configuration by a pair of latch assemblies 158 and 160. As illustrated in FIGS. 22 and 23, latch assembly 158 comprises a latch 162 which is pivotally mounted to the inside of bottom panel 68 by a pivot pin 164. One end of a resilient spring 165 extends through a slot 166 in latch 162 and is positioned about a screw 167 which extends through latch 162 and slot 166. The opposite end of spring 165 is positioned about a post 168 which extends upward through bottom panel 68. Latch 162 has a forward groove 170 for mating engagement with a beveled lip 172 in door 120. Latch assembly 158 is substantially covered by a latch cover 174. However, access to latch assembly 158 to depress the rearward end of latch 162 is permitted through passage 176 in left panel 64 and adjacent passage 178 in bottom panel 68. The forward end of latch 162 extends through passage 179 in front panel 74. The passages 176, 178 allow insertion of an actuator pin 346 with a bearing 348 mounted thereto (FIG. 40) for engaging and manipulating the latch 162. Also, the passages 176, 178 include a slanted edge 177 for engaging the bearing 348 during movement of the pin 346 for aligning the substrate housing 60, described more fully below.

Figure 24:
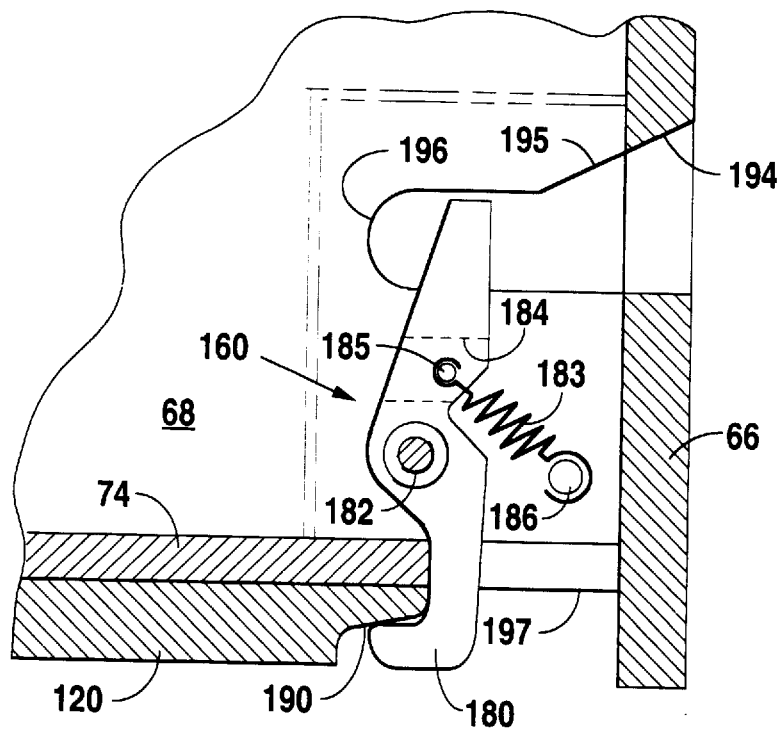
FIG. 24 is a plan view of a right side latch assembly in the preferred embodiment of the substrate housing of the present invention.
Figure 25:
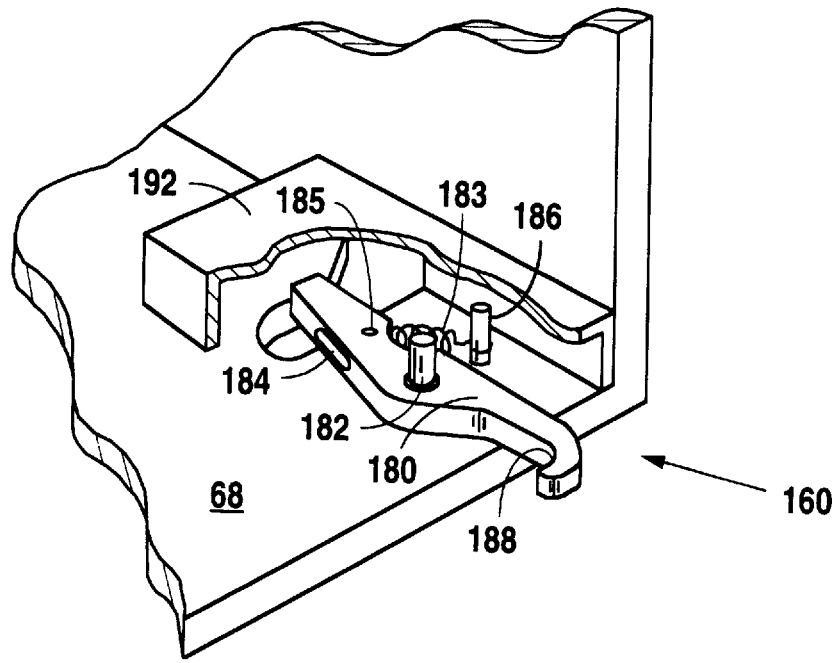
FIG. 25 is a perspective view of a right side latch assembly in the preferred embodiment of the substrate housing of the present invention.

As illustrated in FIGS. 24 and 25, latch assembly 160 comprises a latch 180 which is pivotally mounted to the inside of bottom panel 68 by a pivot pin 182. One end of a resilient spring 183 extends through a slot 184 in latch 180 and is positioned about a screw 185 which extends through latch 180 and slot 184. The opposite end of spring 183 is positioned about a post 186 which extends upward through bottom panel 68. Latch 180 has a forward groove 188 for mating engagement with beveled lip 190 in door 120. Latch assembly 160 is substantially covered by a latch cover 192. However, access to latch assembly 160 to depress the rearward end of latch 160 is permitted through passage 194 in right panel 66 and adjacent passage 196 in bottom panel 68. The forward end of latch 160 extends through passage 197 in front panel 74. The passages 194, 196 allow insertion of an actuator pin 364 with a bearing 366 mounted thereto (FIG. 40) for engaging and manipulating the latch 180. Also, the passages 194, 196 include a slanted edge 195 for engaging the bearing 366 during movement of the pin 364 for aligning the substrate housing 60 in conjunction with the bearing 348 engaging the edge 177.

Figure 26:
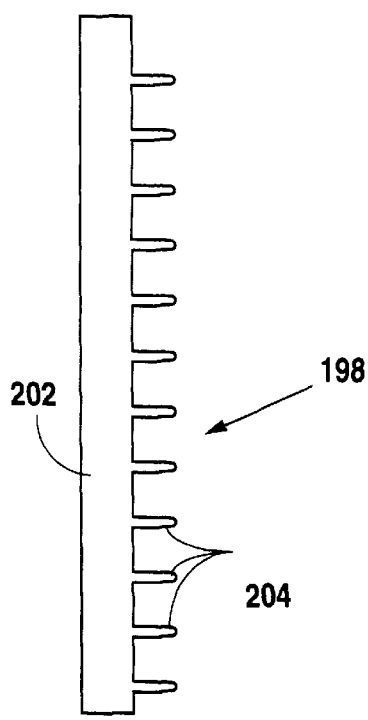
FIG. 26 is a side view of a rear comb in the preferred embodiment of the substrate housing of the present invention.
Figure 27:
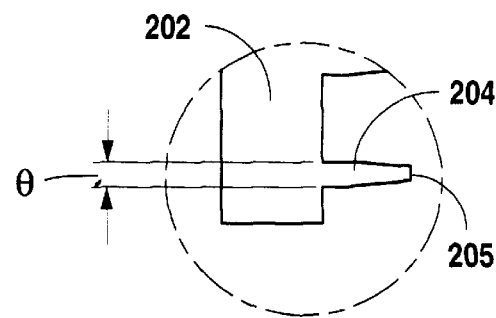
FIG. 27 is a partial side view of a rear comb in the preferred embodiment of the substrate housing of the present invention.
Figure 30:
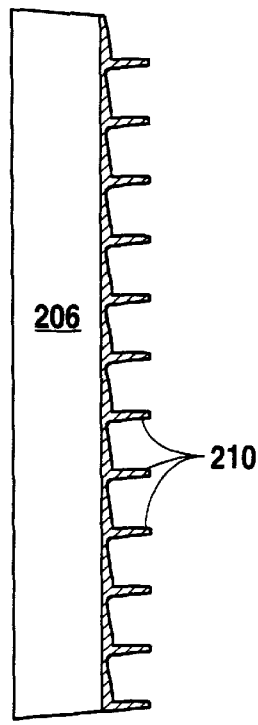
FIG. 30 is a cross-sectional side view of a lateral comb in the preferred embodiment of the substrate housing of the present invention.
Figure 31:
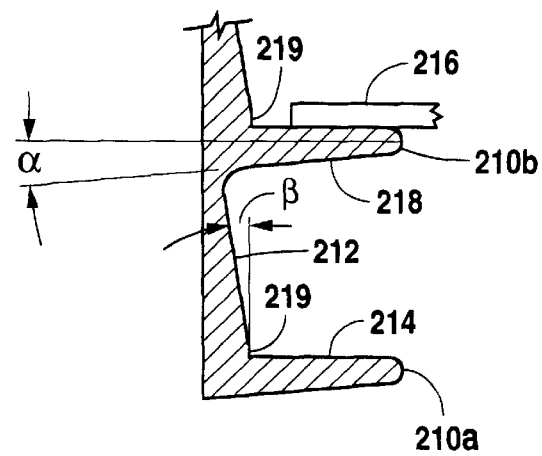
FIG. 31 is an enlarged cross-sectional view of a portion of a lateral comb in the preferred embodiment of the substrate housing of the present invention.
Figure 32:
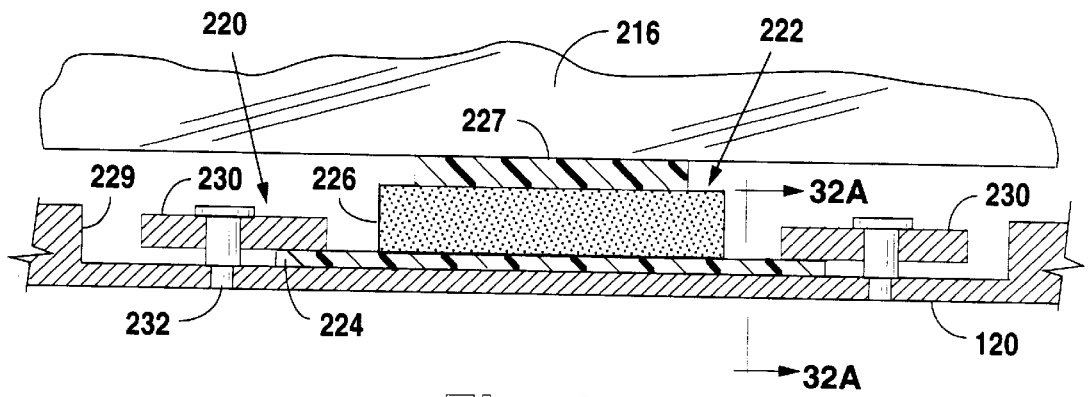
FIG. 32 is a cross-sectional view illustrating a substrate lock assembly in the preferred embodiment of the substrate housing of the present invention.
Figure 32A:
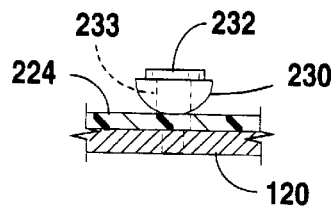
FIG. 32A is a cross-sectional view along section lines 32A—32A of FIG. 32 illustrating a substrate locking clip assembly.
Figure 28:
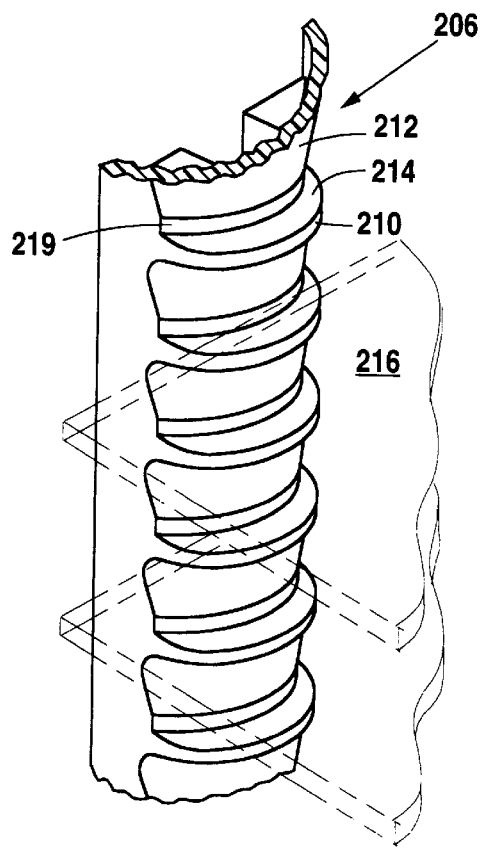
FIG. 28 is a partial perspective view of a lateral comb in the preferred embodiment of the substrate housing of the present invention.
Figure 29:
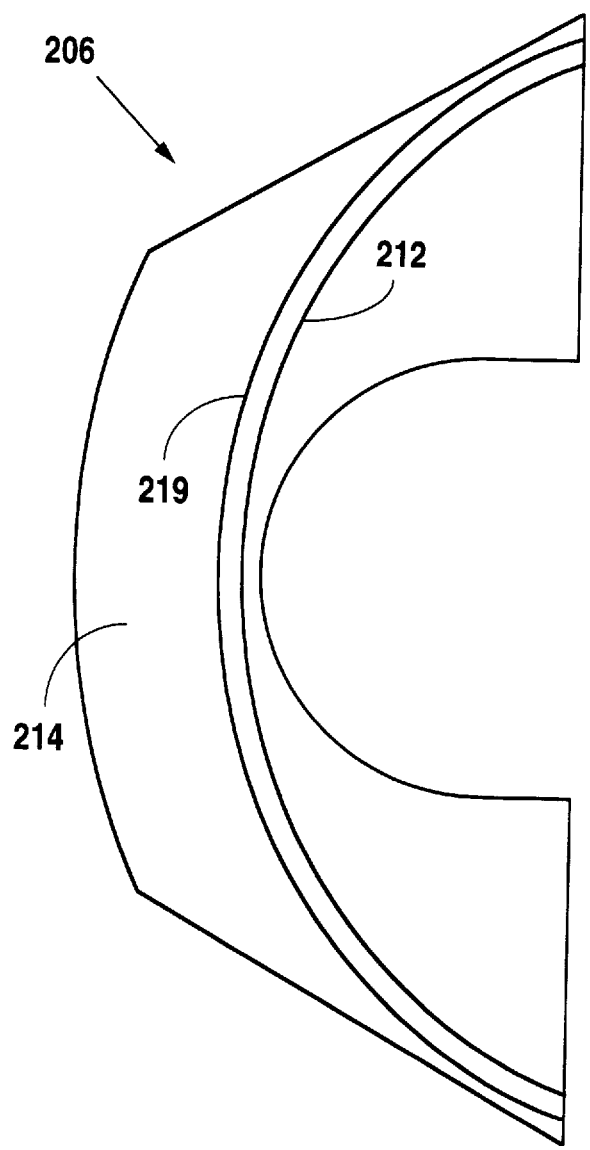
FIG. 29 is a top view of a lateral comb in the preferred embodiment of the substrate housing of the present invention.
Figure 33:
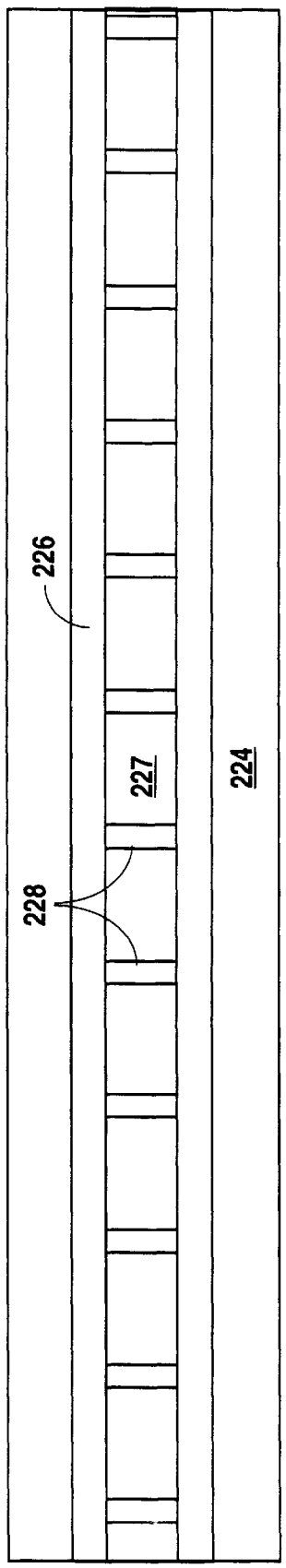
FIG. 33 is a plan view of the substrate lock in the preferred embodiment of the substrate housing of the present invention.
Figure 34:
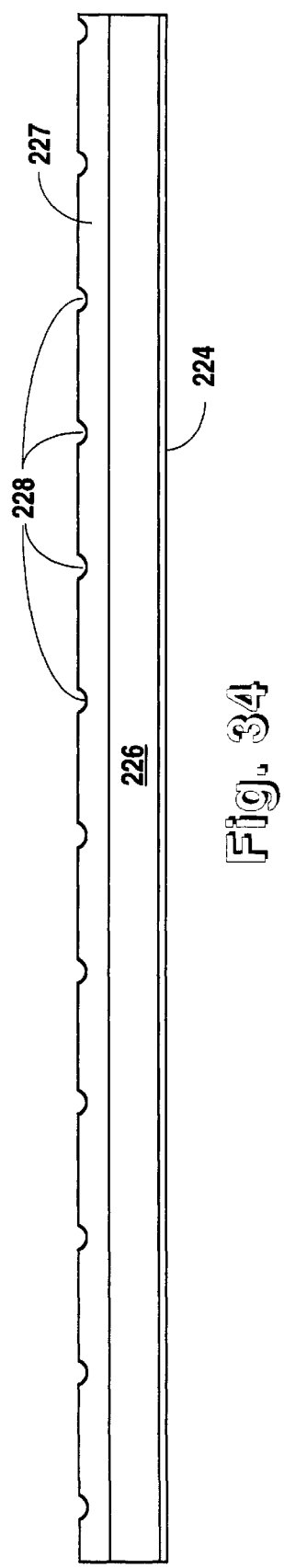
FIG. 34 is a side view of a substrate lock in the preferred embodiment of the substrate housing of the present invention.

Referring to FIGS. 2 and 26–27, substrate housing 60 comprises a pair of rear combs 198 which are each secured to rear panel 72 by a plurality of screws 200. Each comb 198 comprises a tower 202 having a plurality of spaced shelves 204 extending outward therefrom. As illustrated in FIG. 27, the upper and lower surfaces of each shelf 204 taper outwardly from a forward end 205 thereof to tower 202 at an angle θ of approximately 10° C. The two combs 198 are aligned so that when both combs 198 are secured to rear panel 72, each shelf 204 on a comb 198 is aligned with a corresponding shelf 204 on the other comb 198.

Referring to FIGS. 28–31, substrate housing 60 comprises a plurality of lateral combs 206, each of which are secured to left panel 64 or right panel 66 by a plurality of screws 208. Each comb 206 comprises a plurality of spaced shelves 210 and an arcuate, tapered inner wall 212. Each shelf 210 has an uppermost surface 214 for supporting substrates 216 and a lowermost surface 218 which tapers downward from approximately horizontal at an angle α of approximately 5° C. Each comb 206 has an arcuate inner wall 219 approximately perpendicular to surface 214. Wall 212 tapers inward from wall 219 at an angle β of approximately 10° C. from a first shelf 210a and an adjacent upper shelf 210b. Substrate housing 60 preferably has three (3) combs 206 connected to left side 64 and three (3) combs 206 connected to right side 66. Each shelf 210 on a respective comb 206 is aligned with the other shelves 210 on the comb 206. Further, when combs 206 are secured to sides 64, 66, each shelf 210 is aligned with a corresponding pair of shelves 210 on its respective side wall and a corresponding shelf 210 on the opposite side wall.

It is understood that the combs 198, 206 support the substrates 216 within the housing cavity 92. Further, combs 206 provide a horizontal and vertical alignment of the substrates 216. That is, the taper of wall 212 urges the substrates 216 vertically downward to rest atop a respective shelf 210. Likewise, the arcuate surface of wall 212 urges the substrate 216 horizontally to a respective opposed shelf 210 on the opposite sidewall of the substrate housing 60. Referring to FIGS. 2, 17 and 32, 32A, 33 and 34, substrate housing 60 comprises a pair of substrate lock assemblies 220. Each substrate lock assembly 220 comprises a substrate lock 222 having a flange 224 and a resilient material 226 connected thereto. Material 226 is preferably a sponge material or the like. Each lock 222 has an outer surface 227 preferably comprising polyether ether ketone, having a plurality of grooves 228 therein. Each groove 228 is adapted to receive an edge of a substrate 216 therein. Each substrate lock 222 is received within a cavity 229 within door 120. Each substrate lock 222 is secured Within a substrate lock cavity 229 by a pair of substrate lock clips 230 which are each secured to door 120 by a lock clip pin 232 which extends into a respective passage 233 in door 120. Pin 230 has an arcuate surface which may be pivoted to engage flange 224 or pivoted to disengage flange 224, thereby permitting insertion or removable securement of lock assembly 229 to door 120.

Referring to FIGS. 1 and 2, a plurality of wheel assemblies 234 are secured to box 62. Each assembly 234 comprises a fender or cover 236 and a roller 238 mounted within cover 236 by a pin 239. Wheel assemblies 234 facilitate the mounting of the substrate housing 60 atop a docking unit 240 (FIG. 35) as hereinafter described.

Referring to FIGS. 35–38, the preferred embodiment of the substrate housing docking unit of the present invention is identified by the number 240. The docking unit 240 comprises a base plate 242, a cover plate 244, a left post 246 and a right post 248. A front plate or bulkhead 250 is secured to base plate 242 and cover plate 244 and has a port or opening 252 therein. Posts 246, 248 are also secured to base plate 242 and cover 244. A left side plate 254 is received between bulkhead 250 and post 246 in respective grooves in post 246 and bulkhead 250. A right side plate 256 is received between bulkhead 250 and right post 248 in respective grooves in post 248 and bulkhead 250. A plurality of feet 258 are secured to the underside of base plate 242.

Referring again to FIGS. 36–38, the docking unit 240 comprises a substrate housing positioning assembly which includes a tray 262 comprising a bottom plate 264, a left side plate 266, and a right side plate 268. Touch memory contacts 269 are mounted in bottom plate 264. Tray 262 has a left slot 270 therein defined by left side plate 266 and bottom plate 264. Tray 262 has a right slot 272 therein defined by right side plate 268 and bottom plate 264. A plurality of roller bearings 274 are provided in corresponding grooves and secured to each corner of tray 262 ends of the side plates 266, 268. Roller bearings 274 permit tray 262 to rest upon and roll along a left rail 276 and right rail 278 which are secured to base plate 242. In particular, several of the roller bearings 274 are mounted in a vertical position for allowing rollable engagement with the rails 276, 278, while the remaining roller bearings 274 are horizontally mounted for guiding the tray 262 during horizontal movement. Furthermore, two of the horizontally mounted roller bearings on either the right or left side of the tray 262 are spring-loaded to reduce gap and wobble and to maintain alignment. A pair of bumper assemblies 316 are mounted to side plate 266 and side plate 268, respectively, for engaging the substrate housing 60.

Figure 38:
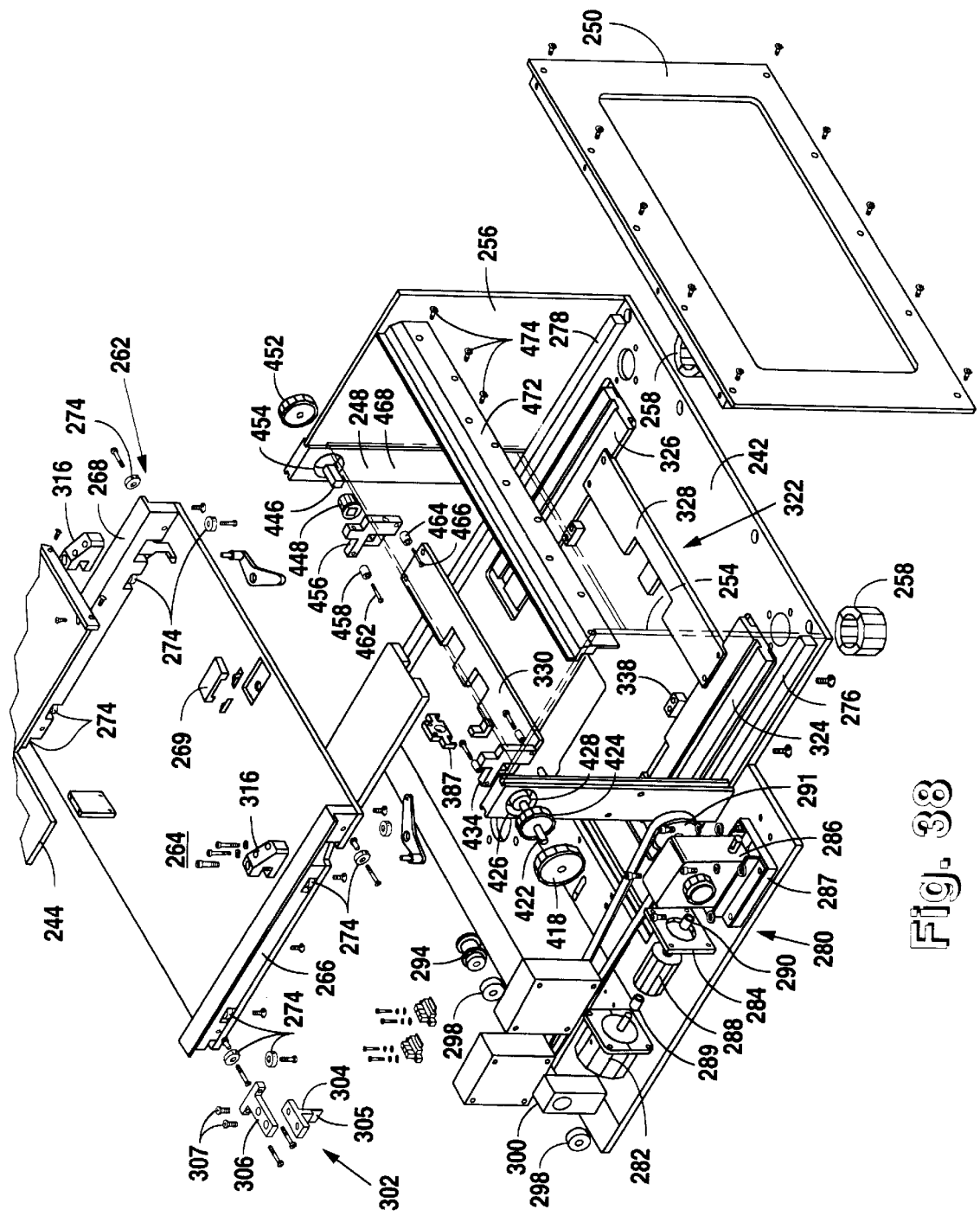
FIG. 38 is a partial exploded view of the preferred embodiment of the docking unit of the present invention.
Figure 39:
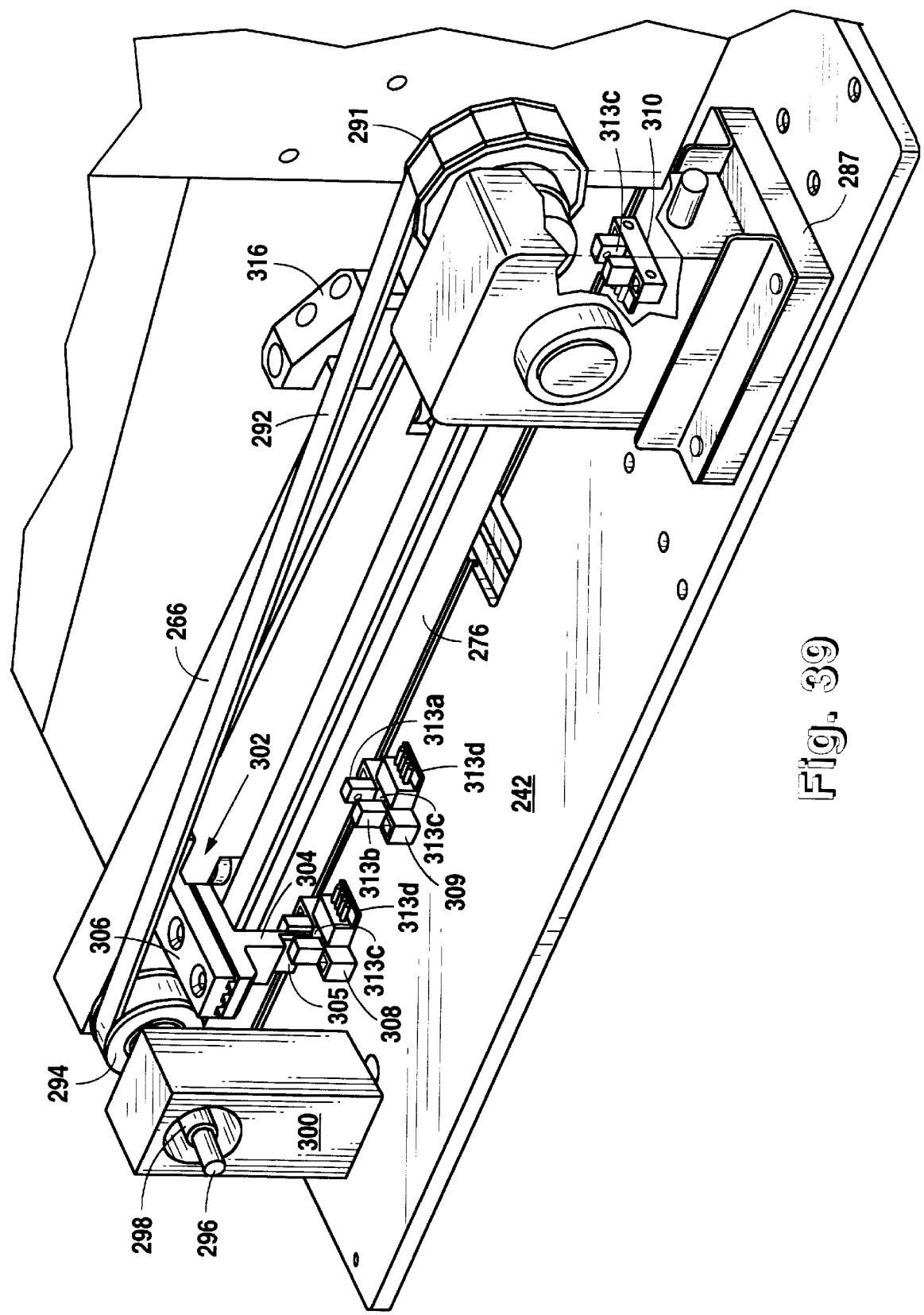
FIG. 39 is a perspective view of the tray drive assembly in the preferred embodiment of the docking unit of the present invention.

Referring to FIGS. 38 and 39, tray 262 is operatively engaged with a tray drive assembly 280. Tray drive assembly 280 includes a tray stepper motor 282 secured to a motor mounting plate 284 which is secured to base plate 242. Tray motor 282 is operatively engaged with a gearbox 286 by a coupling 288. Tray drive assembly 280 is further provided with a pair of bore reducers 289, 290 coupled to tray motor 282 and gearbox 286, respectively. Gearbox 286 is mounted to a spacer block 287 which is mounted to base plate 242, and the gearbox 286 is operatively engaged with a drive pulley 291. A drive belt 292 is positioned about drive pulley 291 and an idler pulley 294. Pulley 294 is mounted on a pulley shaft 296 which is received within a bearing 298. Bearing 298 is mounted in an idler pulley bearing block 300 which is mounted to base plate 242.

A tray drive bracket assembly 302 is connected to belt 292 and tray 262. Bracket assembly 302 comprises a lower bracket 304 having a tray position sensor flag 305 connected thereto and an upper T-bracket 306. Belt 292 is secured between brackets 304, 306, which are connected to each other by a pair of screws 307. The T-shaped end of upper bracket 306 is connected to the underside of tray side plate 266. Movement of the tray 262 is detected by sensors 308, 309, and 310 mounted on base plate 242 in conjunction with the tray position sensor flag 305. As shown in FIG. 39, each of the sensors 308–310 include side members 313a, 313b forming a channel 313c aligned with the tray position sensor flag 305. A light emitting diode (LED) (not shown) or other light source projects a beam of light within the channel 313c from one side member 313a, 313b to the other side member. As the drive belt 292 is rotated by the tray motor 282, the tray position flag 305 travels along a linear path and eventually travels between a channel 313c of one of the sensors 308–310. When the tray position flag 305 is within the channel 313c of a sensor, the light beam is interrupted thereby "tripping" the sensor.

Each of the sensors 308–310 include electrical connections 313d for connecting to corresponding wires (not shown) for further connection to electrical control circuitry, described below. In this manner, the relative position of the tray 262, and therefore the position of the substrate housing 60 on the docking unit 240, is determined by when the sensors 308–310 are tripped during activation of the tray motor 282. The sensors 308–310 are more specifically referred to as tray retracted sensor 308, tray middle sensor 309 and tray inserted sensor 310, identifying the relative positions of the tray 262 and thus the substrate housing 60.

Referring to FIGS. 35, 37, 40, 41 and 45, the docking unit 240 further comprises a cam assembly 322. Cam assembly 322 comprises a left latch actuator cam 324, a right latch actuator cam 326 and a pair of latch actuator cam crossbars 328, 330 connected to cam 324 and cam 326. Cam 324 has a slot 332 therein and a plurality of roller bearings 334 connected thereto. Cam 324 is received and movable within a channel 336 within base plate 242 and a cam track 338 connected to base plate 242.

Figure 40:
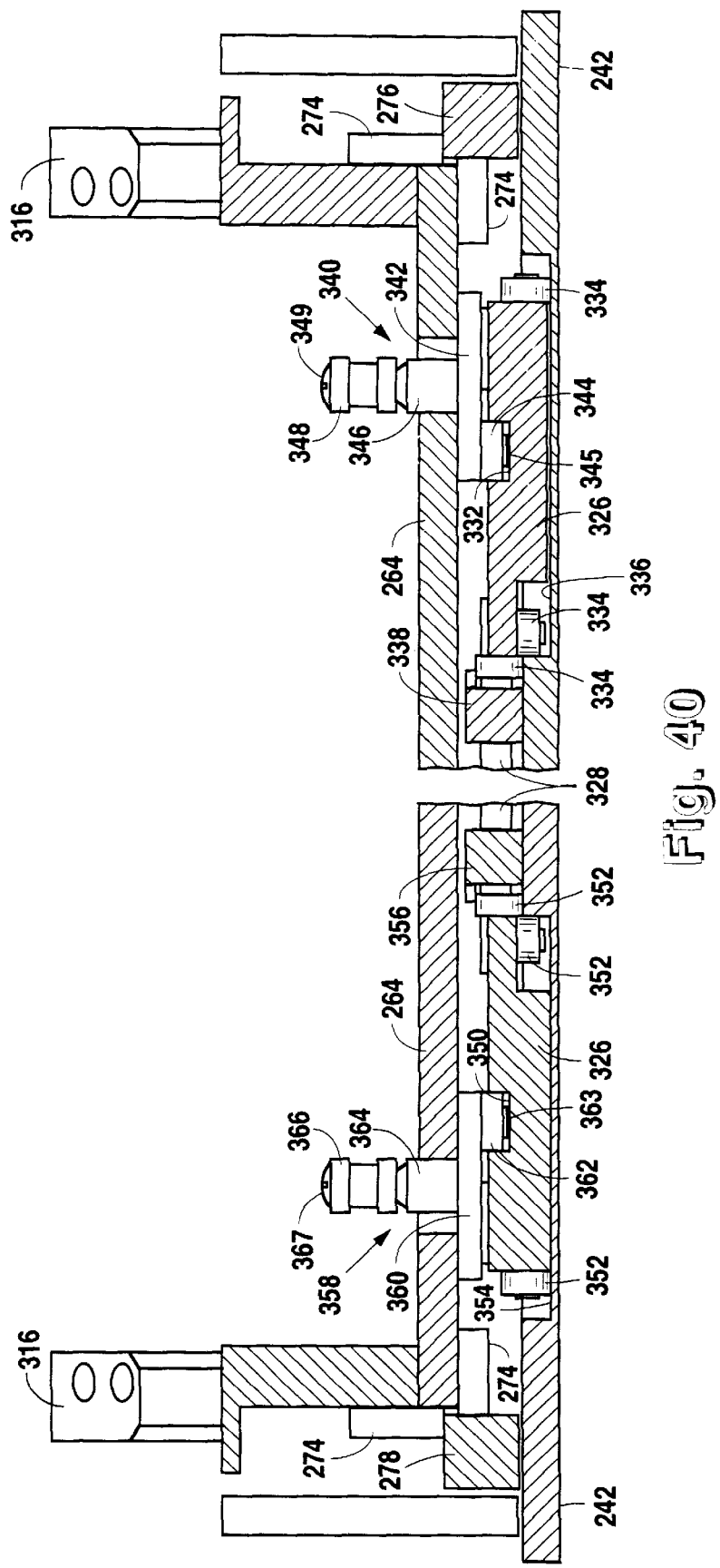
FIG. 40 is a rear cross-sectional view of the cam assembly in the preferred embodiment of the docking unit of the present invention.
Figure 45:
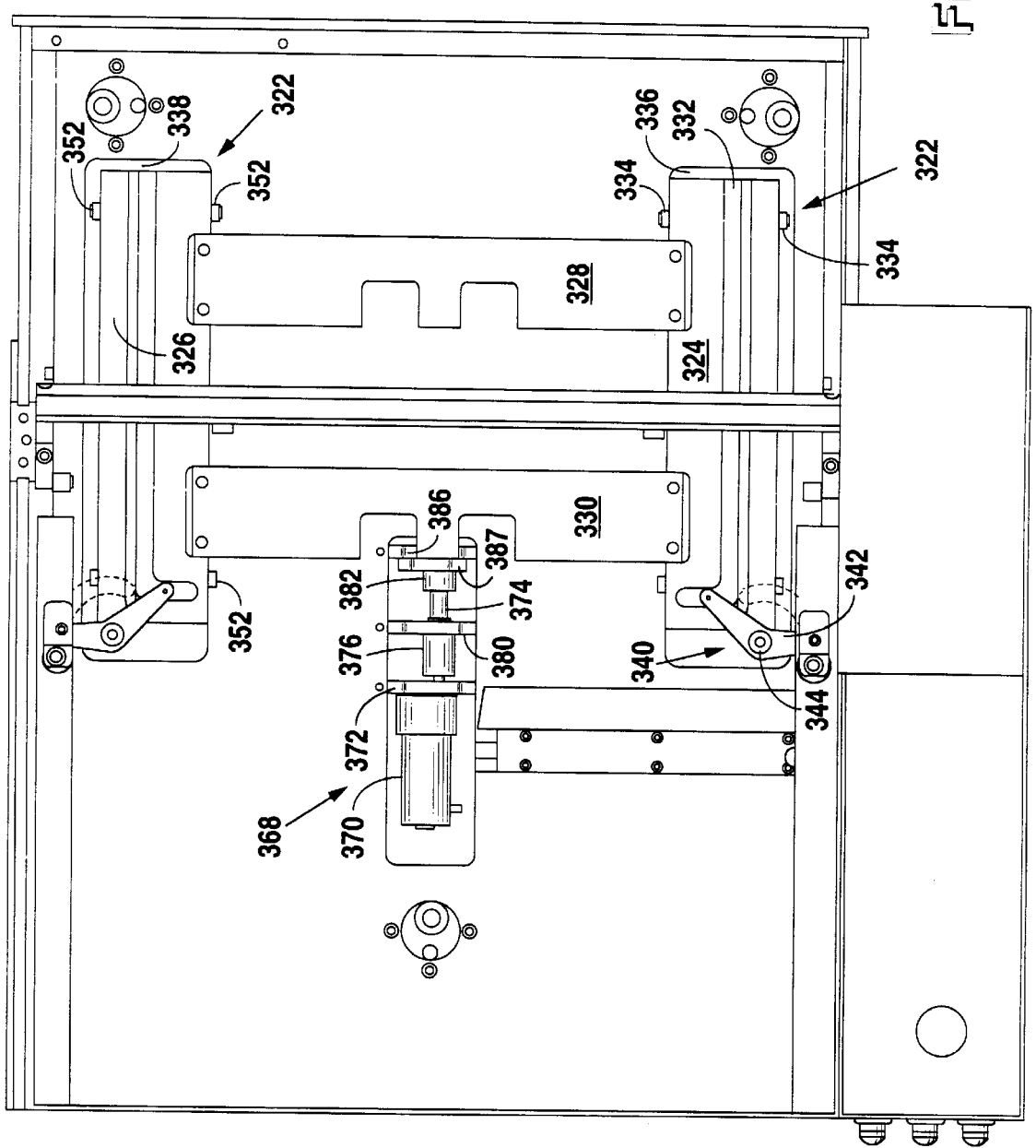
FIG. 45 is a top plan view of the preferred embodiment of the docking unit of the present invention.

As shown in FIGS. 40 and 45, a left cam follower assembly 340 is pivotally connected to the underside of tray 262. Cam follower assembly 340 comprises a cam arm 342 having a bearing 344 connected to the underside thereof by a screw 345 and a latch actuator pin 346 connected to the uppermost surface thereof. Bearing 344 is received within slot 332 and a bearing 348 is connected to pin 346 by a screw 349 which extends through bearing 348 and pin 346 into arm 342.

Cam 326 has a slot 350 therein and a plurality of bearings 352 connected thereto. Cam 326 is received and movable within a channel 354 within base plate 242 and a cam track 356 connected to base plate 242. A right cam follower assembly 358 is pivotally connected to the underside of bottom plate 264. Cam follower assembly 358 comprises a cam arm 360 having a bearing 362 connected to the underside thereof by a screw 363 and a latch actuator pin 364 connected to the uppermost surface thereof. Bearing 362 is received within slot 350 and a bearing 366 is connected to pin 364 by a screw 367 which extends through bearing 366 and pin 364 into arm 360.

Figure 41:
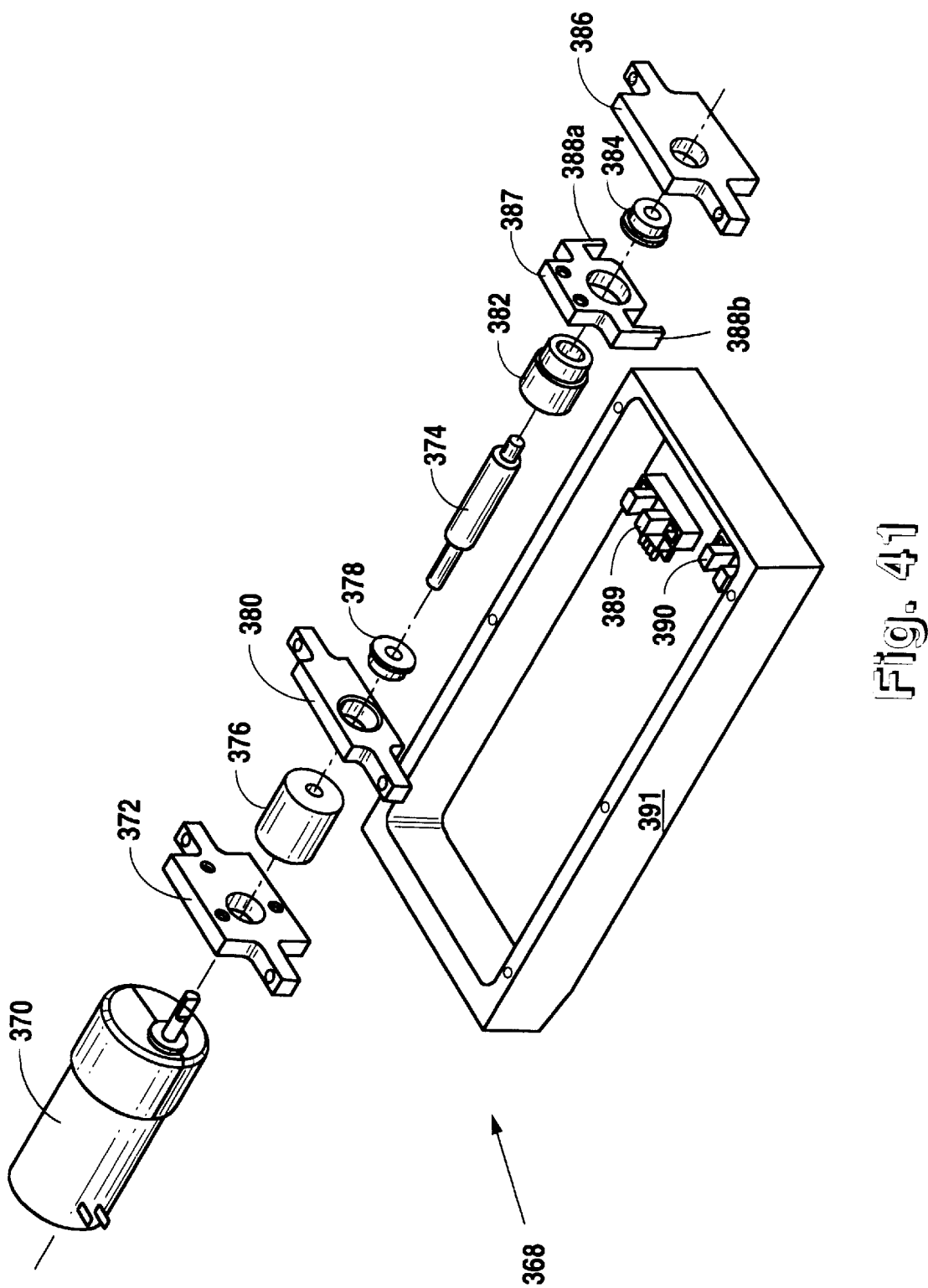
FIG. 41 is an exploded view of the cam drive assembly in the preferred embodiment of the docking unit of the present invention.

Referring to FIGS. 41 and 45, docking unit 240 includes a cam drive assembly 368. Assembly 368 comprises a latch motor 370 supported by a motor bracket 372 connected to plate 242. Latch motor 370 is operatively engaged with a lead screw 374 by a coupling 376. Lead screw 374 is received within a bearing 378 mounted in a bearing block 380 connected to plate 242 and in threaded engagement with a nut 382. The opposite end of lead screw 374 is received within a bearing 384 mounted in a bearing block 386. Nut 382 is secured to a nut mounting tab 387 which is connected to cam crossbar 330. Tab 387 includes latch sensor flags 388a, 388b to engage an unlatch sensor 389 and a latch sensor 390, respectively. In particular, as latch motor 370 is operated to unlatch or latch the door 120, latch sensor flag 388a interfaces to trip the unlatch sensor 389 and the latch sensor flag 388b interfaces to trip latch sensor 390 in a similar manner as was described above for the tray position flag 305 and the sensors 308–310. The sensors 389, 390 are connected to electronic control circuitry, described below, which determines when the door 120 is latched or unlatched by tripping of the sensors 389, 390, respectively. A cover 391 may be provided for assembly 368 and may be connected to plate 242.

Figure 42:
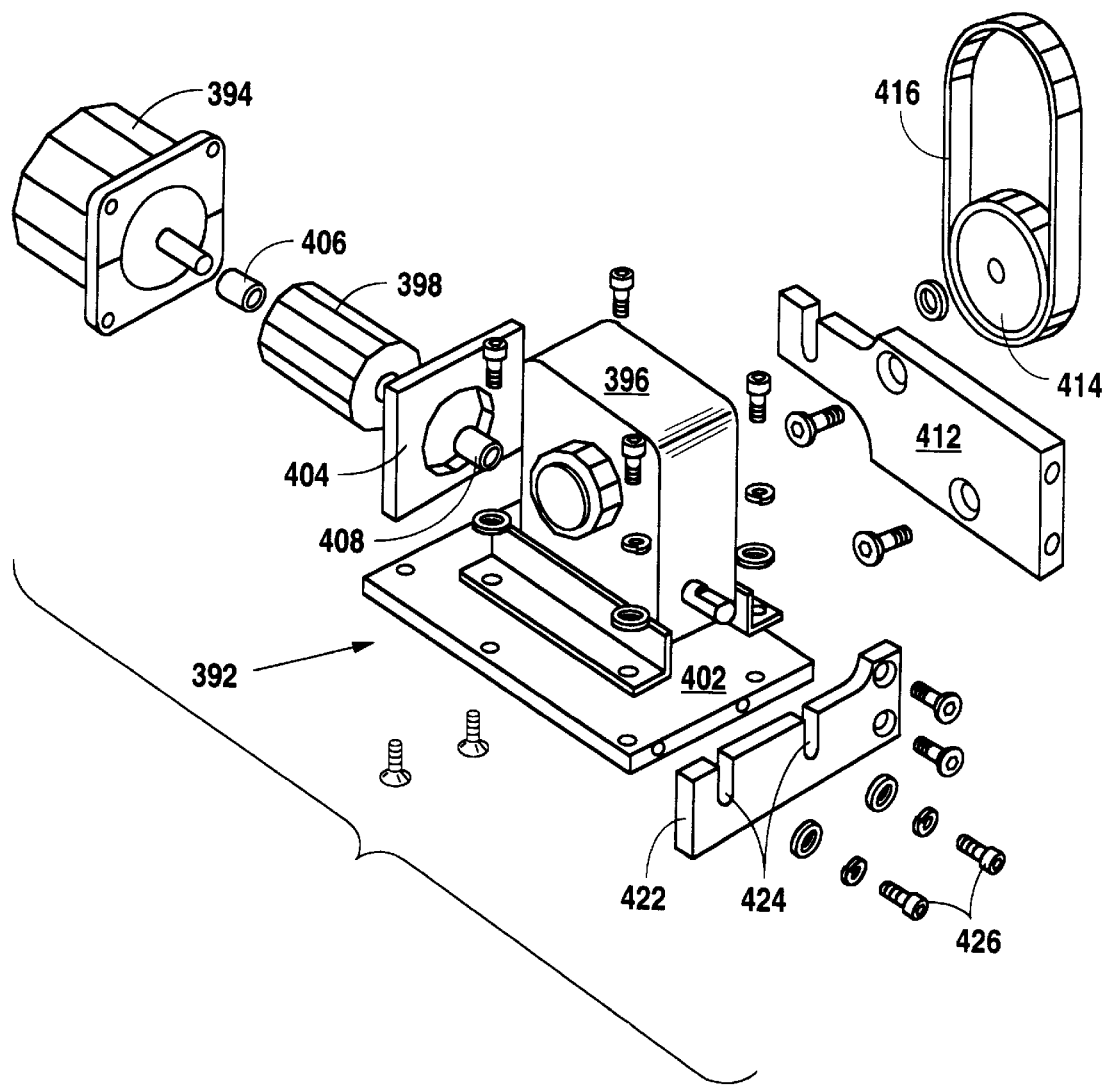
FIG. 42 is an exploded view of the door drive assembly in the preferred embodiment of the docking unit of the present invention.
Figure 43:
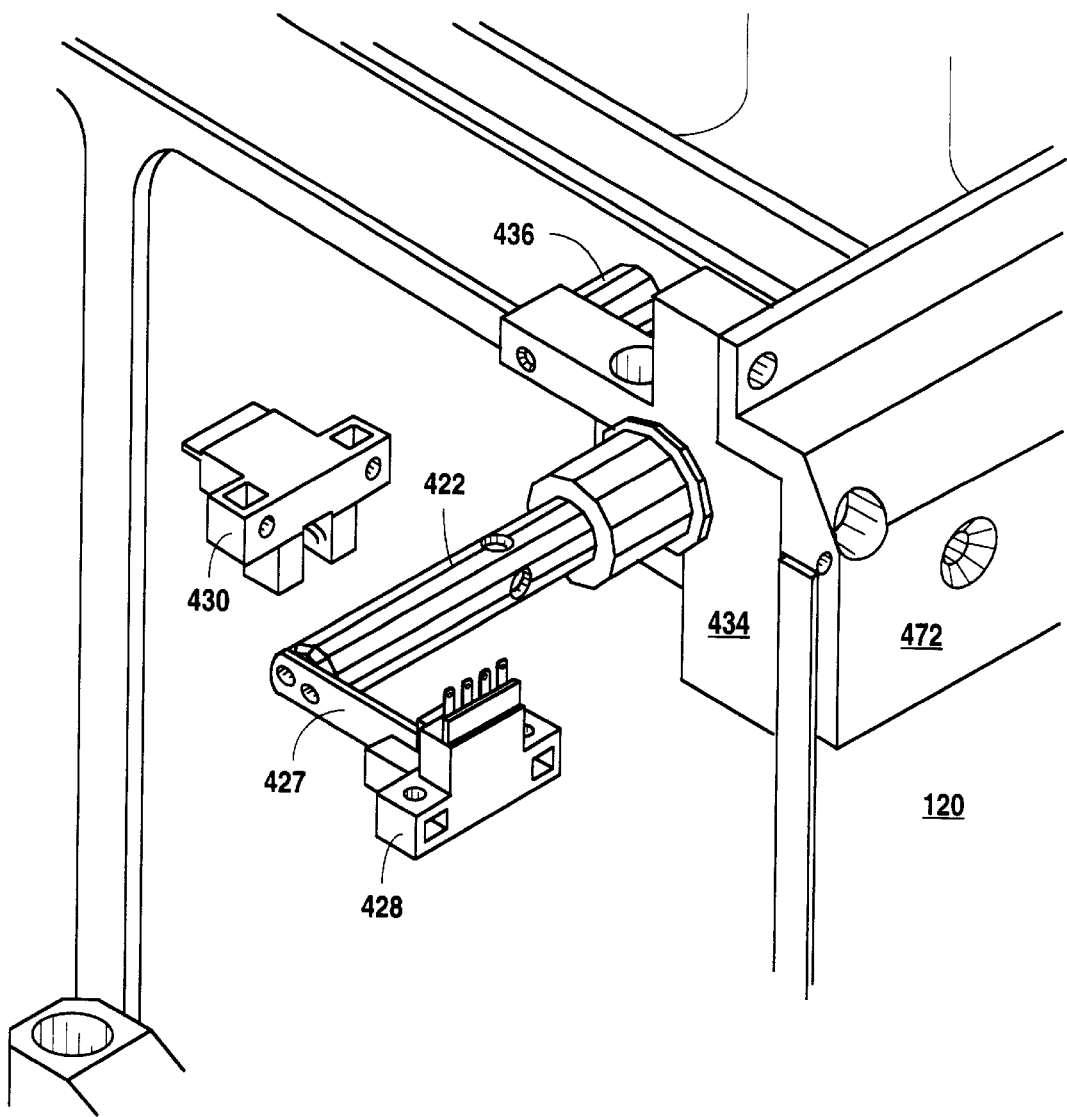
FIG. 43 is a partial perspective view illustrating the docking unit door in the CLOSED position.

Referring to FIGS. 38 and 42, the docking unit 340 further comprises a door drive assembly 392. Door drive assembly 392 comprises a door stepper motor 394 which is operatively engaged with a gearbox 396 by a coupling 398. Gearbox 396 is connected to a mounting plate 402 and door motor 394 is secured to a motor mounting bracket 404 which is secured to mounting plate 402. Door drive assembly 392 is further provided with a pair of bore reducers 406, 408 coupled to door motor 394 and gear box 396, respectively. Door drive assembly 392 is connected to post 246 by a drive assembly mounting plate 412 which is connected to mounting plate 402 and post 246. A drive pulley 414 is operatively engaged with gearbox 396 and a timing belt 416 is positioned about pulley 414 and an idler pulley 418. A pulley adjustment plate 422 is connected to drive assembly mount 402 and has a pair of slots 424 therein for permitting the loosening of screws 426 and adjustment of belt 416.

Figure 44:
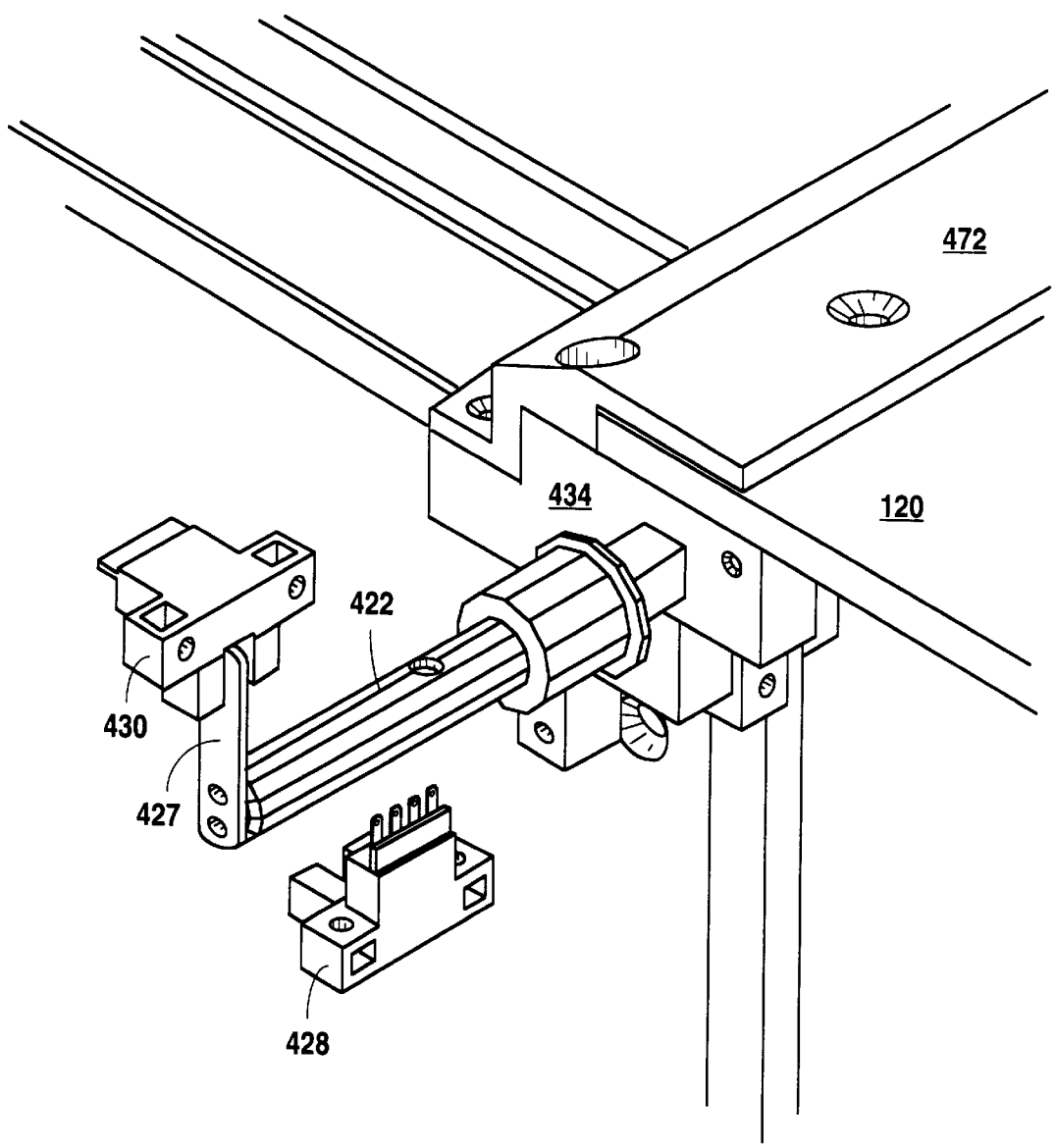
FIG. 44 is a partial perspective view illustrating the docking unit door in the OPENED position.

Referring to FIGS. 36–38 and 42–44, pulley 418 is operatively engaged with a door shaft 422 which extends through a bearing 424 received in a hole 426 in post 246. A door sensor flag 427 is connected to shaft 422 for engaging a door closed sensor 428 when the door 120 is in a CLOSED position (FIG. 43) and a door opened sensor 430 when the door 120 is in the OPENED position (FIG. 44). The sensors 428, 430 include channels for receiving the door sensor flag 427 and are tripped in a similar manner as described previously for the sensors 308–310 and 389,390. In this manner, the control circuitry determines when the door 120 is OPENED or CLOSED.

Shaft 422 extends into and drives a kicker bracket 434. Kicker bracket 434 has an upper kicker roller 436 mounted thereto by a roller shaft 438 and a lower kicker roller 442 mounted thereto by a roller shaft 444. A right kicker pivot shaft 446 is received within a round to square bushing 448 which is mounted in a bearing 452 received within a hole 454 in post 248. Pivot shaft 446 is connected to right kicker bracket 456. Kicker bracket 456 has an upper kicker roller 458 connected thereto by a roller shaft 462 and a lower kicker roller 464 connected thereto by a roller shaft 466.

Figure 35:
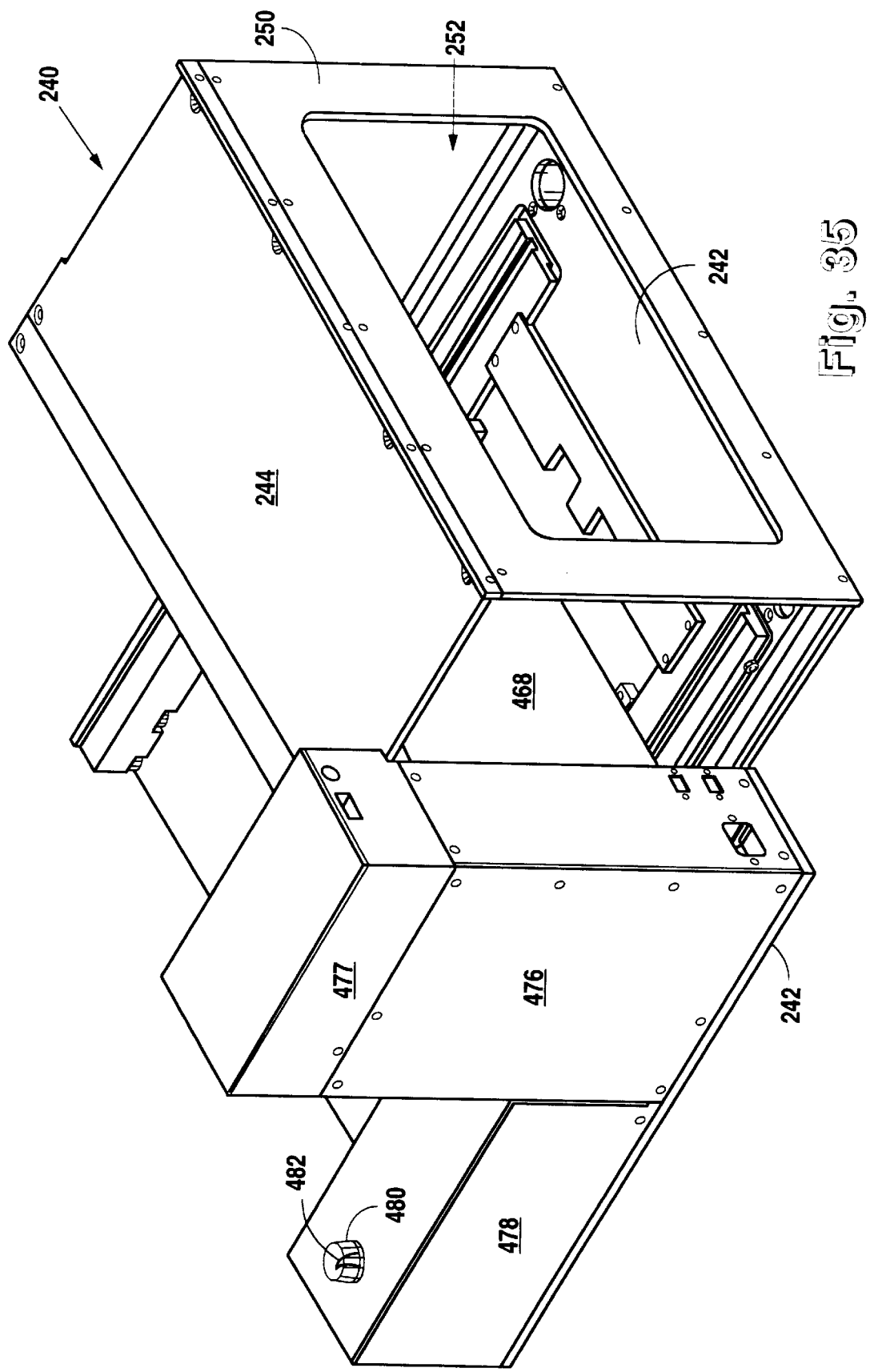
FIG. 35 is a front perspective view of the preferred embodiment of the docking unit of the present invention.
Figure 36:
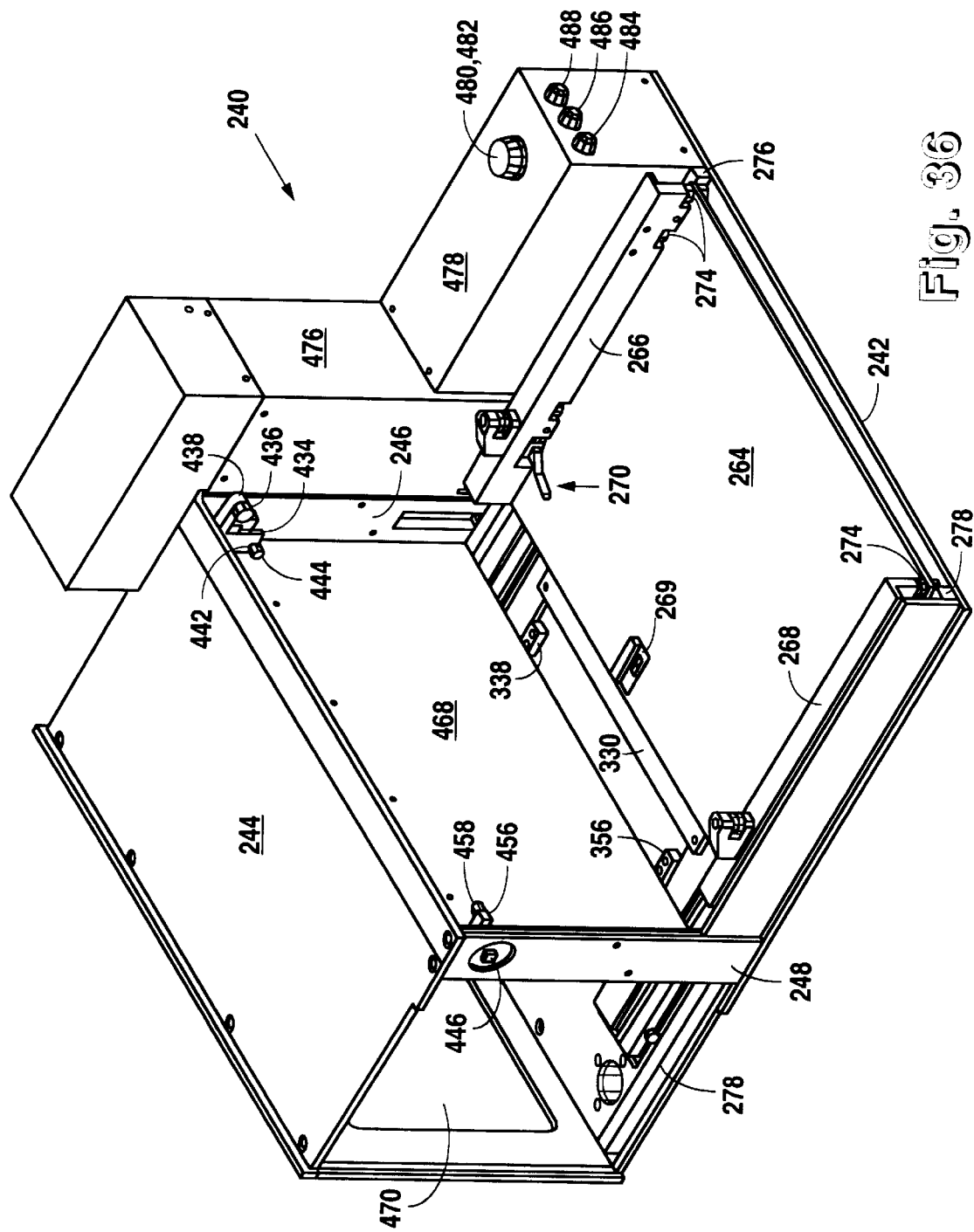
FIG. 36 is a rear perspective view of the preferred embodiment of the docking unit of the present invention.
Figure 37:
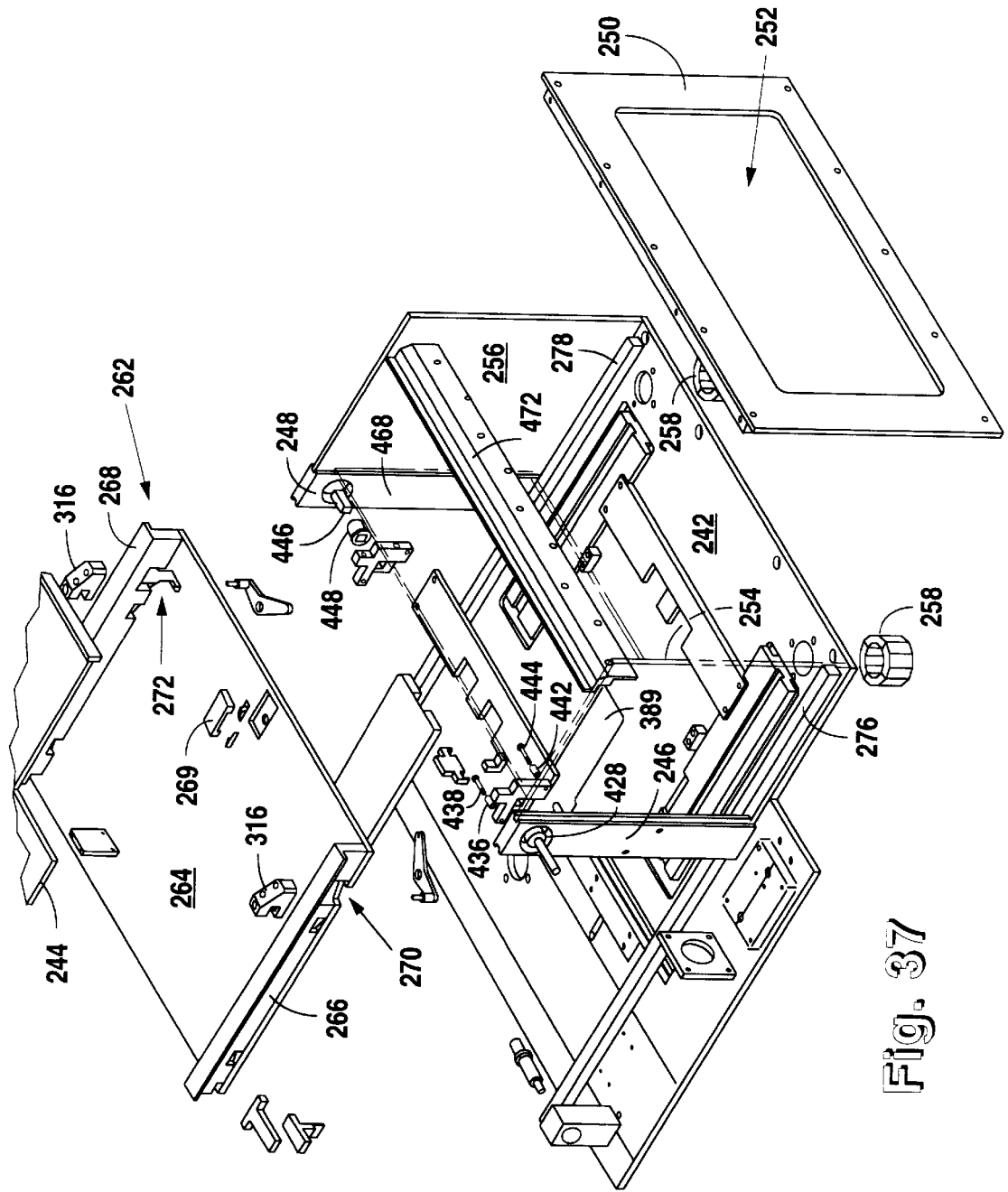
FIG. 37 is a partial exploded view of the preferred embodiment of the docking unit of the present invention.

Referring to FIGS. 35–38, a port door 468 is connected to left kicker 434 and right kicker 456 by a port door mounting bracket 472. Port door 468 is positioned between kickers 434, 456 and mounting bracket 472 and a plurality of screws 474 extend through bracket 472 and door 468 into kickers 434, 456. FIG. 36 is shown without the right side plate 256 for purposes of illustration. A port area 470 is defined by the port door 468, the base plate 242, the cover plate 244, the left side plate 254 and the right side plate 256. The port area 470 is in fluid communication with the mini environment through the port opening 252 of the bulkhead 250. It is noted that the port area 470 need not be tightly sealed since the pressure of the mini environment is typically greater than the surrounding or ambient air. Nonetheless, the port door 468, the base plate 242, the cover plate 244, the left side plate 254 and the right side plate 256 separate the ambient air from the mini environment. An alternative embodiment is envisioned where the port door 468 is not provided, but instead, another door means separates the port area 470, and thus the ambient air in the alternative embodiment, from the mini environment. Such other door means would have to be opened to allow access of the interior space 92 of the substrate housing 60 to the mini environment. The port door 468 is preferred, since, as will be described more fully below, the door 120 of the substrate housing 60 and the port door 468 are opened simultaneously to allow fluid communication and access of the interior space 92, and thus the substrates 216, to the mini environment. This is simpler than having to open two separate doors at different times to maintain integrity of the mini environment.

As shown in FIGS. 35 and 36, the docking unit 240 may be provided with a housing 476 for the door drive assembly 392, a housing 478 for the tray drive assembly 280 and a housing 477 for a power supply (not shown) for electronic control circuitry described below and for the motors 282, 370 and 394. A button 480 having an internal button light 482 is mounted atop housing 478. Further, housing 478 has a plurality of status lights 484, 486, and 488 mounted thereto adapted to exhibit the colors green, yellow, and red, respectively.

Figure 46:
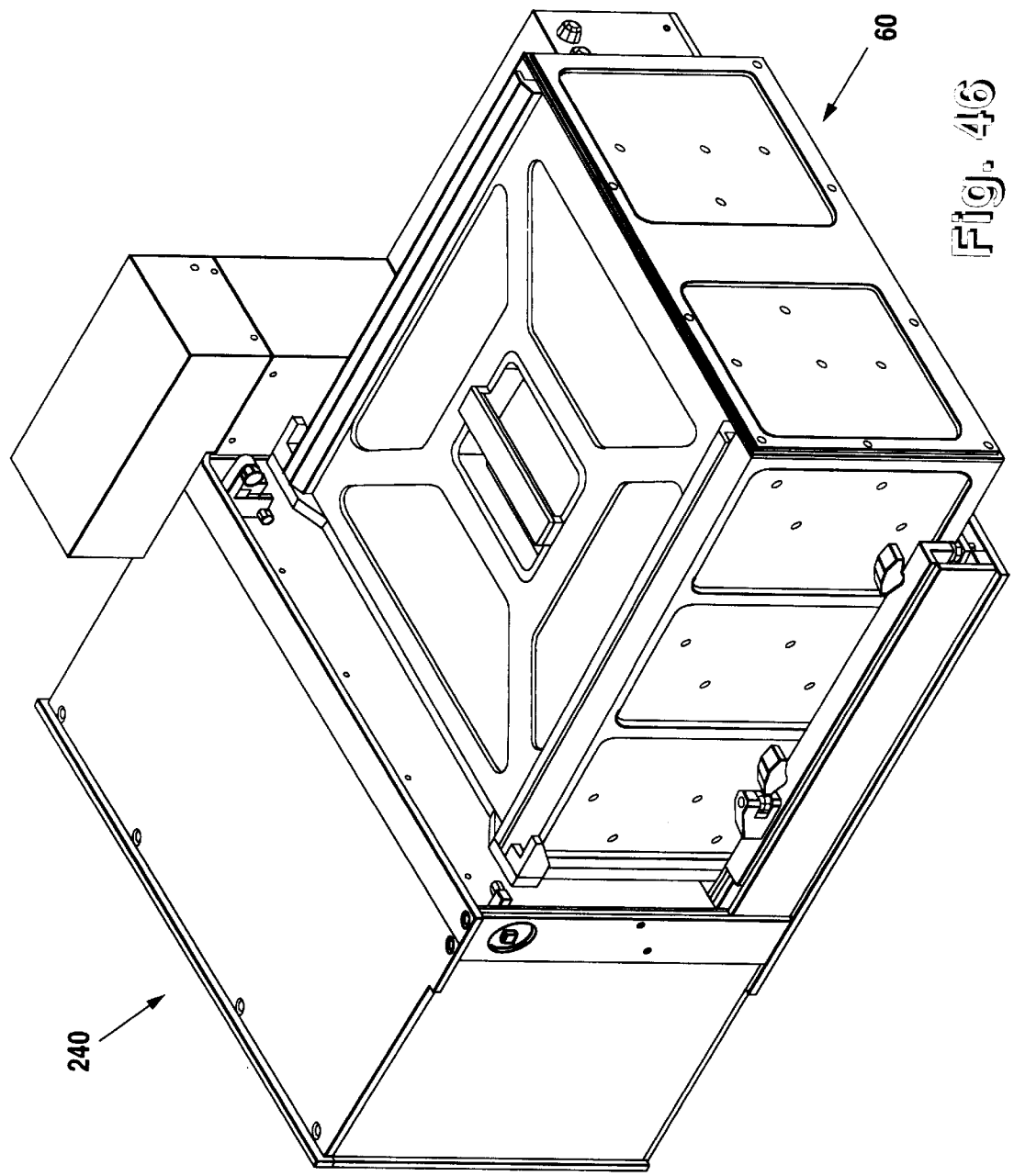
FIG. 46 is a perspective view of the substrate housing mounted with the docking unit in the RETRACTED position.
Figure 47:
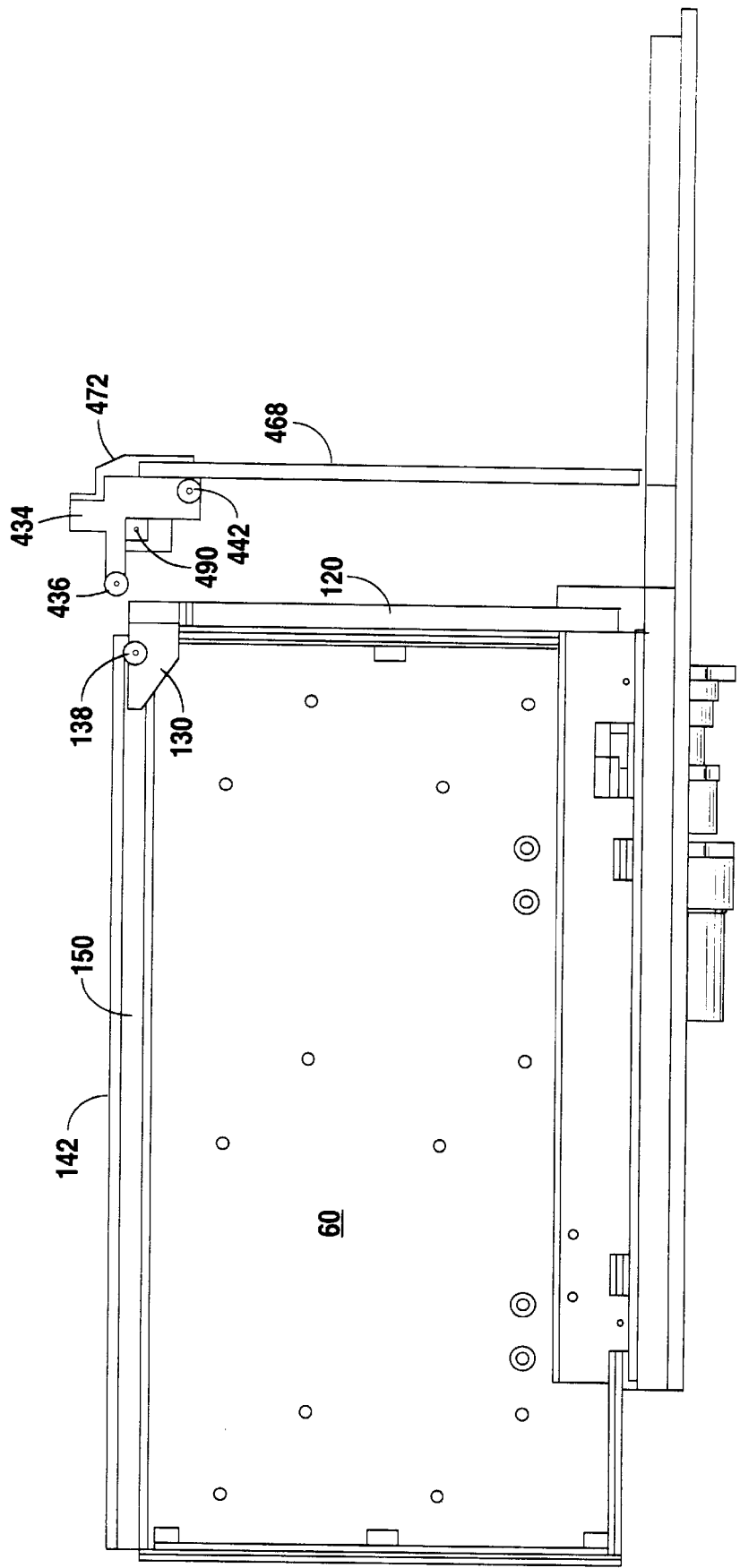
FIG. 47 is a right side elevational view illustrating the substrate housing engaged with the docking unit in the RETRACTED position.
Figure 48:
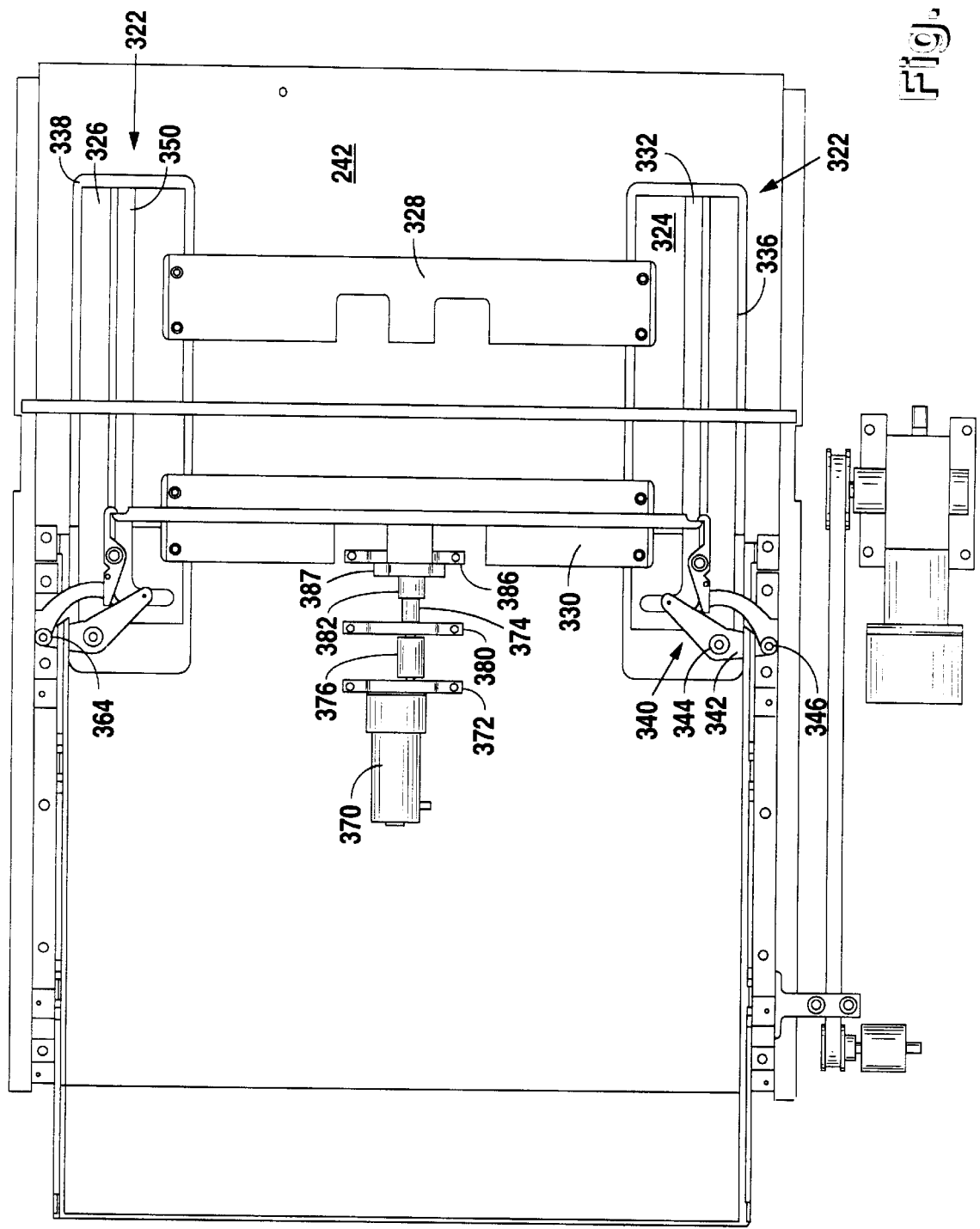
FIG. 48 is a top plan view illustrating the substrate housing engaged with the docking unit in the RETRACTED position.
Figure 51:
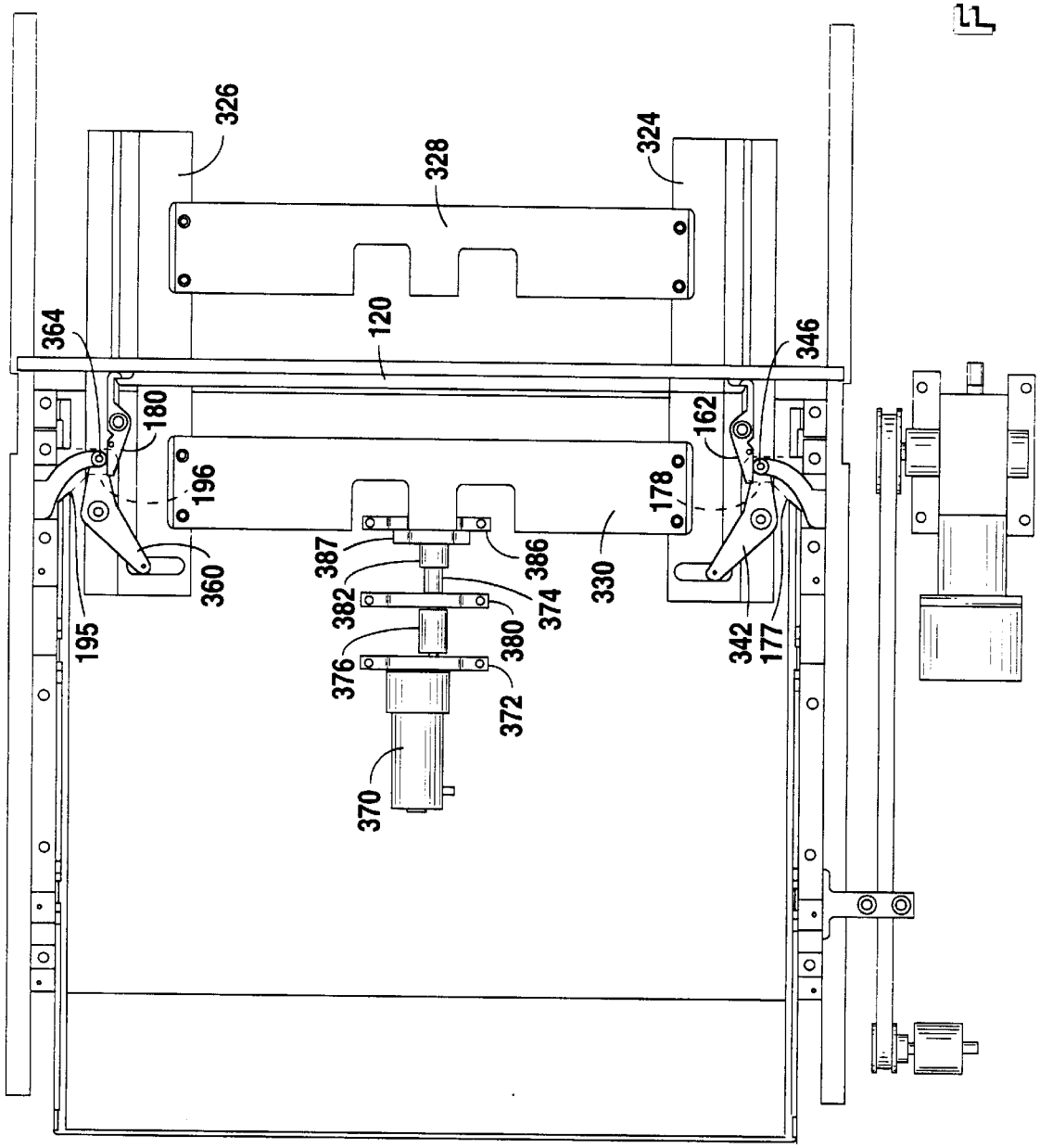
FIG. 51 is a top plan view illustrating the substrate housing engaged with the docking unit in the MIDDLE position and with the door in a locked configuration.

Referring to FIGS. 46–57, the interaction of docking unit 240 with substrate housing 60 will be described in greater detail. The right side plate 256 is not included in FIGS. 49 and 55 for purposes of illustration. FIGS. 46–48 illustrate the substrate housing 60 positioned atop tray 262 with tray 262 in its RETRACTED position and housing door 120 in its CLOSED and latched position. Substrate housing 60 is positioned atop tray 262 by rolling wheels 238 on tray side plates 266, 268. Tray 262 is moved forward by tray drive assembly 280, thereby positioning latch actuator pins 346, 364 adjacent to housing latches 162, 180, respectively, as illustrated in FIG. 51. In the MIDDLE position illustrated in FIGS. 49–51, housing door actuator 130 engages kicker rollers 436, 442 and housing door actuator 136 engages kicker rollers 458, 464. At this position, the port door 468, the kicker brackets 434, 456, the rollers 436, 442, 458 and 464, the door 120, the actuators 130, 136 and the bearings 138, 132 are set to rotate about a fixed common center of rotation (FCCR) 490.

Figure 52:
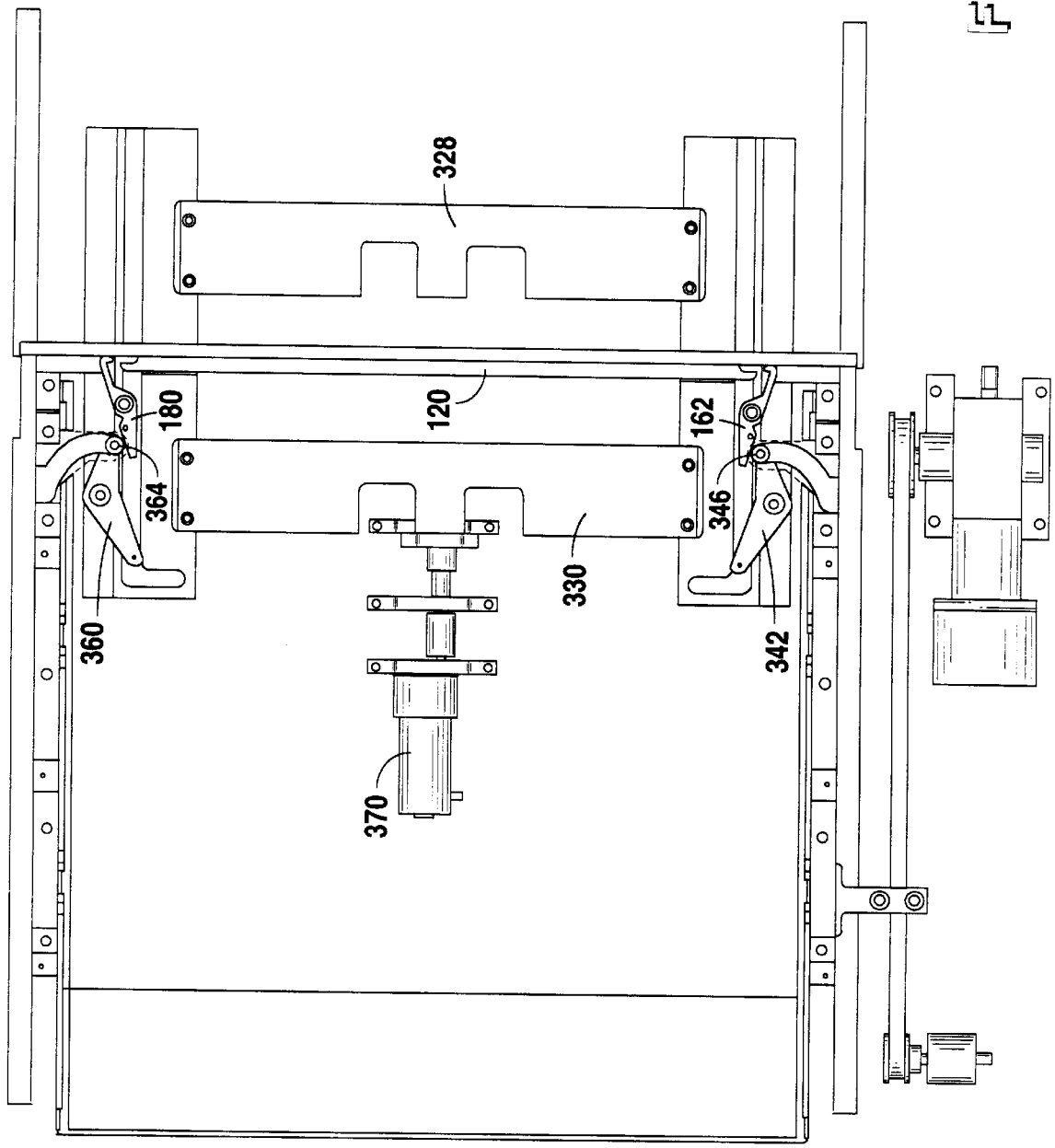
FIG. 52 is a top plan view illustrating the docking unit unlocking the substrate housing door to an unlocked configuration.
Figure 53:
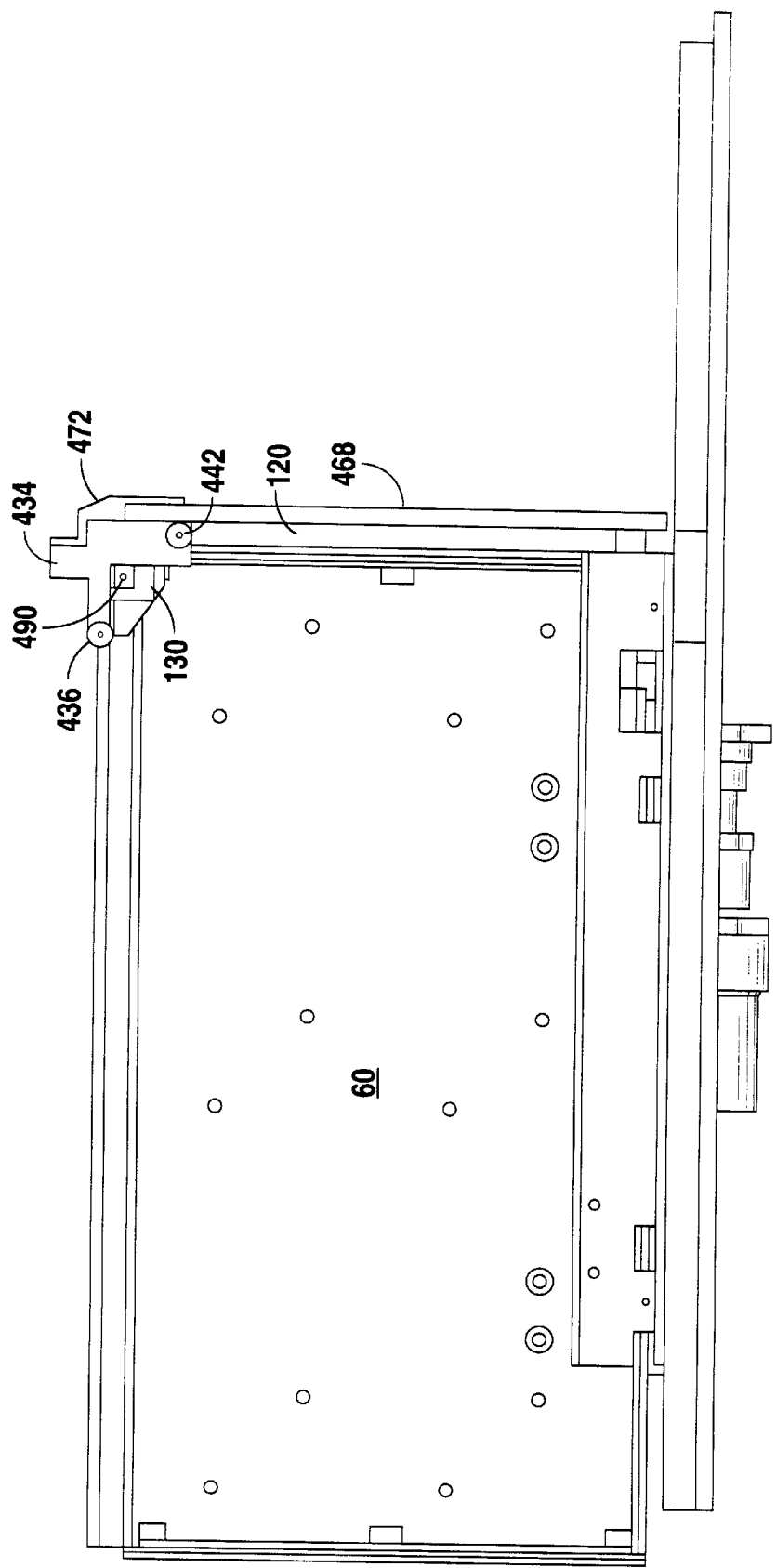
FIG. 53 is a right side elevational view illustrating the docking unit unlocking the substrate door.
Figure 54:
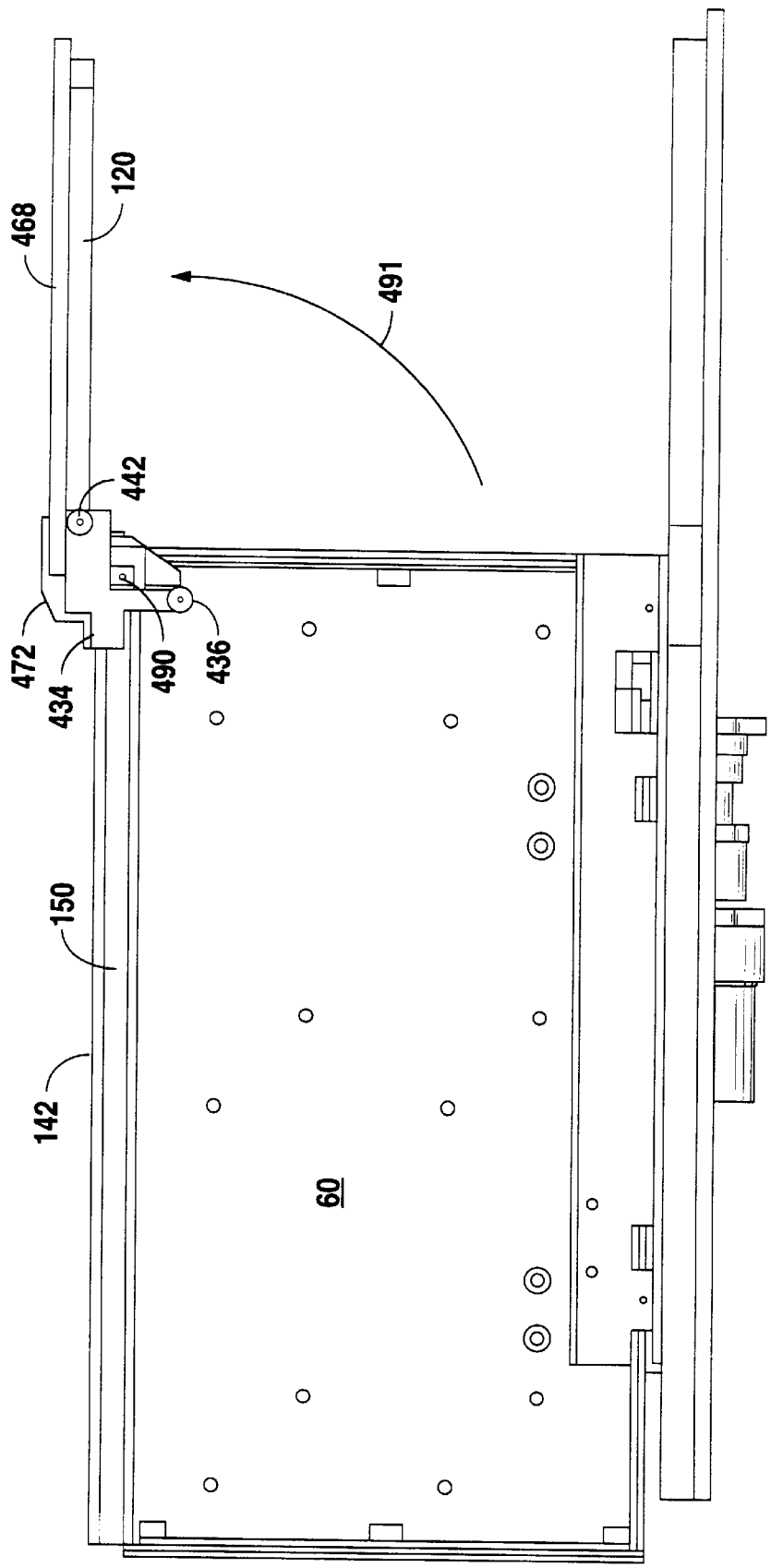
FIG. 54 is a right side elevational view illustrating the pivoting of the substrate housing door and docking unit door to the OPENED position.

Referring to FIGS. 48–54, lead screw 374 is thereafter rotated by latch motor 370 to cause cams 324, 326 to move rearward, thereby pivoting cam actuator arms 342, 360 against housing latches 162, 180, respectively, thereby unlocking housing door 120 as illustrated in FIG. 52. An outline of the passages 178, 196 and corresponding slanted edges 177, 195 of the latch assemblies 158 and 160, respectively, of the substrate housing 60 are also shown in FIG. 51. Thus, as the arms 342, 360 and corresponding actuator pins 346, 364 with bearings 348, 366, respectively, are moved, the bearings 348, 366 engage the edges 177, 195 to align the substrate housing 60 on the tray 262, if the substrate housing 60 is not already aligned. Furthermore, once the actuator pins 346, 364 and corresponding bearings 348, 366 are fully inserted as shown in FIG. 52, the substrate housing 60 is securely held to the tray 262. Door drive assembly 392 thereafter rotates door shaft 422 which pivots kickers 434, 456, thereby simultaneously opening port door 468 and housing door 120 by rotating about FCCR 490, as illustrated by an arrow 491 and as shown in FIG. 54. Note that the door 120 of the substrate housing 60 and the port door 468 of the docking unit 240 are opened simultaneously.

Once in the OPENED position, the interior space 92 of the substrate housing 60 is in fluid communication with the port area 470 and thus with the mini 15 environment. It is noted that the MIDDLE position may be thought of as an intermediate or initial access position, where fluid communication or access is prevented while the door 120 and the port door 468 are closed, and such access is provided when the doors 120, 468 are OPENED.

Figure 55:
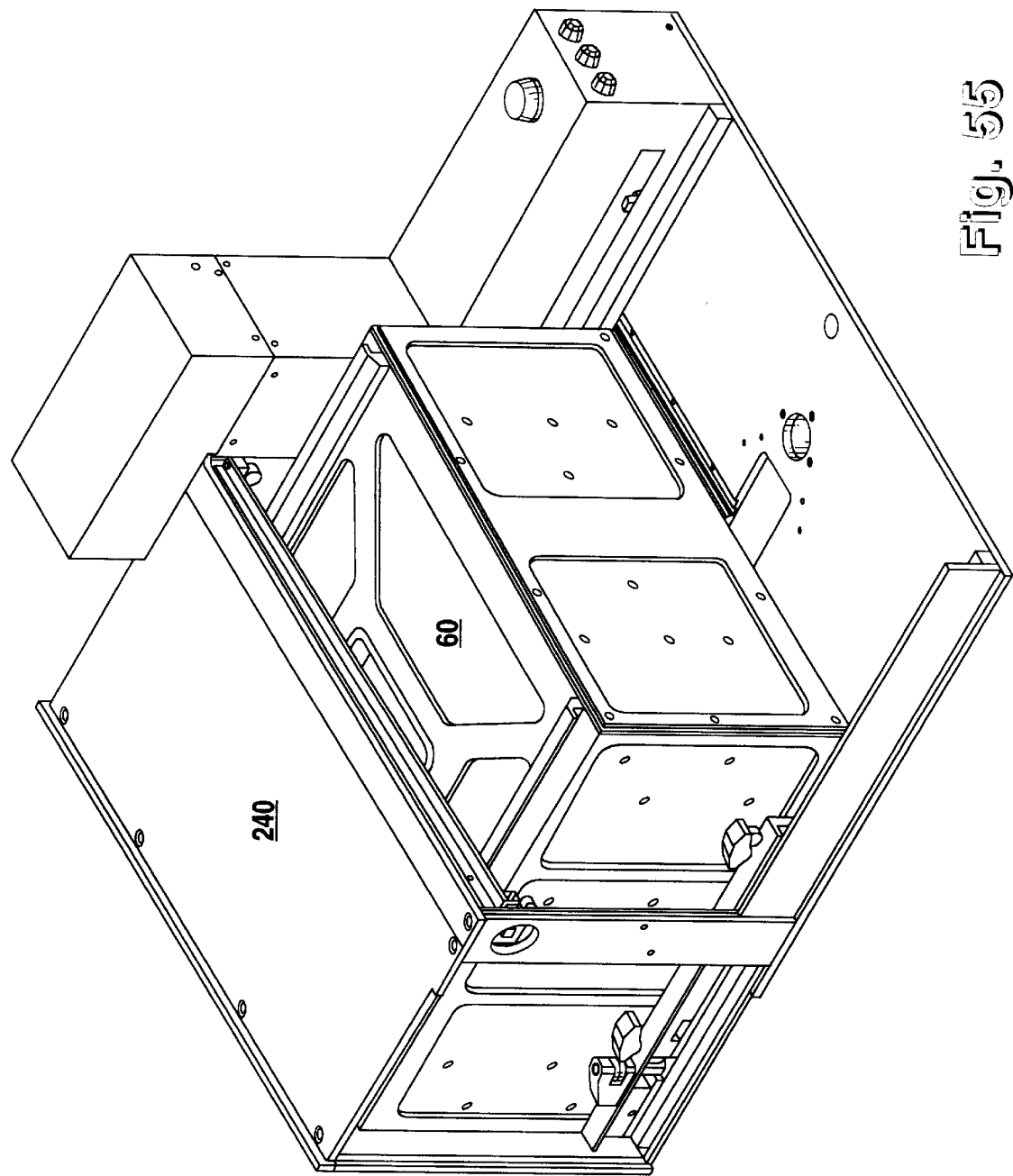
FIG. 55 is a perspective view illustrating the substrate housing engaged with the docking unit in the INSERTED position.
Figure 56:
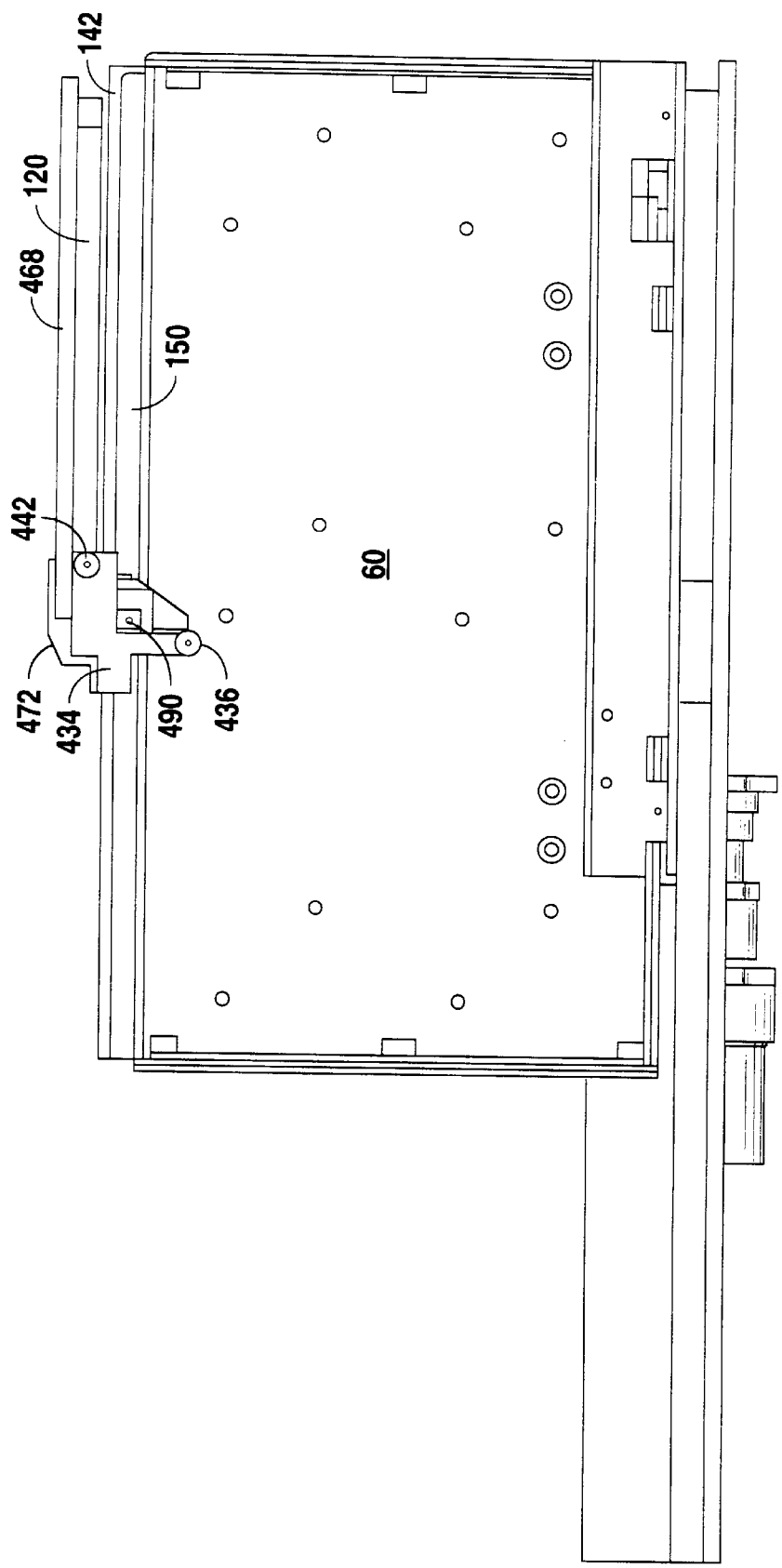
FIG. 56 is a right side elevational illustrating the substrate housing engaged with the docking unit in the INSERTED position.
Figure 57:
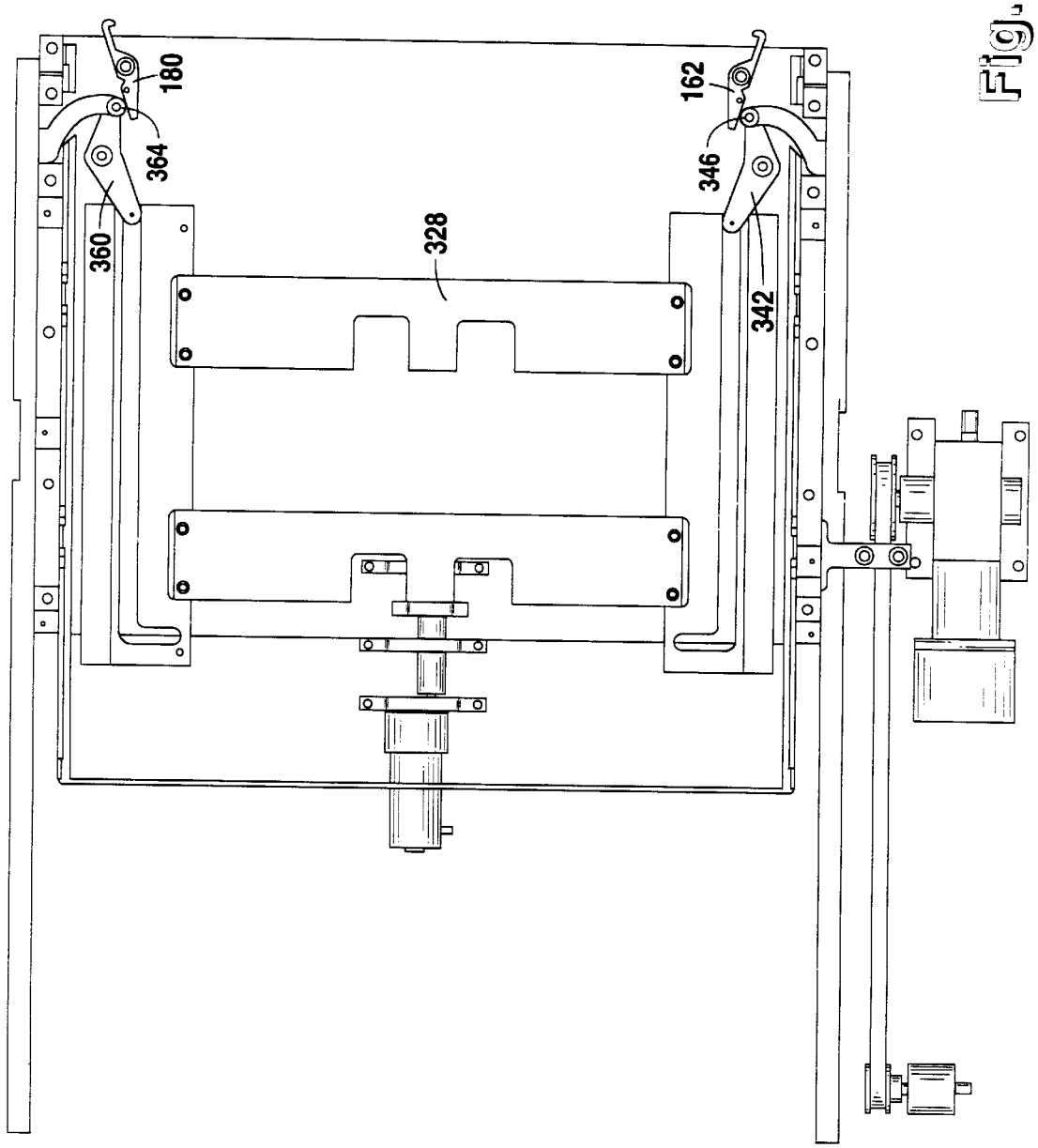
FIG. 57 is a top plan view illustrating the substrate housing engaged with the docking unit in the INSERTED position.

Referring to FIGS. 55–57, tray drive assembly 276 thereafter moves tray 262 to an INSERTED or loaded position to insert the substrate housing 60 into the port area 470 and to abut the substrate housing 60 against bulkhead 250. In this configuration, substrates 216 within substrate housing 60 may be directly accessed through bulkhead port 252 and robotic equipment or other instruments within the mini environment. It is noted that the bracket 434, 456 and rollers 458, 464 drive the rotation of the door 120, where the rollers 444, 464 forces 25 the actuators 130, 136 to rotate about the FCCR. The bearings 132, 138 permit the actuators 130, 136 and the door 120 to smoothly complete the rotation. As the substrate housing 60 moves to the INSERTED position, the door 120 remains stationary. The door 120 is thus kept in a stowed position above the substrate housing 60 by the track 142, 146 and the rollers 458, 464. The abutment 152 prevents the door 120 from moving further. After processing of the substrate housing 60, the procedure is performed in the reverse order to unload the substrate housing 60 and to close the door 120.

Once the substrates 216 have been removed, changed, or otherwise acted upon, the reverse operation may be engaged such that tray 262 is moved rearward to the MIDDLE position. Door drive assembly 392 thereafter pivots kickers 434 and 456 to simultaneously move port door 468 and housing door 120 to the CLOSED position. Cams 324 and 326 are thereafter moved forward to disengage pins 346 and 364 from latches 162 and 180, respectively, thereby allowing latches 162 and 180 to return to the locked configuration due to the biasing of springs 165 and 183, respectively. Tray drive assembly 280 thereafter moves tray 362 to the RETRACTED position illustrated in FIGS. 46–48, thereby permitting the substrate housing 60 to be removed from tray 362.

Figure 58:
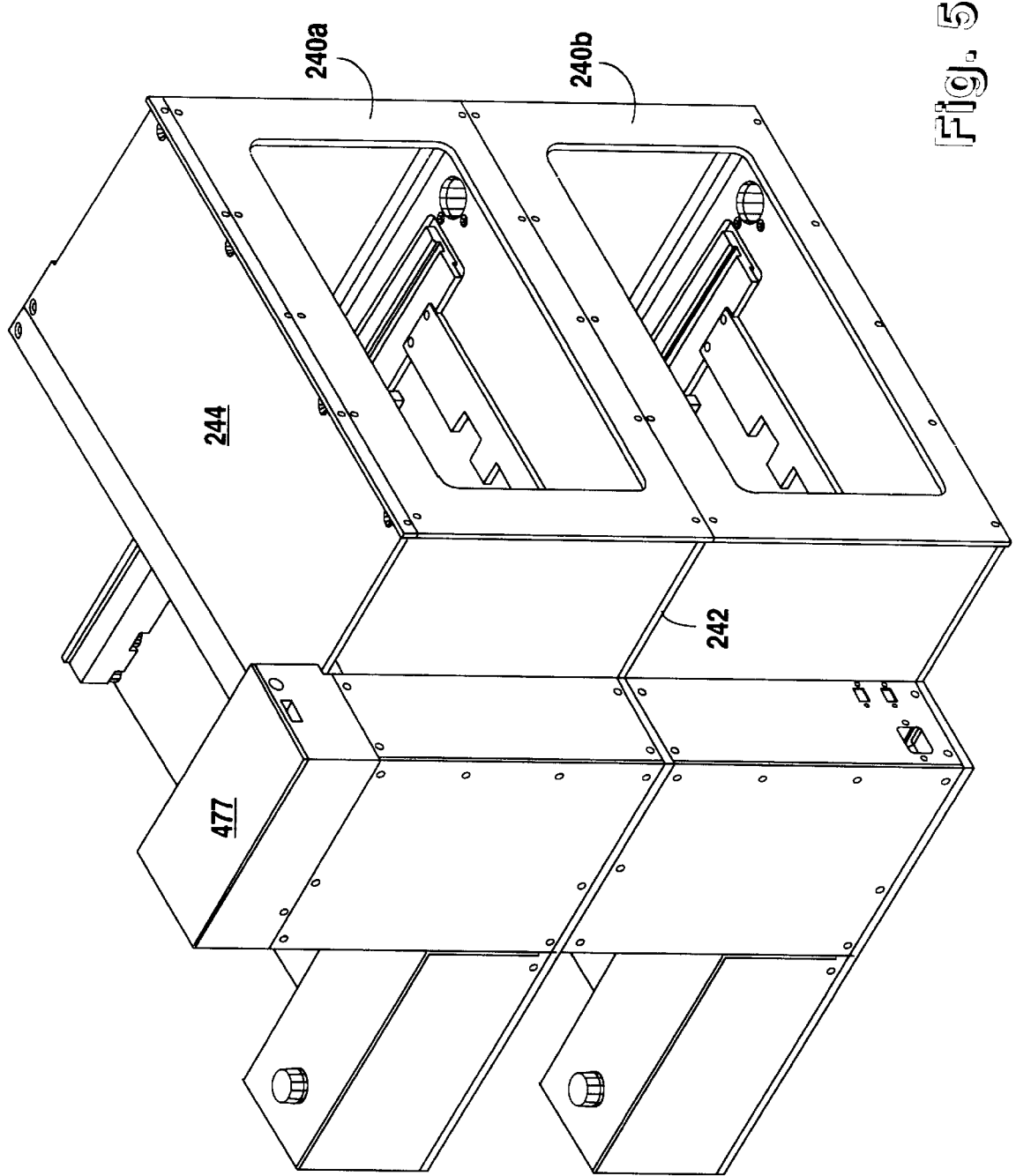
FIG. 58 is a front perspective view illustrating a docking unit of the present invention stacked atop another docking unit of the present invention.
Figure 59:
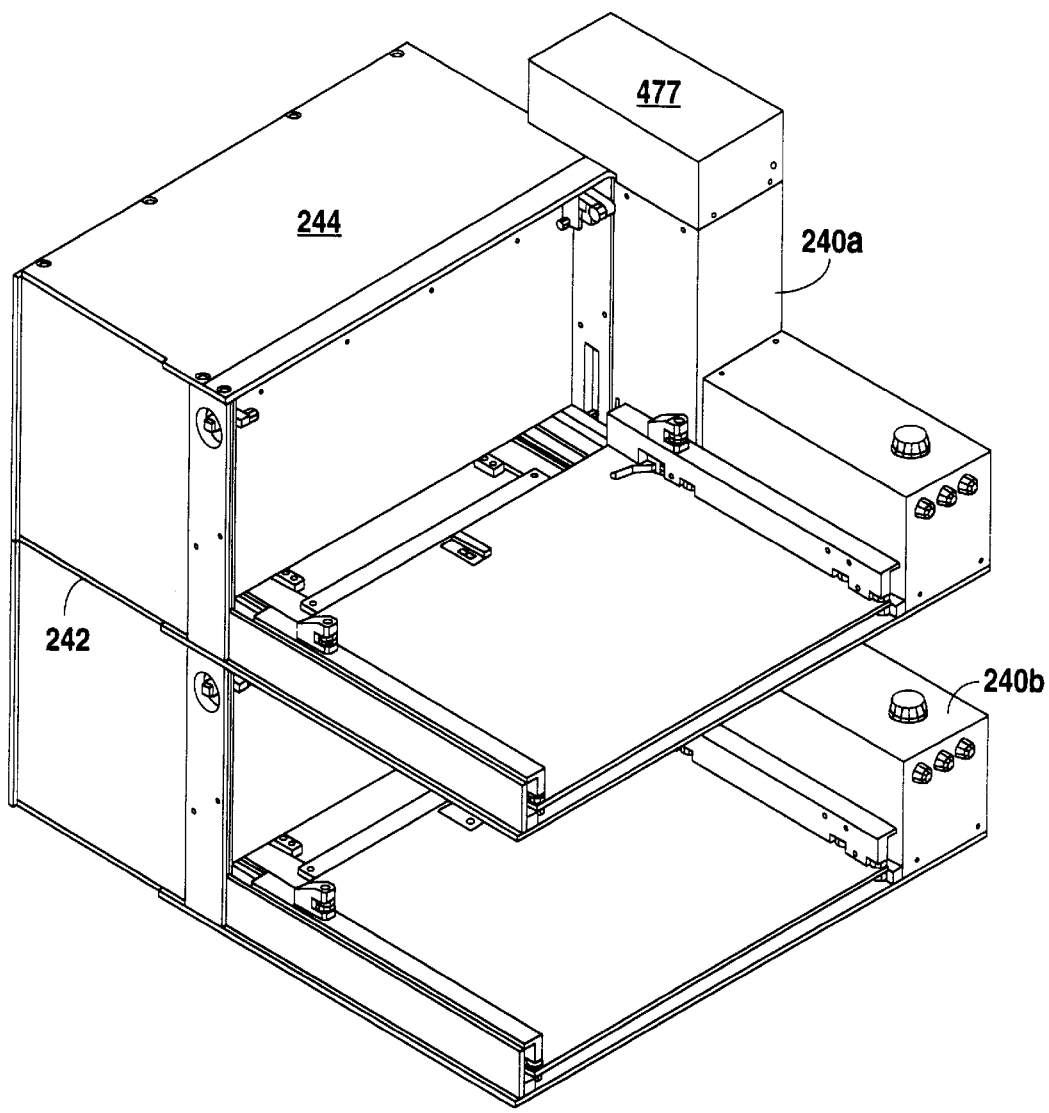
FIG. 59 is a rear perspective view illustrating the stacking of the docking unit of the present invention atop another docking unit of the present invention.

Referring to FIGS. 58 and 59, perspective views are shown illustrating an upper docking unit 240a stacked on top of a lower docking unit 240b. Although only two docking units are shown stacked together, it is understood that more than two can be stacked together in this fashion. The power supply, housing 477 and the cover plate 244 of the lower docking unit 240a are removed. The feet 258 of the upper docking unit 240a are also removed. The base plate 242 is preferably designed to replace the coverplate 244, effectively serving as an intermediate or dividing plate in a stacked configuration. The power supply within the housing 477 is connected to power the electronics of both docking units 240a, 240b. Of course, the power supply is configured to provide the necessary amount of power depending upon the number of stacked units. Operation of each of the docking units 240a, 240b is essentially the same or very similar to the docking unit 240 as described previously.

Figure 60A:
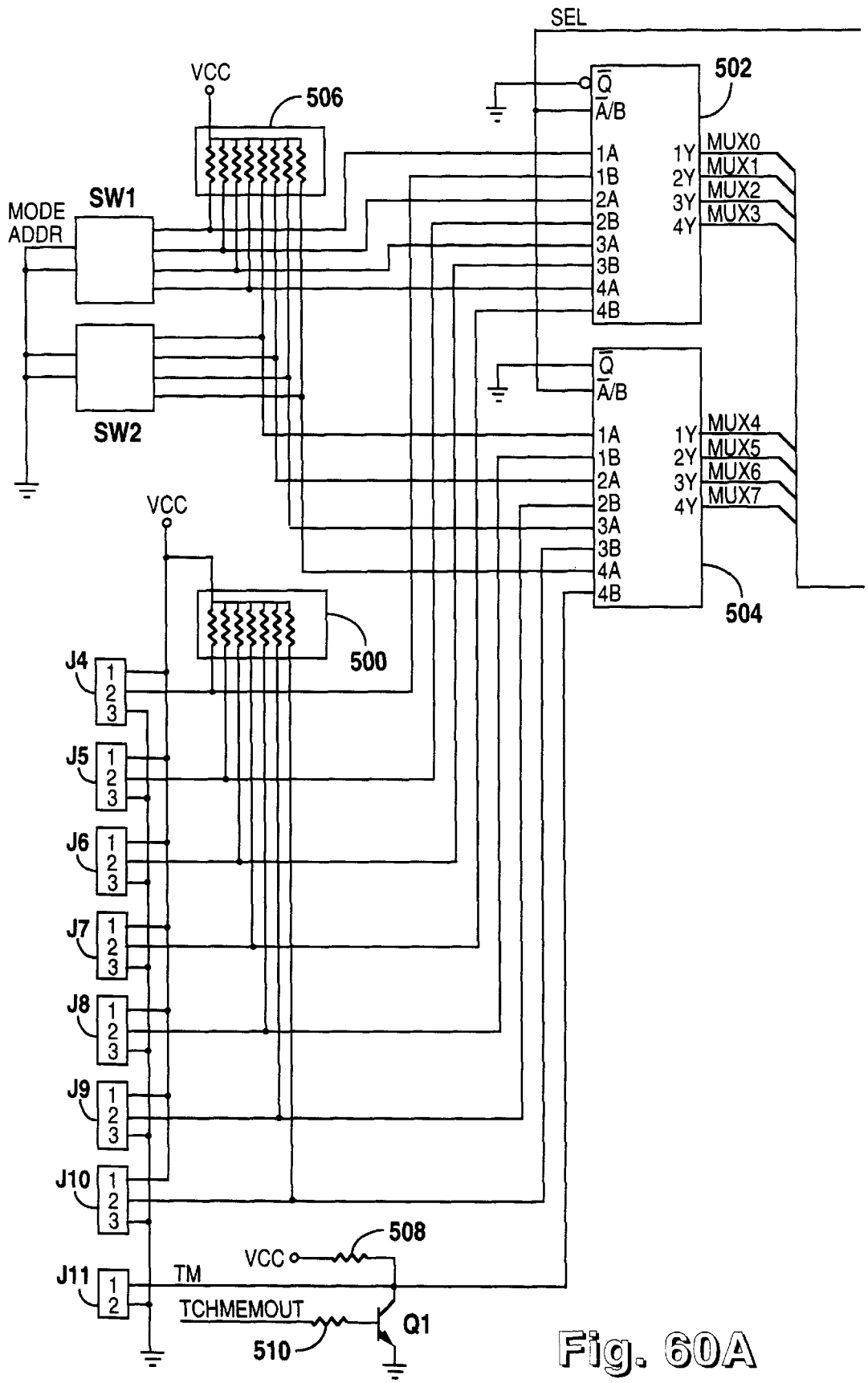
FIG. 60 is a schematic diagram showing the electronics used to control the docking unit according to the present invention.
Figure 60B:
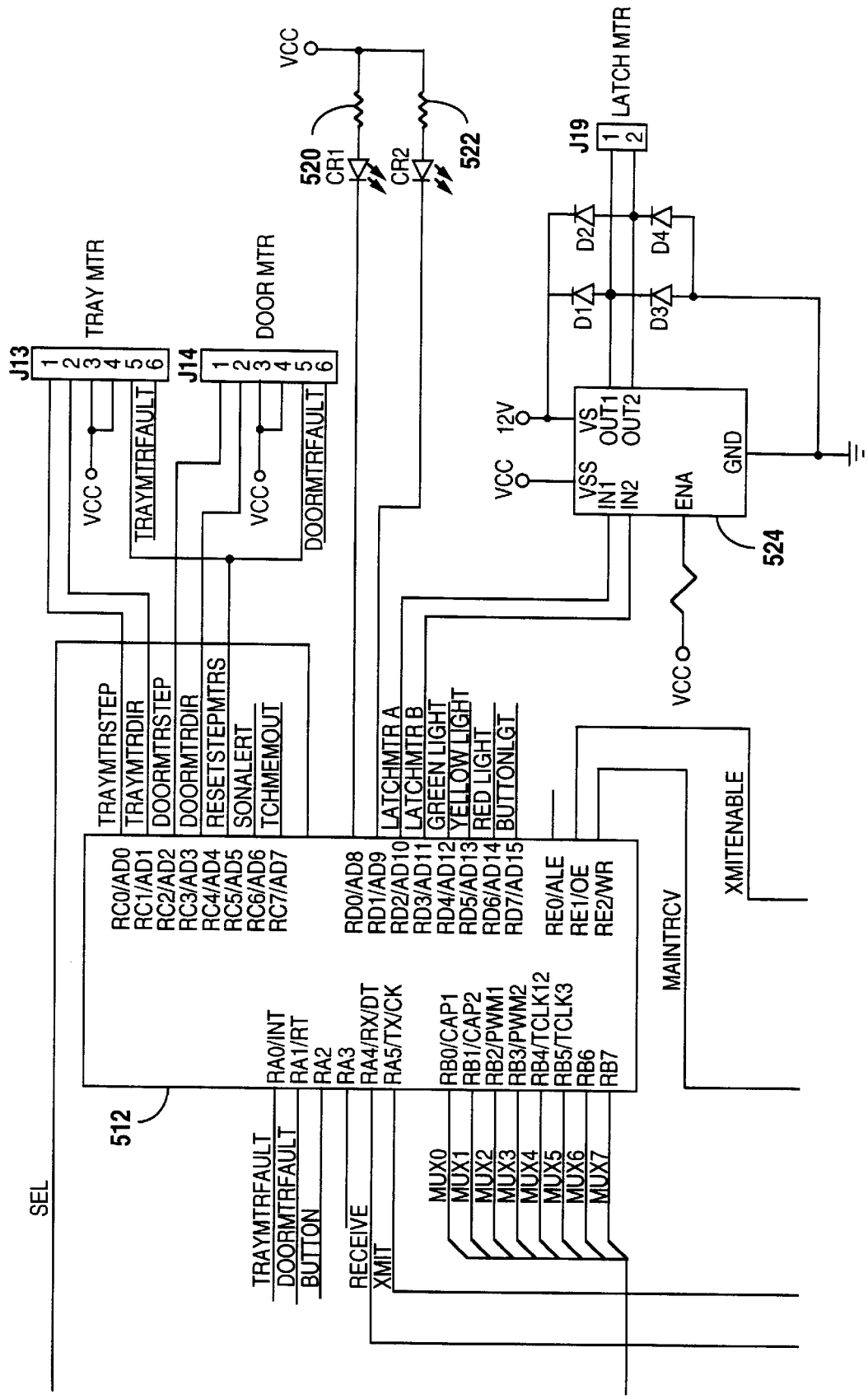
Figure 60C:
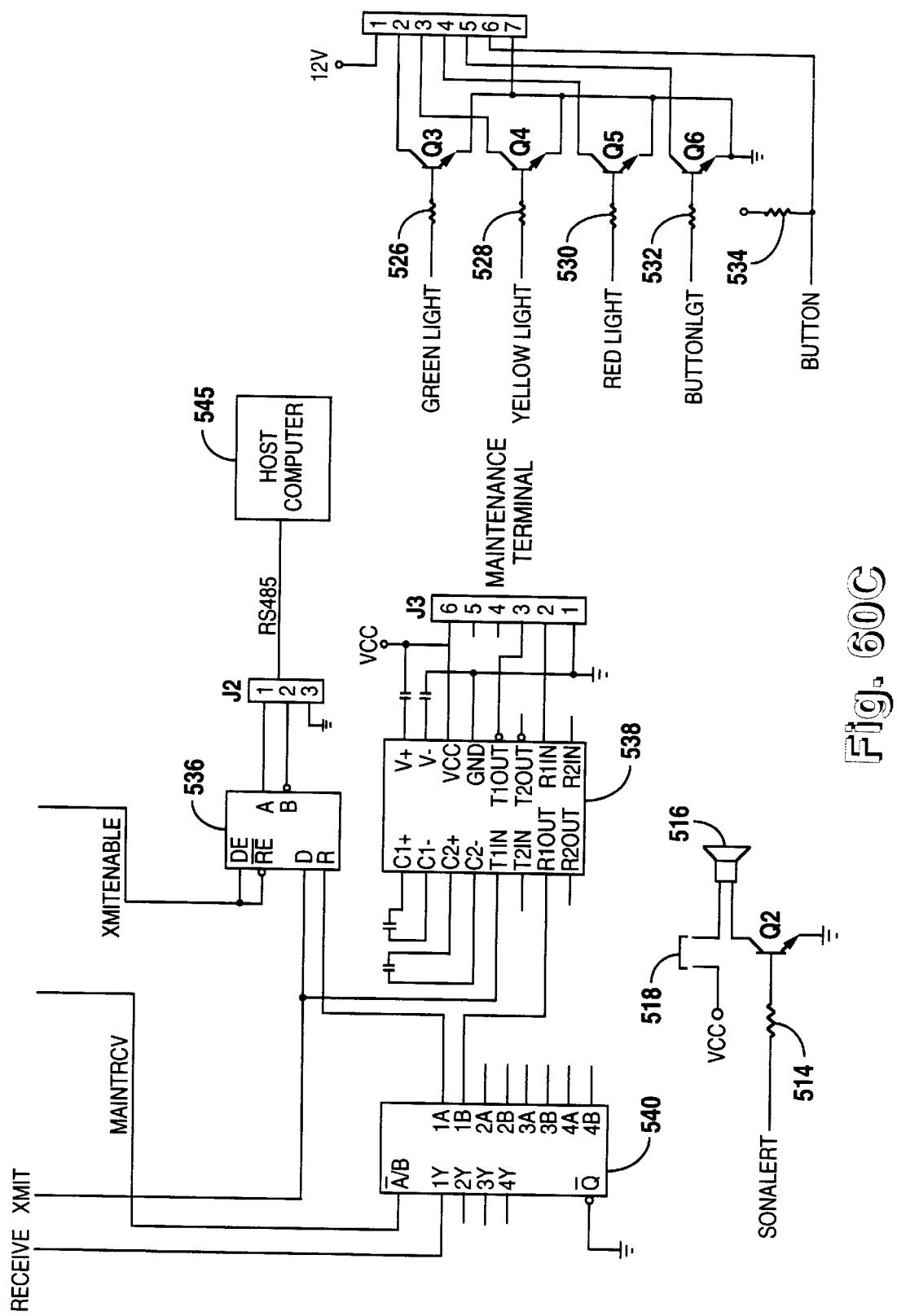

Referring now to FIG. 60, a schematic diagram is shown of the electronic control circuitry used to control the docking unit 240. The primary portions of the control circuitry are preferably mounted on a printed circuit board (PCB) (not shown) located in housing 478. Power is provided from a power supply (not shown) typically mounted in the housing 477. The tray retracted sensor 308, the tray middle sensor 309, the tray inserted sensor 310, the door opened sensor 430, the door closed sensor 428, the unlatch sensor 389, the latch sensor 390, and the touch memory contacts 269 are connected to the control circuitry through connectors J4, J5, J6, J7, J8, J9, J10 and J11, respectively. Although not explicitly shown, electrical wires are provided to electrically connect each of the sensors 308, 309, 310, 430, 428, 389, 390 and the touch memory contacts 269 to the respective connectors J4–J11. Each of the connectors J4–J10 preferably include three pins, where pin one is connected to VCC, which is preferably +5 V. Pin three of each of the connectors J4–J10 is connected to ground and pin two is connected through pull-up resistors 500 to VCC. Pin two of each of the connectors J4–J7 is connected to the 1B, 2B, 3B and 4B inputs, respectively, of a quad 2 to 1 data multiplexer (mux) 502, which is preferably the SN74157. Likewise, pin two of each of the connectors J8–J10 and pin 1 of the connector J11 are connected to the 1B, 2B, 3B and 4B inputs, respectively, of another quad 2 to 1 data mux 504, which is similar to the mux 502.

Two four-bit DIP switch packages, SW1 and SW2, form an eight-bit address referred to as NODE ADDR for identifying the docking unit 240 relative to other, similar docking units, depending upon the bit positions of the respective dip switches of the switches SW1 and SW2. The four output terminals of switch SW1 are connected through separate pull-up resistors 506 to VCC and are also connected to the 1A, 2A, 3A and 4A inputs of the mux 502. The four output terminals of the switch SW2 are connected through separate pull-up resistors 506 to VCC and are also connected to the 1A, 2A, 3A and 4A inputs, respectively, of the mux 504.

Pin two of the connector J11 is connected to ground and pin one provides a signal TM, which is connected through a resistor 508 to VCC and to the collector of a transistor Q1. Transistor Q1 is preferably a bi-polar 2N2222 type transistor or the like. A signal TCHMEMOUT is connected through a resistor 510 to the base of transistor Q1, having its emitter connected to ground. This forms a one wire bus using the TM signal between the touch memory 103, when in electrical contact with the touch memory contacts 269, and a microcontroller 512 through pin 1 of the connector J11, described more fully below. The chip select inputs of muxes 502, 504 are connected to ground and their $\overline{A}$/B inputs receive a signal SEL. When the SEL signal is pulled low, the A inputs of the muxes 502, 504 are selected and corresponding signals are provided to their Y outputs and when the SEL signal is asserted high, the B inputs are selected instead.

The heart of the control circuitry shown in FIG. 60 is a microcontroller 512, which is preferably the PIC 17C42 high performance eight-bit CMOS EPROM microcontroller by Microchip Technology, Inc. The microcontroller 512 includes a six-bit A port identified by signals RA0-RA5, an eight-bit B port identified by signals RB0–RB7, an eight-bit C port identified by signals RC0–RC7, an eight-bit D port identified by signals RD0–RD7 and a three-bit E port RE0–RE2. Several pins of the A–E ports are multiplexed with other signal functions as known to those skilled in the art. For example, the RA0 and RA1 input pins alternatively serve as interrupt inputs receiving signals TRAYMTRFAULT and DOORMTRFAULT, respectively, indicating errors of the tray motor 282 and the door motor 394, respectively. Inputs RA4 and RA5 preferably serve as receive (RX) and transmit (TX) ports, respectively, connected to signals RECEIVE and XMIT, respectively, to implement serial communications described below. The 1Y, 2Y, 3Y and 4Y outputs of the mux 502 provides signals MUX0, MUX1, MUX2 AND MUX3, respectively, to the RB0, RB1, RB2 and RB3 inputs respectively of the microcontroller 512. Likewise, the 1Y–4Y outputs of the mux 504 provide signals MUX4–MUX7 to the RB4–RB7 inputs, respectively, of the microcontroller 512.

The tray motor 282 is controlled through a six-pin connector J13, where a signal TRAYMTRSTEP is asserted through pin 1, a signal TRAYMTRDIR is asserted through pin 2, a signal RESETSTEPMTRS is asserted through pin 5 and the TRAYMTRFAULT signal is asserted through pin 6 of the connector J13. The TRAYMTRSTEP, TRAYMTRDIR, and RESETSTEPMTRS signals are provided by the RC0, RC1 and RC4 output pins, respectively, of the microcontroller 512. Pins 3 and 4 of the connector J13 are connected to VCC. In a similar manner, the door motor 394 is controlled through a six-pin connector J14, where signals DOORMTRSTEP, DOORMTRDIR, RESETSTEPMTRS and DOORMTRFAULT are asserted through pins 1, 2, 5 and 6, respectively, of the connector J14. The DOORMTRSTEP and DOORMTRDIR signals are provided by the RC2 and RC3 output pins of the microcontroller 512, respectively. Pins 3 and 4 of the connector J14 are connected to VCC.

Although not explicitly shown, the connectors J13, J14 are connected to separate stepper motor drivers, which are further connected to the tray motor 282 and the door motor 394. The microcontroller 512 asserts the direction signals TRAYMTRDIR and DOORMTRDIR to indicate the direction of the tray motor 282 and the door motor 394, respectively, where the direction indicates either clockwise or counterclockwise rotation. The microcontroller 512 asserts a pulse, preferably a negative pulse, on the step signals TRAYMTRSTEP or DOORMTRSTEP to advance the tray motor 282 or the door motor 394, respectively, by one step in the direction indicated by the direction signals. The velocity and acceleration of the tray motor 282 and the door motor 394 are dictated by the number of pulses asserted on the TRAYMTRSTEP and DOORMTRSTEP signals in a given amount of time. The TRAYMTRFAULT and DOORMTRFAULT signals are asserted by the motor drivers of the tray motor 282 and the door motor 394, respectively, upon occurrence of fault or error conditions detected by the respective stepper motor driver. The microcontroller 512 resets both stepper motors by temporarily asserting the RESETSTEPMTRS signal.

The RC5 output of the microcontroller 512 provides a signal SONALERT, which is provided through a resistor 514 to the base of a transistor Q2, which is preferably a 2N2222 n-channel bi-polar type transistor. The emitter of the transistor Q2 is connected to ground and its collector is connected to one terminal of a speaker 516 having its other terminal connected through a jumper 518 to VCC. In this manner, when the jumper 518 is installed, the microcontroller 512 sends signals through the SONALERT signal to sound an alarm through the speaker 516. The RC6 output of the microcontroller 512 provides the TCHMEMOUT signal to send data to the touch memory 103 through the connector J11 when the touch memory 103 is in electrical contact with the touch memory contacts 269. The TM signal is normally pulled high through the resistor 508. The touch memory 103 sends data or otherwise communicates by pulling the TM signal low forming one or more pulses. Likewise, the microcontroller 512 sends data or otherwise communicates to the touch memory 103 by asserting positive pulses on the TCHMEMOUT signal, which correspondingly grounds or otherwise pulses the TM signal. The main software loop executed by the microcontroller 512 preferably polls the touch memory 103 by periodically asserting a pulse on the TCHMEMOUT signal and then monitoring the TM signal to detect any responses by the touch memory 103. This is referred to as presence detect, where the microcontroller 512 determines that the touch memory 103 as well as its associated substrate housing 60 is present and placed on the tray 262 placing the touch memory 103 in electrical contact with the touch memory contacts 269. Output pin RC7 of the microcontroller 512 provides the SEL signal to the muxes 502 and 504. In this manner, when the SEL signal is asserted low, the microcontroller 512 retrieves the NODE ADDR from switches SW1 and SW2 through muxes 608 and 610 into B port pins RB0–RB7 of the microcontroller 512. If the SEL signal is asserted high, the microcontroller 512 receives data from the sensors 308, 309, 310, 428, 430, 389, 390 and from the touch memory 103.

The RD0 pin of microcontroller 512 is connected to the cathode of a light emitting diode (LED) CR1, which has its anode connected to VCC through a resistor 520. Similarly, the RD1 pin of the microcontroller 512 is connected to the cathode of another LED CR2, having its anode connected to VCC through another resistor 522. The microcontroller 512 indicates whether it is transmitting or receiving data by turning on the LED CR1 or the LED CR2 through the RD0, RD1 pins, respectively. The RD2 and RD3 pins of port D of the microcontroller 512 provide signals LATCHMTRA and LATCHMTRB to the IN1 and IN2 inputs of an L298 dual full bridge motor driver 524. Output pins OUT1 and OUT2 of the motor driver 524 are connected to pins 1 and 2 respectively of a connector J19, which is further connected to the terminals of the latch motor 370. Anodes of diodes D1 and D2 are connected to the OUT1 and OUT2 outputs, respectively, of the motor driver 524, where the cathodes of the diodes D1, D2 are connected to a twelve volt power signal 12 V. Cathodes of two similar diodes D3 and D4 are connected to the OUT1 and OUT2 outputs, respectively, of the motor driver 524, where the anodes of the diodes D3, D4 are connected to ground. It is noted that the latch motor 370 is a DC electrical motor rather than a stepper motor. In this manner, the microcontroller 512 controls the latch motor 370 through the LATCHMTRA and LATCHMTRB signals.

The output pins RD4, RD5 and RD6 provide signals GREEN LIGHT, YELLOW LIGHT and RED LIGHT through resistors 526, 528 and 530, respectively, to the bases of transistors Q3, Q4 and Q5, respectively. The transistors Q3, Q4 and Q5 are preferably bi-polar 2N2222 type transistors each having their emitters connected to ground. The collectors of the transistors Q3, Q4 and Q5 are connected to pins 2, 3 and 4, respectively of a connector J12 where these pins are further connected to the green light 484, the yellow light 486 and the red light 488, respectively, for providing status indications to the operator of the docking unit 240 according to the present invention. A signal BUTTONLGT is provided by the RD7 output pin of the microcontroller 512 and is also connected to the base of another transistor Q6 through a resistor 532, where the transistor Q6 is also a 2N2222 bi-polar type transistor. The emitter of the transistor Q6 is connected to ground and its collector is connected to pin 5 of the connector J12, which is connected to the button light 482 within the button 480. A signal BUTTON is connected to the RA2 pin of the microcontroller 512 and to pin 6 of the connector J12. A pullup resistor 534 is connected between VCC and the BUTTON signal. The contacts of the button 480 are connected between pin 6 of the connector J12 and ground, so that the BUTTON signal is grounded while the button 480 is pressed.

The RA4/RX pin of the microcontroller 512 is connected to the 1Y input of a mux 540, which is similar to the muxes 502 and 504. The XMIT signal is asserted by the RA5/TX pin of the microcontroller 512 to the D input of a serial port 536, which is preferably an SN75176B capable of conforming to the RS-485 standard serial communication, and also to the T1IN input of a serial port 538, which is preferably a MAX232 conforming to the RS-232 standard serial communications. The 1A output of the mux 540 is connected to the R input of the 485 serial port 536, which receives a signal XMITENABLE at its chip enable inputs provided from the RE1 output pin of the microcontroller 512. The RE2 output of the microcontroller 512 provides a signal MAINTRCV, which is provided to the $\overline{A}/B$ input of the mux 540. The 1B output of the mux 540 is provided to the R1OUT inverted input of the 232 serial port 538. The differential outputs A and B of the 485 serial port 536 are connected to pins 1 and 2, respectively, of a 3-pin connector J2, having its third pin connected to ground. A six-pin connector J3 is provided for connecting to a handheld portable input/output device for performing manual maintenance functions to test operation of the docking unit 240. Pins 2 and 3 of the connector J3 are connected to the R1IN input and the inverted T1OUT output, respectively, of the 232 serial port 538.

The connector J2 is connected to a serial connector of a host computer 545, where the 485 serial port 536 facilitates RS 485 communications between the microcontroller 512 and the host computer 545. The 232 serial port 538 facilitates RS 232 serial communications with the handheld maintenance device through the connector J3. Thus, transmit signals provided by the microcontroller 512 on the XMIT signal are provided to both serial ports 536 and 538. However, the microcontroller 512 lowers the MAINTRCV signal in operational mode to receive data from the 485 serial port 536 and ultimately from the host computer 545, and the microcontroller 512 raises the MAINTRCV signal in a maintenance mode to receive data from the 232 serial port 538 and ultimately from the handheld maintenance unit. The handheld maintenance unit allows manual manipulation of the docking unit 240 for maintenance and testing purposes.

The communication and data transfer protocol between the host computer 545, the microcontroller 512 of the docking unit 240 and the touch memory 103 will now be briefly described. The touch memory 103 preferably includes several data fields containing information specific to the substrate housing 60 and the substrates loaded within the substrate housing 60. In general, the microcontroller 512 of the docking unit 240 provides an interface for the host computer 545 for detecting the substrate housing 60 through the touch memory 103, controlling movement of the substrate housing 60 and reading and writing data to and from the touch memory 103 as controlled by the host computer 545. The host computer 545 controls operation by sending commands to the microcontroller 512 to load or insert and unload the substrate housing 60 and to retrieve and update information within the touch memory 103.

The touch memory 103 preferably includes approximately 300 bytes of data separated into fifteen data fields. This information is preferably organized as shown in Table 1:

TABLE 1

Contents of Touch Memory 103

| Data Field# | Data Field Contents | Data Bytes | CRC Bytes | Total | Start Addr | End Addr | Byte Cnt |
|---|---|---|---|---|---|---|---|
| 1 | Housing ID | 15 | 2 | 25 | 0000 | 0018 | 19h |
|   | DOB | 8 |   |   |   |   |   |
| 2 | Last Clean Date | 8 | 2 | 25 | 0020 | 0038 | 19h |
|   | Device Type | 15 |   |   |   |   |   |
| 3 | Route ID | 4 | 2 | 23 | 0040 | 0056 | 17h |
|   | Work Step | 4 |   |   |   |   |   |
|   | Step ID | 4 |   |   |   |   |   |
|   | Next Tool | 3 |   |   |   |   |   |
|   | Operator ID | 6 |   |   |   |   |   |
| 4 | Slot 1 Substrate ID | 16 | 2 | 18 | 0060 | 0071 | 12h |
| 5 | Slot 2 Substrate ID | 16 | 2 | 18 | 0080 | 0091 | 12h |
| 6 | Slot 3 Substrate ID | 16 | 2 | 18 | 00A0 | 00B1 | 12h |
| 7 | Slot 4 Substrate ID | 16 | 2 | 18 | 00C0 | 00D1 | 12h |
| 8 | Slot 5 Substrate ID | 16 | 2 | 18 | 00E0 | 00F1 | 12h |
| 9 | Slot 6 Substrate ID | 16 | 2 | 18 | 0100 | 0111 | 12h |
| 10 | Slot 7 Substrate ID | 16 | 2 | 18 | 0120 | 0131 | 12h |
| 11 | Slot 8 Substrate ID | 16 | 2 | 18 | 0140 | 0151 | 12h |
| 12 | Slot 9 Substrate ID | 16 | 2 | 18 | 0160 | 0171 | 12h |
| 13 | Slot 10 Substrate ID | 16 | 2 | 18 | 0180 | 0191 | 12h |
| 14 | Slot 11 Substrate ID | 16 | 2 | 18 | 01A0 | 01B1 | 12h |
| 15 | Slot 12 Substrate ID | 16 | 2 | 18 | 01C0 | 01D1 | 12h |

In general, data field 1 includes information specific to the substrate housing 60 itself, such as its identification number and origination date, data field 2 includes device type and cleaning date information and data field 3 includes information of the history and status of the substrate housing 60. Data fields 4–15 store information of the substrates loaded within the twelve slots of the substrate housing 60. In this manner, the host computer 545 can identify each of the substrates loaded within the substrate housing 60 and retrieve information concerning the substrate housing 60 itself by reading the contents of the touch memory 103. The information further includes cyclic redundancy check (CRC) bytes for performing error detection, where a character generated at the transmitting terminal is matched with a character at the receiving terminal as known to those skilled in the art. Alternative types of error detection are contemplated, such as checksum or the like for determining the accuracy of the data communicated.

Communication between the host computer 545 and the microcontroller 512 are facilitated through use of the 485 serial port 536 for implementing RS 485 serial communications. In general, the host computer 545 sends one of several commands to the microcontroller 512 through the 485 serial port 536 and the microcontroller 512 responds according to the current conditions of the docking unit 240 and the substrate housing 60. Table 2 illustrates several operational commands sent by the host computer 545 and the corresponding responses provided by the microcontroller 512:

TABLE 2

Host computer 545 Commands and Docking Unit 240 Responses

| Host Commands (Data) | | | Responses from Docking Unit | | |
|---|---|---|---|---|---|
| Cmd (hex) | Command Name | Data | Rsp (hex) | Response Name | Data |
| 1 | Status request | none | 1 | Not Present | |
|   |   |   | 2 | Unloaded | |
|   |   |   | 3 | Loading/Unloading | |
|   |   |   | 4 | Loaded | |

TABLE 2-continued

Host computer 545 Commands and Docking Unit 240 Responses

| Host Commands (Data) | | | Responses from Docking Unit | | |
|---|---|---|---|---|---|
| Cmd (hex) | Command Name | Data | Rsp (hex) | Response Name | Data |
| | | | 5 | Error | error code |
| 2 | Load | none | 20 | Acknowledge Load | none |
| | | | 21 | Error | error code |
| 3 | Unload | none | 30 | Acknowledge Unload | none |
| | | | 3i | Error | error code |
| 4 | Read Touch Memory | Data Field # | 40 | Tag Data | data filed #, data |
| | | | 41 | Error | error code |
| 5 | Write Touch Memory | Data Field #, Data | 50 | Acknowledge Write | none |
| | | | 51 | Error | error code |
| 6 | Good Ack | | 60 | None | None |
| 7 | Bad Atk | | 70 | None | none |

In this manner, the host computer 545 can determine the status of the substrate housing 60 by sending a status request command to the microcontroller 512, which responds by indicating whether the substrate housing 60 is present or not, and if present, whether the substrate housing 60 is loaded, unloaded, or loading/unloading. Error information is also provided to the host computer 545, if any. The host computer 545 sends a LOAD command to load the substrate housing 60 and the microcontroller 512 responds with the appropriate message, depending upon the state of the docking unit 240. Likewise, the host computer 545 sends an UNLOAD command to unload the substrate housing 60 and receives a response similar to that described about for the LOAD command.

The host computer 545 retrieves particular data from the touch memory 103 by sending a READ DATA FIELD command and providing the data field number for the information desired. This corresponds to the information within the touch memory 103 described in Table 1 above. The microcontroller 512 correspondingly reads the information from the appropriate data field within the touch memory 103 and transfers this information to the host computer 545. Similarly, after the substrates 216 within the substrate housing 60 have been processed, the host computer 545 may desire to update the data field information associated with the substrates 216 by sending a WRITE DATA FIELD command to the microcontroller 512 along with the new touch memory data, which the microcontroller 512 writes into the touch memory 103. The read and write commands also provide error messages indicating that the touch memory 103 is not present. It is understood that many other types of commands and communication protocols are contemplated, the present invention not being limited to any particular command structure or communication protocol.

The commands sent by the host computer 545 and the responses of the microcontroller 512 generally conform to the following format:

| Node Addr | Cmd/Rsp | Data Len | [data] | [data] | CRCL | CRCH | CRCX |
|---|---|---|---|---|---|---|---| where each field preferably represents 1 byte if information. The Node Addr field is the firstbyte sent and preferably has the most significant bit asserted high to indicate that it is a NODE ADDR. The address for the host computer 545 is zero and valid addresses for the substrate housing 60 are between 1 and 31 (decimal). The CMD/RSP field includes hexadecimal codes for each of the commands described in table 2, or otherwise this field indicates the 25 corresponding hexadecimal code for the response from the microcontroller 512. The Data Len field specifies how many data bytes are included for those commands requiring data. If no data is required for a message, the Data Len value will be zero. The data fields hold whatever data the particular command or response requires. Finally, three CRC bytes, including a low byte, a high byte and a third byte containing the MSBs (most significant bits) of the prior two bytes are sent for implementing CRC error checking as known to those skilled in the art. Alternatively, a checksum byte could be provided which is calculated by adding the values of the bytes preceding it, neglecting any overflow and clearing the MSB so that the byte is read as a data byte and not an address byte. It is understood that the above protocol is chosen for purposes of simplicity, although many other types of appropriate protocols could be used.

Referring now to FIG. 61, a state diagram is shown illustrating the general operation of the docking unit 240 according to the present invention. Transition into each state is determined by five input bits, including a WRONG bit indicating that a substrate housing 60 placed on the docking unit 240 is the incorrect substrate housing 60, an UNLOAD bit indicating whether the docking unit 240 has received the corresponding UNLOAD command from the host computer 545, a LOAD bit indicating whether the docking unit 240 has received the corresponding LOAD command from the host computer 545, a BUTTON PRESSED bit indicating whether the operator has pressed the button 480 or not, and finally a PRESENT bit indicating whether or not the substrate housing 60 has been detected on the docking unit 240. Four output or status bits RED, YELLOW, GREEN and BUTTON indicate the status of the system, where these bits are indirectly used to operate the red light 488, the yellow light 486, the green light 484 and the button light 482 to indicate the status to, or otherwise to prompt action from, an operator of the docking unit 240. When the BUTTON bit is set, the button light 482 blinks on and off to prompt the operator to press the button 480, which is detected by the microcontroller 512 with the BUTTON signal. The RED bit is set to turn on the red light 488 if an error is detected. The YELLOW bit is set to turn on the yellow light 486 when the docking unit 240 is processing a loaded substrate housing 60. The GREEN bit is set to turn on the green light 484 to indicated that the docking 25 unit 240 is operational. The input bits which cause the state change and the state of the resulting output bits is shown next to the corresponding transition. An "X" indicates 'don't care' where the state of the bit is not important.

The docking unit 240 begins in a first state I which indicates that no substrate housing 60 is present and that the docking unit 240 is ready to receive a new substrate housing 60. It remains in state 1 while the PRESENT bit remains at logic 0 which indicates that the touch memory 103 has not been detected. The green light 484 is turned on and all other status lights are turned off in state 1. When a substrate housing 60 is loaded onto the docking unit 240 such that the touch memory 103 makes contact with the touch memory contacts 269, the PRESENT bit is set to 1, and the docking unit 240 enters a state 2a, indicating that the substrate housing 60 has been detected on the tray 262, and that there have been no previous errors. The green light 484 remains on and all other status lights remain off. Also, the button light 482 starts blinking to prompt the operator to press the button 480. The docking unit 240 remains in state 2a as long as the touch memory 103 is detected and the button 480 has not been pressed. The docking unit 240 returns back to state 1 if the PRESENT bit is cleared indicating that the substrate housing 60 has been removed from the docking unit 240.

Figure 49:
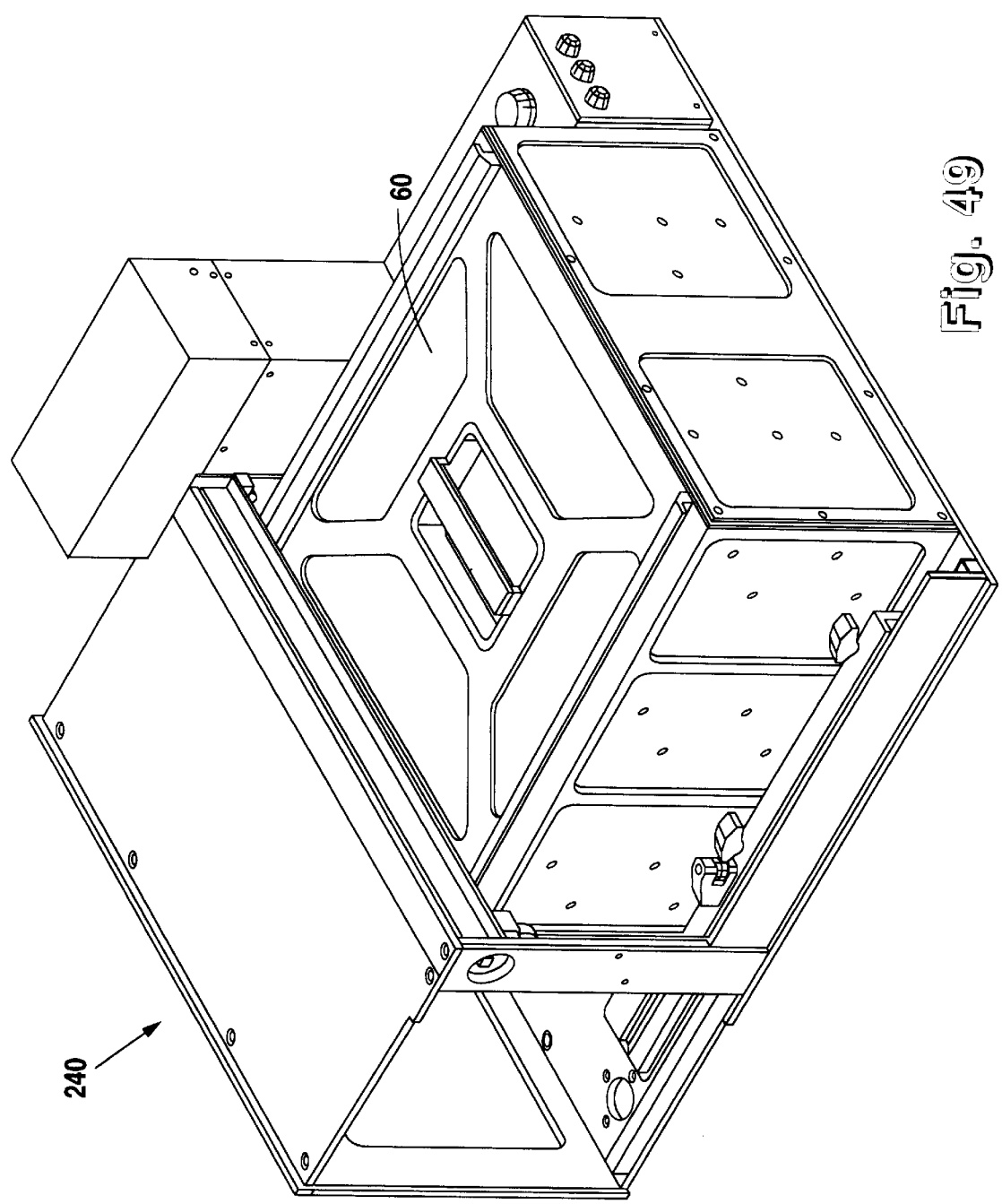
FIG. 49 is a perspective view illustrating the substrate housing engaged with the docking unit in the MIDDLE position.
Figure 50:
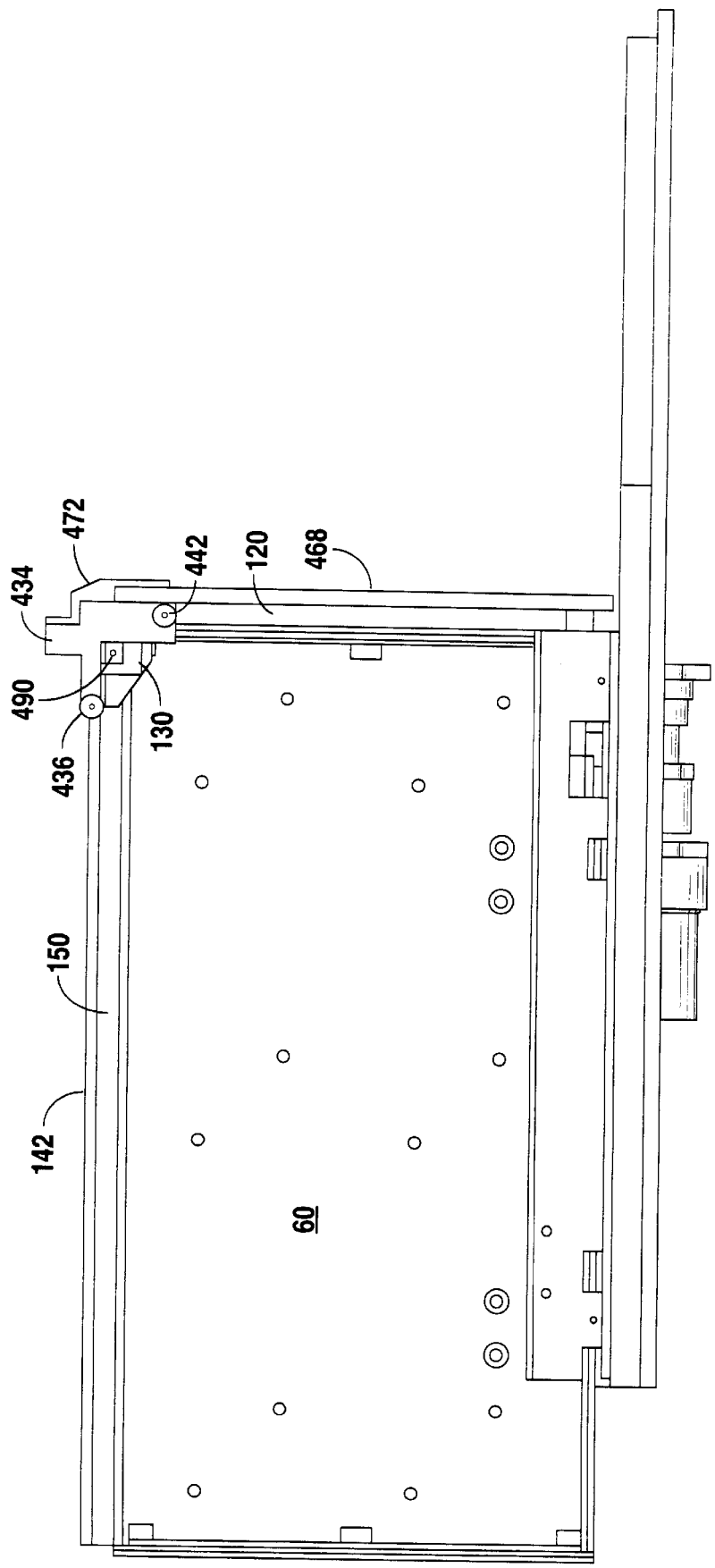
FIG. 50 is a right side elevational view illustrating the substrate housing engaged with the docking unit in the MIDDLE position.

From state 2a, the docking unit enters state 3a if the button 480 is pressed while the substrate housing 60 is still present. In response to the button 480 being pressed, the microcontroller 512 controls the tray motor 282 to move the substrate housing 60 from the RETRACTED to the MIDDLE position, as shown in FIG. 49. The button light 482 is turned off while the substrate housing 60 is moved. When the substrate housing 60 reaches the MIDDLE position, the button light 482 starts blinking again to indicate that the substrate housing 60 can be removed from the docking unit 240. While in state 3a, the host computer 545 requests that the docking unit 240 read the information from the touch memory 103, where the information is transmitted to the host computer 545 via the 485 serial port 536. In this manner, the host computer 545 determines if the correct substrate housing for the current process is present. The docking unit 240 remains in state 3a until either the host computer 545 sends a LOAD command, where operation proceeds to state 4, or the operator decides to remove the substrate housing 60 by pressing the button 480, where operation returns to state 2a, or the host computer 545 informs the docking unit 240 that the wrong substrate housing is present, where operation proceeds to state 3b.

If the host computer 545 determines that the wrong substrate housing is present, the docking unit 240 enters state 3b, where the WRONG bit is set to logic 1. The green light 484 is turned off, the red light 488 is turned on and the button light 480 is left blinking to indicate to the operator that the wrong substrate housing is present and should be removed. Operation remains in state 3b until the button 480 is pressed indicating that the operator has acknowledged the wrong substrate housing is present. When the button 480 is pressed, the docking unit 240 enters state 2b from state 3b where the substrate housing 60 is moved to the RETRACTED position. The button light 482 and the red light 488 are turned off. Operation remains in state 2b while the wrong substrate housing 60 is present, but advances back to state 1 when the substrate housing 60 is removed from the docking unit 240. In this case, the green light 484 is turned back on and the other status lights are turned off Referring back to state 3a, if it is determined that the substrate housing 60 is correct and if the LOAD command has been sent from the host computer 545, the docking unit 240 advances to state 4 where the substrate housing 60 is moved to the INSERTED position. The yellow light 486 and the green light 484 are turned on and the red light 488 is left off. State 4 indicates that the substrate housing 60 is being processed. The docking unit 240 remains in state 4 until the UNLOAD command is sent from the host computer 545. At that time, the docking unit 240 advances to state 5, where the substrate housing 60 is moved back to the MIDDLE position and the door 120 is CLOSED. In state 5, the yellow light 486 and the green light 484 remain on and the button light 482 is blinking, thereby indicating to the operator that the substrate housing 60 has been processed and is ready to be removed. The docking unit 240 remains in state 5 until the button 480 is pressed, at which time the docking unit 240 advances to state 6 where the substrate housing 60 is moved to the RETRACTED position to allow removal from the docking unit 240. The yellow light 486 and the button light 482 are turned off and the green light 484 remains on in state 6. The docking unit 240 remains in state 6 until the substrate housing 60 is removed from the docking unit 240, at which time it returns to state 1.

Figure 62A:
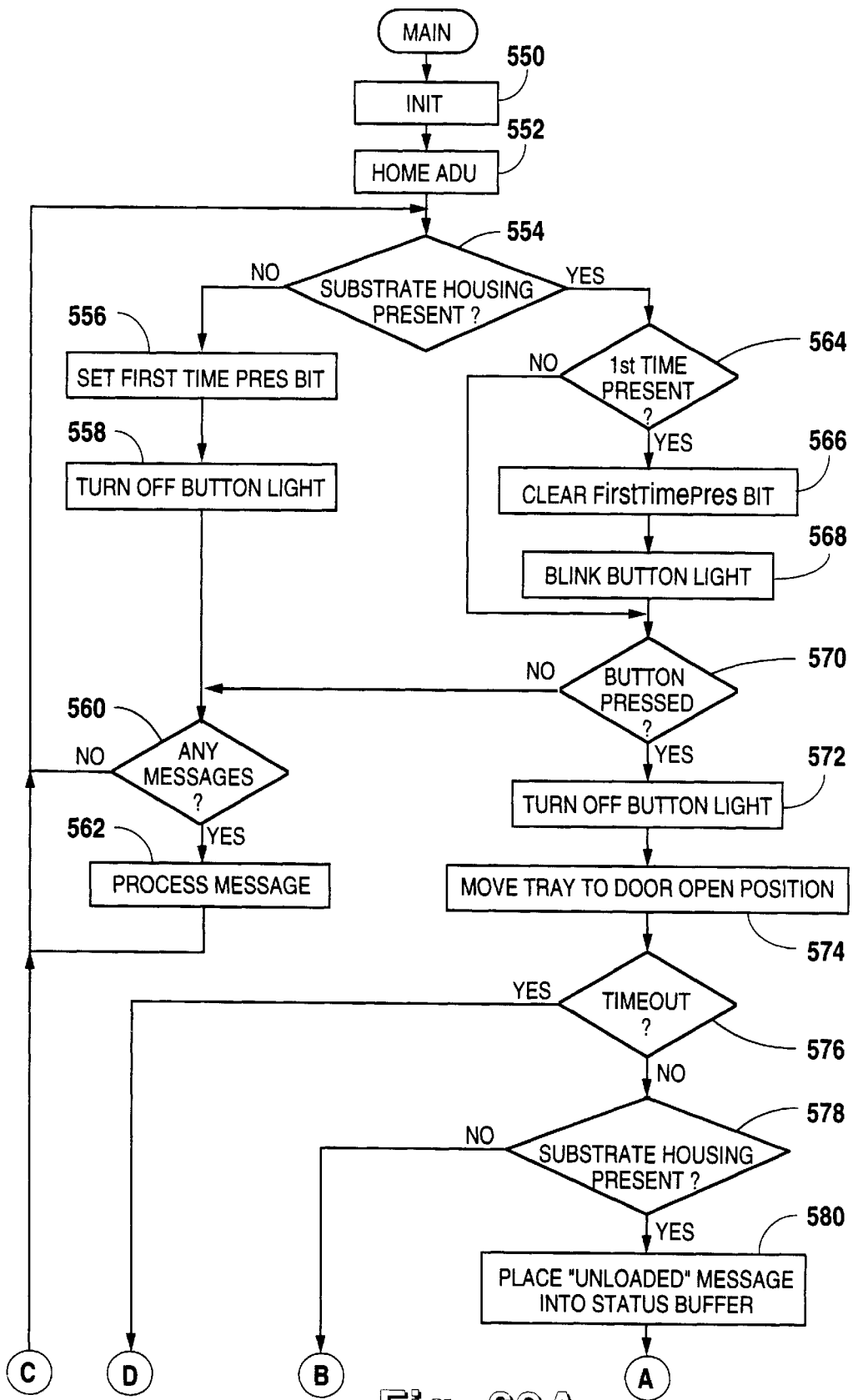
Figure 62B:
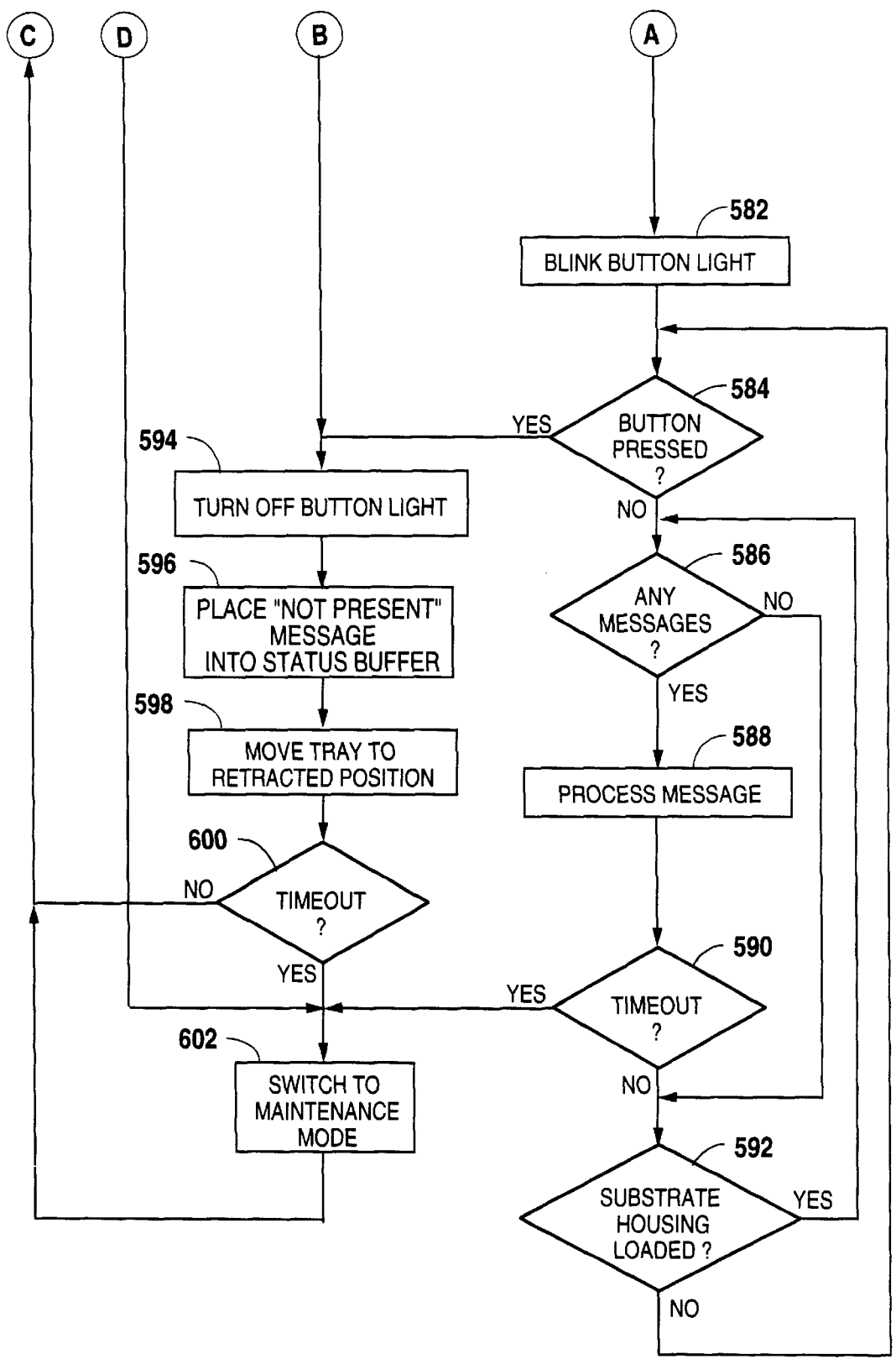

Referring now to FIGS. 62A and 62B, a flowchart diagram is shown illustrating the main routine executed by the microcontroller 512 when the docking unit 240 is powered on. Operation begins in an initialization step 550, where the microcontroller 512 and other electronic devices are initialized. For initialization purposes, a message "NOT PRESENT" is loaded into the status buffer in the event the host computer 545 queries the status by sending a status command, at which time the "NOT PRESENT" message will be sent to the host computer 545. Operation proceeds to step 552, where the docking unit 240 verifies or otherwise assures that the tray 262 is in the RETRACTED position. In the next step 554, the PRESENT bit is monitored to determine if the substrate housing 60 is present on the docking unit 240. Normally, upon powerup, the substrate housing 60 will not be present and operation proceeds to step 556, where a FIRSTTIMEPRES bit is set such that step 568 will only be executed once each time a substrate housing 60 is placed on the docking unit 240. From step 556, operation proceeds to step 558 where the button light 482 is turned off. Operation proceeds to step 560, where it is determined whether there are any messages from the host computer 545, and if so, operation proceeds to step 562 to process the messages. Message processing denotes receiving commands from and sending status information to the host computer 545, as described previously. After processing the message in step 562 or if there were no messages as determined in step 560, operation returns back to step 554 to determine if the substrate housing 60 is present. The main routine stays in this loop, processing any messages sent by the host computer 545 until a substrate housing is placed on to the docking unit 240.

When the substrate housing 60 is placed on the docking unit 240, operation proceeds to step 564 where the FIRSTTIMEPRES bit is checked to determine if this is the first time through the loop since the substrate housing 60 has been placed on the docking unit 240. If so, operation proceeds to step 566 where the FIRSTTIMEPRES bit is cleared and then to step 568 where the button light 482 is set to blink by alternatively raising and lowering the BUTTON-LGT signal. From step 568 or if the FIRSTTIMEPRES bit was clear in step 564, operation proceeds to step 570 to determine if the button 480 has been pressed.

In step 570, if the button 480 has not been pressed, operation proceeds to step 560 to process any messages from the host computer 545 and operation remains in this loop until the substrate housing 60 is removed or when the button 480 is pressed. If the button 480 is pressed, operation proceeds to step 572 where the button light 482 is turned off and then to step 574 where the tray 262 is moved to the MIDDLE position by calling a MOVEMOTOR routine, described below, to control the tray motor 282. Operation proceeds to step 576 to determine if a TIMEOUT bit has been set. The TIMEOUT bit will be described more fully below, but otherwise indicates erroneous operation. If the TIMEOUT bit has not been set, operation proceeds to step 578, where the PRESENT bit is monitored to determine if the substrate housing 60 is still present. This is a precautionary step since the substrate housing 60 could still be physically removed until it is locked in place at the door OPENED position. If the substrate housing 60 is still present, operation proceeds to step 580, where a "UNLOADED" message is loaded into the status buffer to replace the "NOT PRESENT" message indicating a new status of the system.

From step 580, operation proceeds to step 582, where the button light 482 is set to blink to prompt the operator of the system to press the button 480 in the event the operator determines that the wrong substrate housing 60 has been placed on the docking unit 240. Operation proceeds to step 584 to determine if the button 480 has been pressed. If the button 480 has been pressed, the tray 262 is moved back to the RETRACTED position. Thus, the operator presses the button 480 in the event that it is determined that the wrong substrate housing 60 has been placed on the docking unit 240.

If the button 480 has not been pressed as determined in step 584, operation proceeds to step 586 to determine if there are any messages or commands from the host computer 545, and if so, operation proceeds to step 588 to process the message or command. At this point, the host computer 545 either queries the docking unit 240 by sending a STATUS REQUEST command, or otherwise sends a LOAD command to load the substrate housing 60. After the substrate housing 60 is loaded and processed, the host computer 545 eventually sends an UNLOAD command to unload the substrate housing 60. It is noted that the host computer 545 controls whether the substrate housing 60 is loaded into the docking unit 240 or not, rather than the operator of the system. Operation proceeds from step 588 to step 590 to determine if the TIMEOUT bit has been set indicating an error. If a timeout is detected in step 590, operation proceeds to step 592, where a LOADED bit is checked to determine if the substrate housing 60 is loaded or not. If the substrate housing 60 is loaded, operation loops back to step 586 to process any further messages. If no messages or commands are received from the host computer 545 as determined in step 586, operation proceeds directly to step 592. If the substrate housing 60 is not loaded, operation loops back to step 584 to determine if the button 480 is pressed or not. While the substrate housing 60 is loaded, operation loops through steps 586 to 592 while the substrate housing 60 is being processed. Before the substrate housing 60 is loaded or after it is unloaded, operation loops through steps 584 to 592 until the button 480 is pressed. These main loops are exited if the TIMEOUT bit is set indicating erroneous operation, where operation proceeds to step 602 to enter maintenance mode.

If the button 480 is pressed as determined in step 584, or if the substrate housing 60 was not present as determined in step 578, operation proceeds to step 594 where the button light 482 is turned off and then to step 596 where the "NOT PRESENT" message is loaded into the status buffer. Operation then proceeds to step 598 where the tray 262 is moved to the RETRACTED position. In this case, the substrate housing 60 has either been removed or the button 480 was pressed to retract the substrate housing 60. Operation then proceeds to step 600 to determine if a timeout has occurred, and if not, operation returns back to step 554 to start the main loop again. If a timeout has occurred in steps 576, 590 or 600 indicating an error condition, operation proceeds to step 602 to switch to maintenance mode indicating that the docking unit 240 is not operating correctly, and maintenance is required by an operator. Operation remains in step 602 until the docking unit 240 has been repaired and returned to an operational mode, at which time operation proceeds back to the main loop beginning with step 554.

Figure 63:
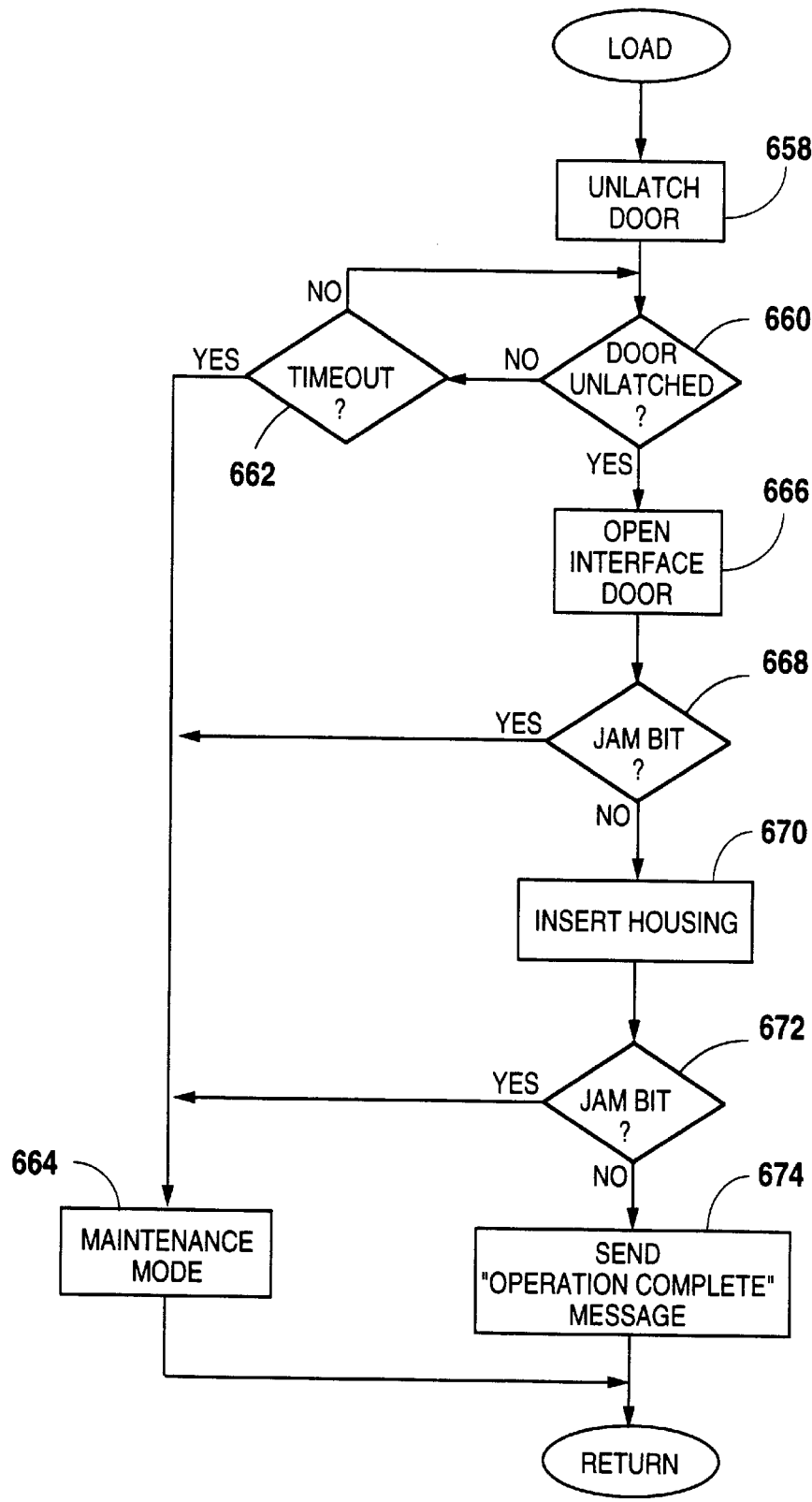
FIG. 63 shows a flowchart diagram illustrating a procedure executed by the microcontroller of FIG. 60 for loading the substrate housing onto the docking unit of FIG. 60.

Referring now to FIG. 63, a flowchart diagram is shown illustrating a procedure executed by the microcontroller 512 when the substrate housing 60 is in the MIDDLE position on the docking unit 240 and the host computer 545 sends the LOAD command to load the substrate housing 60 onto the docking unit 240. Operation begins at step 658 where the latch motor 370 is operated to unlatch the door 120. Operation proceeds to step 660 where the unlatch sensor 389 is monitored to determine when the door 120 is unlatched. Until the door 120 becomes unlatched as determined in step 660, operation proceeds to step 662 to determine whether a timeout has occurred as indicated by the TIMEOUT bit. If a timeout does not occurred, operation proceeds back to step 660 and operation loops between steps 662 and 660 until either a timeout occurs or until the door 120 is unlatched. If a timeout should occur before the door 120 is unlatched, an error condition is indicated and operation proceeds to step 664 where the microcontroller 512 enters the maintenance mode.

If the door 120 becomes unlatched in step 660 before a timeout occurs, operation proceeds to step 666 where the door motor 394 is operated to open the door 120. As will be described more fully below, this step loads certain parameters and then instructs the nicrocontroller 512 to call and execute the MOVEMOTOR routine for operating the door motor 394. As will be described below, the MOVEMOTOR routine is used to control all stepper motors, including the door motor 394 and the tray motor 282. If an error occurs during operation of a stepper motor, a JAM bit is set indicating that an error has occurred. When operation returns from the MOVEMOTOR routine in step 666, operation proceeds to step 668 where the JAM bit is monitored to determine if the door 120 has been properly OPENED. If the JAM bit is set in step 668, operation proceeds to step 664 to enter the maintenance mode. Otherwise, operation proceeds to step 670. Here, the parameters are loaded for operating the tray motor 282 to insert the substrate housing 60 to the INSERTED position and the MOVEMOTOR routine is again called. The JAM bit is set if operation terminates abnormally. Operation proceeds to step 672 from step 670 where the JAM bit is monitored. If the JAM bit is set indicating erroneous operation, operation proceeds to the maintenance mode step 664. Otherwise, tray 262 is in the INSERTED position so that the substrate housing 60 is loaded and operation proceeds to step 674, where a message "OPERATION COMPLETE" message is sent to the host computer 545, and the LOAD routine returns operation back to the MAIN routine.

Figure 64:
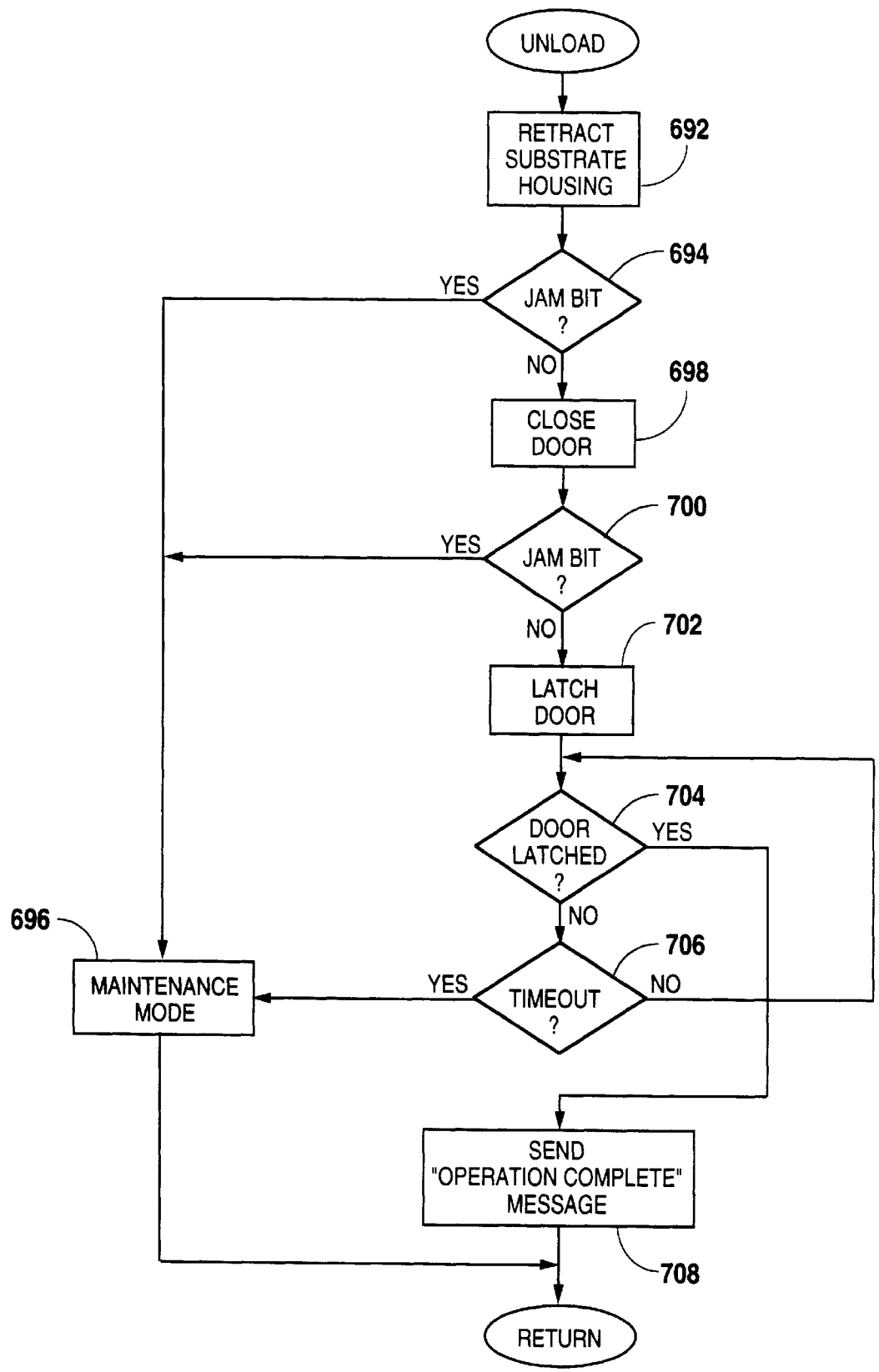
FIG. 64 shows a flowchart diagram illustrating a routine executed by the microcontroller of FIG. 60 for unloading the substrate housing from the docking unit.

Referring now to FIG. 64, a flowchart diagram of an UNLOAD routine is shown, which is executed by the microcontroller 512 when the substrate housing 60 is loaded on the docking unit 240 and the host computer 545 sends an UNLOAD command to unload the substrate housing 60. Operation begins in step 692 where parameters are loaded to operate the tray motor 282 to move the substrate housing 60 from the INSERTED position to the MIDDLE position, and again, the MOVEMOTOR routine is called. Operation proceeds to step 694 where the JAM bit is checked to determine if the substrate housing 60 has been successfully removed. If the JAM bit is set in step 694, operation proceeds to step 696 to switch to the maintenance mode indicating erroneous operation. If the JAM bit was not set as determined in step 694, operation proceeds to step 698 where the door 120 is CLOSED by setting the appropriate parameters for operating the door motor 394 and calling the MOVEMOTOR routine. Operation proceeds to step 700 where the JAM bit is checked. Again, if the JAM bit is set in step 700, operation proceeds to the maintenance mode step 696. Otherwise, operation proceeds to step 702 where the latch motor 370 is operated to latch the interface door 120. Operation then proceeds to step 704 where the unlatch sensor 389 is checked to determine if the door 120 is unlatched or not. If not, operation proceeds to step 706 to determine whether the TIMEOUT bit has been set indicating erroneous operation.

If not, operation proceeds back to step 704, where operation loops between steps 704 and 706 until the door 120 is latched or a timeout occurs. If timeout occurs in step 706, operation proceeds to the maintenance mode step 696. Otherwise, if the door 120 is latched before timeout occurs in step 704, operation proceeds to step 708 where the "OPERATION COMPLETE" message is sent to the host computer 545, and operation is returned to the MAIN routine.

Figure 65A:
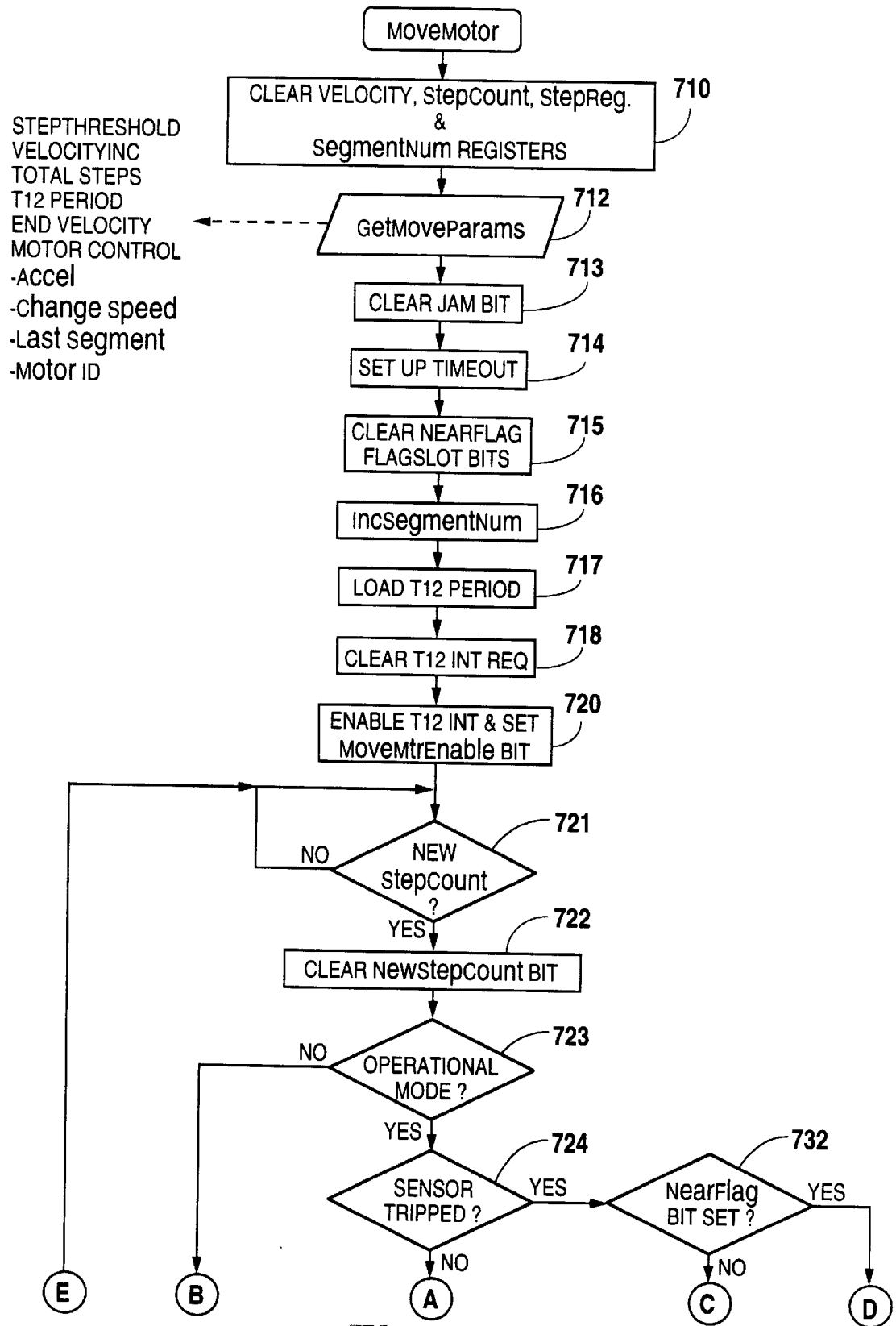
FIGS. 65A and 65B show a flowchart diagram illustrating a routine executed by the microcontroller of FIG. 60 to operate stepper motors.
Figure 65B:
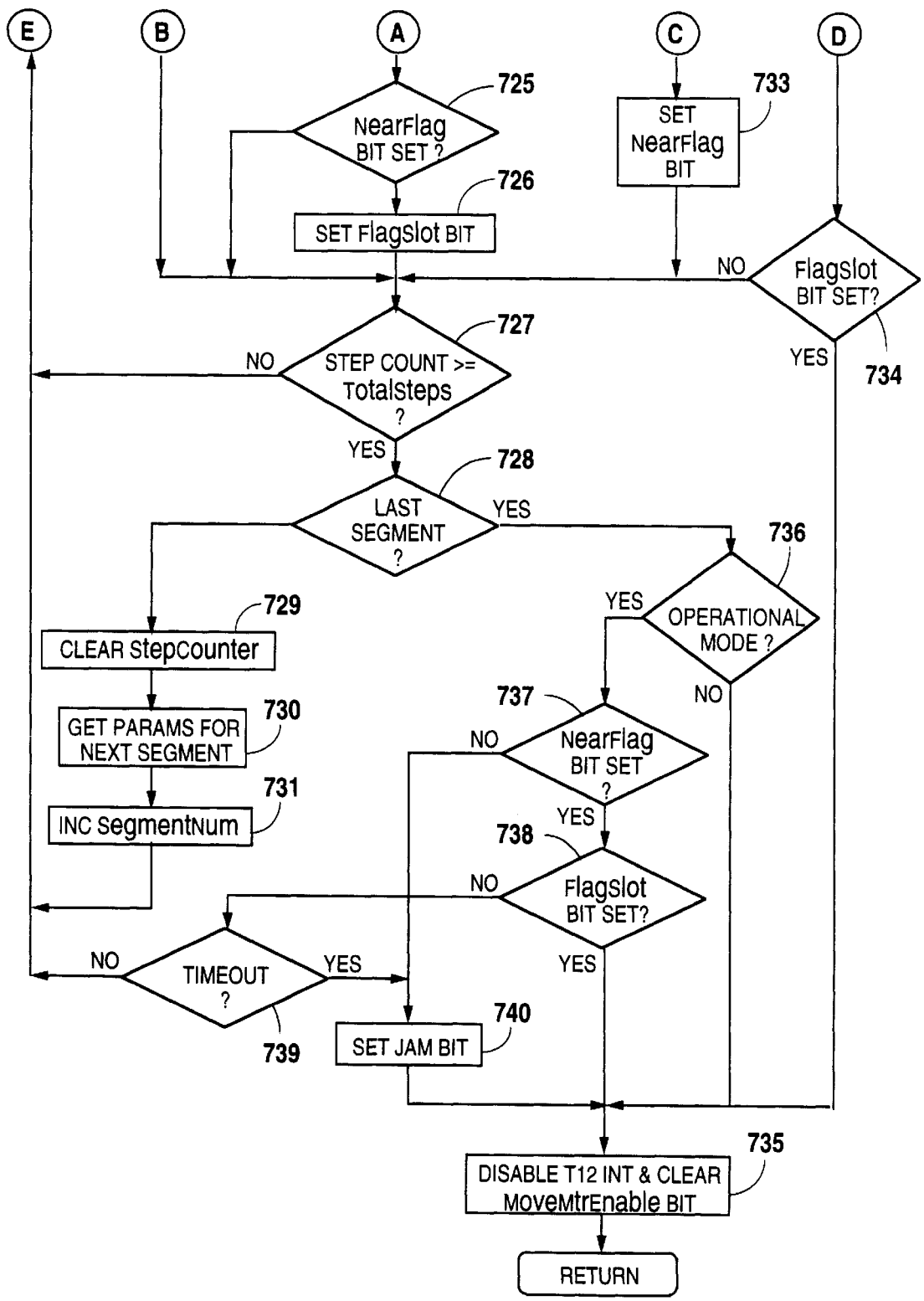

Referring now to FIGS. 65A and 65B, a flowchart diagram is shown illustrating the MOVEMOTOR routine executed by the microcontroller 512 to operate both the tray motor 282 and the door motor 394. In the preferred embodiment, only one of the stepper motors is controlled at any given time. Operation begins in step 710 where several parameters or registers are cleared, including a VELOCITY register indicating the speed of a stepper motor, a STEP-COUNT register indicating the number of steps travelled by the stepper motor, a STEPREG for accumulating velocity values for controlling velocity and acceleration of the stepper motor and a SEGMENTNUM register indicating which of multiple segments is being performed at a given time, a complete move being made up by these segments. In general, the MOVEMOTOR routine controls the respective stepper motor to accelerate from zero velocity to a predetermined velocity during a first segment, to remain at the predetermined velocity during a second segment, and to decelerate back to zero velocity during a third segment.

In the next step 712, several parameters are retrieved for the first segment of motion, where these parameters include a STEP THRESHOLD value for comparing velocity, a VELOCITYINC value for incrementing the VELOCITY register, a TOTAL STEPS value indicating the total number of steps a stepper motor should travel during the current segment, a T12 PERIOD value for loading into a period register and for comparison with a counter register causing an interrupt to call a T12ISR interrupt handling routine, described below, an ENDVELOCITY value indicative of the maximum or minimum predetermined constant velocity for a given segment, and a motor control byte or value comprising several bits, including an ACCEL bit to indicate whether a stepper motor is accelerating or decelerating, a CHANGE SPEED bit to indicate whether the velocity is changing or is constant, and a LAST SEGMENT bit which is used to indicate that the segment in which it is set is the last segment of the move.

In the next step 713, the JAM bit is cleared and then operation proceeds to step 714 where the timeout routine, described below, is set up for performing timing functions. Operation proceeds to step 715 where a NEARFLAG bit and a FLAGSLOT bit are both cleared. Each of the physical flags 305, 427 for the corresponding stepper motors 282, 370 preferably includes a center slot for purposes of control. The first time a flag breaks the light beam of the corresponding sensor, thereby tripping that sensor, it is known that the movement of a motor is near completion. The beam is then unbroken when the flag slot is reached, so that the sensor is no longer tripped. If the motion continues until the sensor is again tripped on the far side of the physical slot, motion is immediately terminated since the maximum desired travel or displacement has occurred.

In the next step 716, the SEGMENTNUM register is incremented to be ready to retrieve the parameters for the next segment and in the following step 717, the T12 PERIOD value is loaded into a PERIOD register and periodically compared to a counter register to determine how often to call a T12ISR routine, described below. In particular, the counter register counts up from zero after the period register is loaded until the value in the counter register equals the value in the period register, at which time an interrupt is generated by the microcontroller 512, which respondingly executes the T12ISR routine. In the next step 718, the current T12 and T3 interrupt requests are cleared and then the T12 and T3 interrupts are enabled in step 720 to allow the interrupt routines to be executed.

Operation proceeds to step 721 where a NEWSTEPCOUNT bit is monitored to determine if the respective stepper motor has received a pulse to increment it another step. If the NEWSTEPCOUNT bit is cleared, operation remains in step 721 until the NEWSTEPCOUNT bit is set. Since the T12 interrupt has been enabled, this bit is eventually set in the T12ISR routine. When the NEWSTEPCOUNT bit is set, operation proceeds to step 722 where the NEWSTEPCOUNT bit is cleared and then to step 723 to determine whether the mode of operation is operational or maintenance. If the operational mode is indicated, operation proceeds to step 724 to determine if the sensor corresponding to the current stepper motor being controlled has been tripped indicating that movement is near completion. If the sensor has not been tripped, operation proceeds to step 725 where it is determined whether or not the NEARFLAG bit has been set. If so, then the motion must have proceeded to the point where the slot in the physical flag has reached the sensor, and the FLAGSLOT bit is set in step 726.

If the NEARFLAG bit has not been set as determined in step 725 or after the FLAGSLOT bit is set in step 726, operation proceeds to step 727, where the value in the STEPCOUNT register is compared with the TOTAL STEPS parameter. Step 727 determines whether the current segment is finished, and if not, operation proceeds back to step 721 to determine whether the NEWSTEPCOUNT bit has been set or not. Referring back to step 727, if the value in the STEPCOUNT register becomes greater than or equal to the TOTAL STEPS parameter, operation proceeds to step 728 to monitor the LAST SEGMENT bit within the motor control byte to determine if operation is completed. If not, operation proceeds to step 729, where the STEPCOUNT register is cleared and then to step 730 to get new parameters for the next segment as was done for the first segment in step 712. Operation then proceeds to step 731, where the SEGMENT NUM value is incremented to prepare the next segment. From step 731, operation returns to step 721.

Referring back to step 724, if the sensor has been tripped, operation proceeds to step 732 to determine if the NEARFLAG bit has been previously set or not. If not, then the physical flag has just tripped the sensor and the NEARFLAG bit is set in step 733, and operation proceeds to step 727. If the NEARFLAG bit was previously set as determined in step 732, then operation proceeds to step 734 to determine whether the physical flag has gone past the slot. If the FLAGSLOT bit was previously set as determined in step 734, then 5 operation proceeds to step 735 where the T12 interrupt is disabled and a MOVEMTRENABLE bit is cleared to turn off the stepper motor and stop motion since operation is complete. The routine then exits to the calling routine. If the FLAGSLOT bit was not previously set as determined in step 734, indicating that the sensor has not reached the slot, then operation proceeds to step 727.

Referring back to step 728, if the LAST SEGMENT bit is set, operation proceeds to step 736 to determine whether the mode is operational or maintenance. If maintenance mode, operation proceeds to step 735 to stop the stepper motor and exit. Otherwise, if in operational mode as determined in step 736, operation proceeds to step 737 to determine if the NEARFLAG bit was previously set. If so, then operation proceeds to step 738 to determine if the FLAGSLOT bit has been previously set, and if not then the TIMEOUT bit is monitored in step 739 to determine if an error has occurred. If the TIMEOUT bit has not been set, operation returns back to step 721. However, if the NEARFLAG bit was not set as determined in step 737 or if the TIMEOUT bit was previously set as determined in step 739, then operation proceeds to step 740 to set the JAM bit indicating erroneous operation. From step 740 or if the FLAGSLOT bit was determined as being set in step 738, operation proceeds to step 735, described above.

Figure 66:
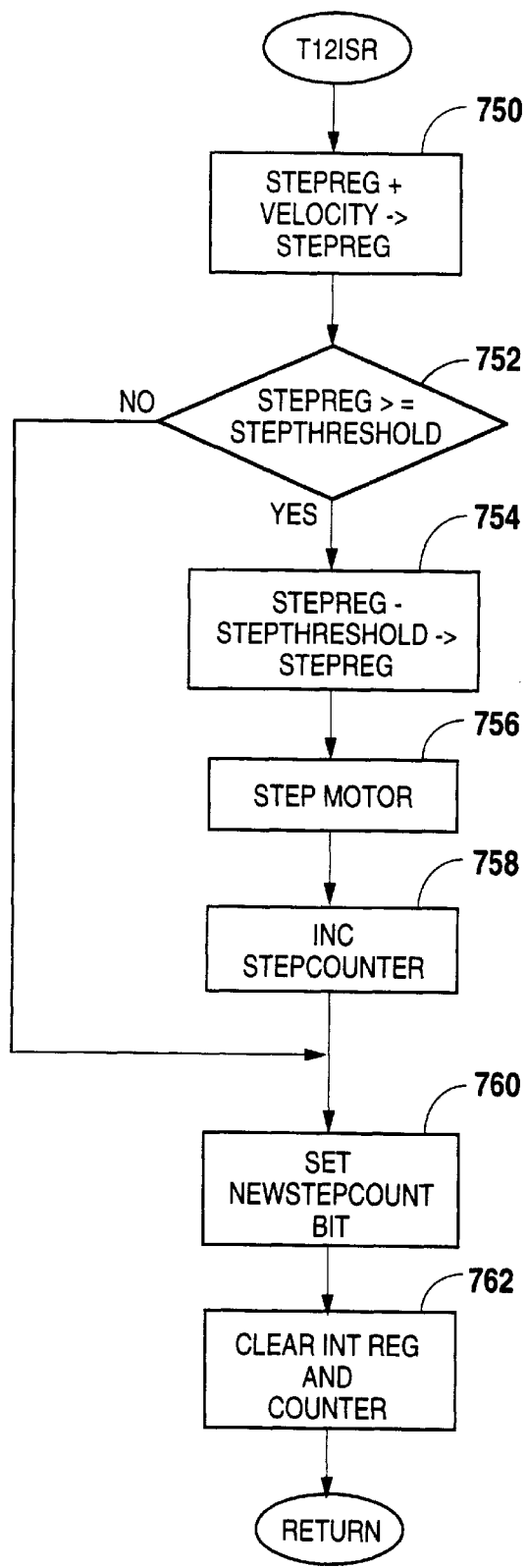
FIG. 66 shows a flowchart diagram illustrating operation of an interrupt handling routine for controlling the velocity of a stepper motor.

Referring now to FIG. 66, a flowchart diagram is shown illustrating operation of the T12ISR interrupt handling routine. In general, the T12ISR routine performs the actual stepping of the respective stepper motor being driven. Operation begins in step 750 where the STEPREG register is incremented by the value in the VELOCITY register. Operation proceeds to step 752 where the value in the STEPREG register is compared to the STEPTHRESHOLD value. If the value in the STEPREG register is greater than or equal to the STEPTHRESHOLD value, then it is determined that a pulse should be applied to the step input of the stepper motor to advance the motor by one step. If so, operation proceeds to step 754, where the STEPREG register is decreased by the STEPTHRESHOLD value. In general, the STEPREG register represents an energy value for determining the speed of the particular stepper motor being controlled, by controlling how often the motor is pulsed.

Operation proceeds to step 756 where a pulse is applied to the step input of the stepper motor to advance it one step. Note that a pulse is applied either to the TRAYMTRSTEP or DOORMTRSTEP signals depending upon which particular stepper motor is being controlled. The next step 758 increments the STEPCOUNT register indicating that the stepper motor has been advanced by one step. Operation proceeds to step 760 where the NEWSTEPCOUNT bit is set and then to step 762 where the T12 interrupt request and the counter register are both cleared. Referring back to step 752, if the STEPREG register has not yet become equal to the STEPTHRESHOLD value, operation proceeds immediately to step 760. From step 762 operation returns to the calling routine.

Figure 67:
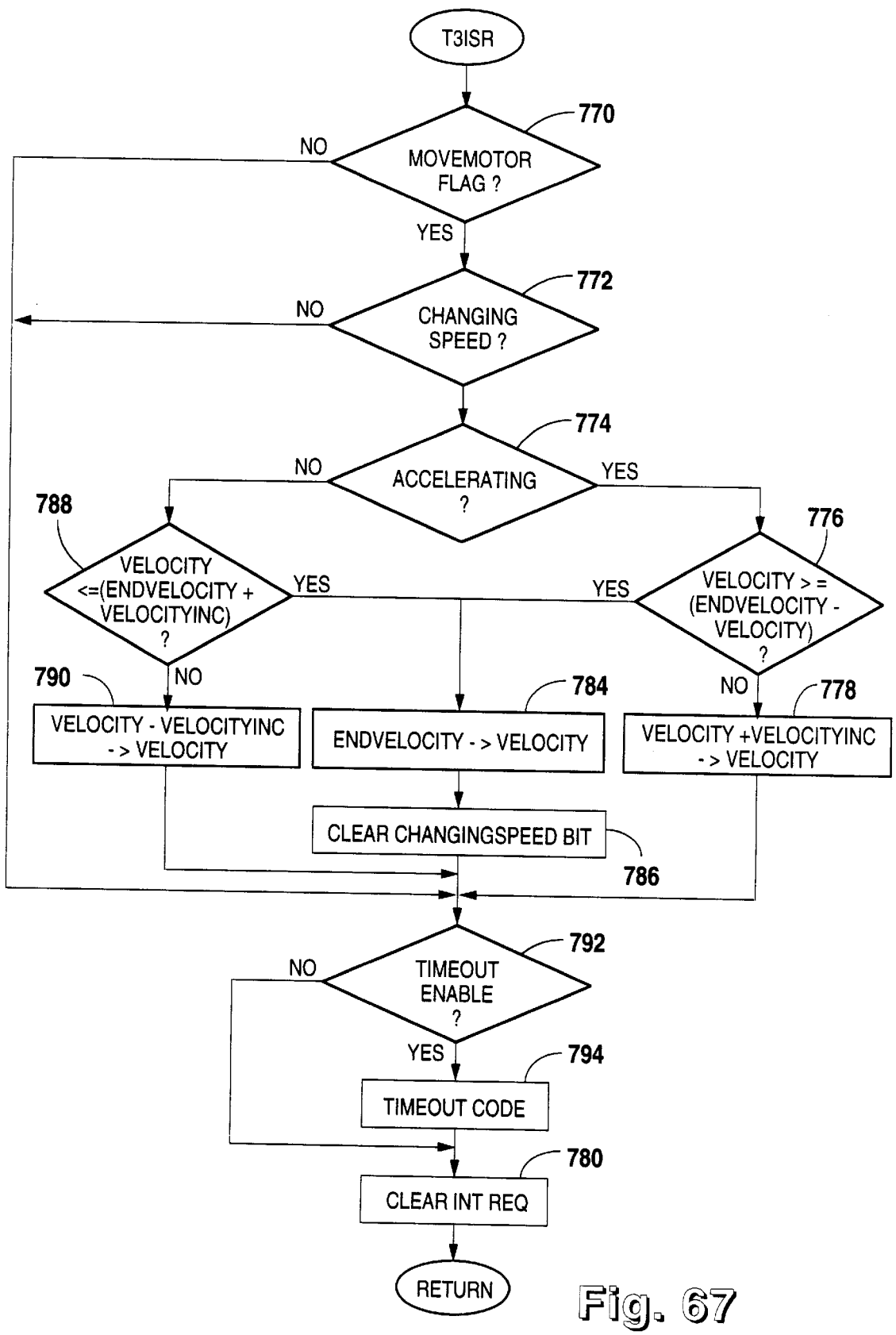
FIG. 67 shows a flowchart diagram illustrating operation of an interrupt routine for controlling the acceleration of a stepper motor.

Referring now to FIG. 67, a flowchart diagram is shown illustrating operation of the T3ISR routine for controlling the acceleration or deceleration of a particular stepper motor. Operation begins in step 770, where the MOVEMOTOR flag is monitored to determine whether a stepper motor is being controlled. If a stepper motor is being controlled, operation proceeds to step 772, where the CHANGE SPEED bit of the motor control byte is checked to determine whether the velocity is constant or to be changed (indicating acceleration or deceleration). If the velocity is not constant, operation proceeds to step 774 where the ACCEL bit is monitored to determine whether the stepper motor is being accelerated or decelerated. If the stepper motor is being accelerated, operation proceeds to step 776, where it is determined whether the value in the VELOCITY register is greater than or equal to the END VELOCITY value minus the VELOCITYINC value. This step assures that the velocity will not be increased above the END VELOCITY value. If the value in the VELOCITY register is less than the END VELOCITY value minus the VELOCITYINC value, operation proceeds to step 778 where the VELOCITY register is incremented or increased by the VELOCITYINC value and operation proceeds to step 792, described below.

Referring back to step 776, if the value in the VELOCITY register is greater than or equal to the END VELOCITY value minus the VELOCITYINC value, then operation proceeds to step 784, where the VELOCITY register is set equal to the END VELOCITY value. Operation then proceeds to step 786 where the CHANGE SPEED bit is cleared since the end velocity of the stepper motor has been achieved for the particular move segment and operation proceeds to step 792.

Referring back to step 774, if the ACCEL flag is cleared indicating that the stepper motor is decelerating, operation proceeds to step 788, where it is determined whether the value in the VELOCITY register is less than or equal to the END VELOCITY value plus the VELOCITYINC value. Here, it is determined whether a decrease of the velocity would go below the minimum velocity desired, which is represented by the END VELOCITY value. If so, operation proceeds to step 784 where the VELOCITY register is set equal to the END VELOCITY value. Otherwise, the VELOCITY register is decremented by the VELOCITYINC value in step 790 and operation proceeds to step 792.

Referring back to step 770, if a MOVEMTRENABLE bit is not set, or if in step 772 it is determined that the CHANGESPEED bit is not set, indicating a constant speed, 15 operation proceeds to step 792 to determine if the timeout routine is enabled indicating whether an operation is being timed. Usually, the timeout routine is enabled to operate as a watchdog type timer when a motor is being operated to prevent operation from continuing indefinitely. Also, the timeout routine could be used to determine whether a predetermined period of time has elapsed. If timeout is enabled as determined in step 792, operation proceeds to step 794 to execute timeout code which sets the TIMEOUT bit if a predetermined amount of time elapses since the timeout was enabled. Then, operation proceeds to step 780 from step 794. If the timeout is not enabled in step 792, operation proceeds directly to step 780, where the T3 interrupt request is cleared and operation returns to the calling routine.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A docking unit for receiving a housing containing articles and for manipulating the housing to allow access of the articles while in the housing, the housing including a door and an interior space for holding the articles, the docking unit comprising:

a bulkhead assembly defining a port area;

a tray assembly mounted to said bulkhead assembly for receiving the housing and for allowing movement of the housing between an initial access position adjacent said bullhead assembly and an inserted access position within said bulkhead assembly while the housing is on said tray assembly; and a door drive assembly mounted to said bulkhead assembly for interfacing the door of the housing when the housing is in said initial access position and for opening and closing the housing door, wherein the interior of the housing is accessible via said port area when the housing door is open.

2. The docking unit of claim 1, wherein said tray assembly comprises:

guide rails;

a tray for receiving and holding the housing, said tray slidably engaging said guide rails;

a drive assembly operatively engaged with said tray;

a gearbox operatively engaging said drive assembly; and a tray motor operatively engaged with said gearbox for moving the housing between said initial and said inserted access positions.

3. The docking unit of claim 2, further comprising:

said tray assembly further including a retracted position for laterally receiving the housing before the housing is moved to said initial access position;

a tray location flag mounted to said drive assembly indicative of the position of said tray;

a tray retracted sensor positioned to interface said tray location flag when said tray is in said retracted position;

a tray middle sensor positioned to interface said tray location flag when said tray is in said retracted position;

a tray middle sensor positioned to interface said tray location flag when said tray is in said access position;

a tray inserted sensor positioned to interface said tray location flag when said tray is in said inserted access position; and a controller coupled to said tray motor and said tray sensors, said controller receiving signals from said tray sensors and controlling said tray motor to control the position of said tray.

4. The docking unit of claim 1, wherein said door drive assembly comprises:

a pivot assembly for interfacing the door of the housing; and a door motor operatively engaging said pivot assembly for pivotally opening and closing the housing door.

5. The docking unit of claim 4, further comprising:

a door flag mounted to said pivot assembly indicative of the position of said door motor;

a door closed sensor positioned to interface said door flag when said tray is in said initial access position and the housing door is closed;

a door opened sensor positioned to interface said door flag when said tray is in said initial access position and the housing door is open; and a controller coupled to said door motor and said door sensors, said controller receiving signals from said door sensors and controlling said door motor to open and close the housing door.

6. The docking unit of claim 1, wherein the housing includes a door actuator assembly connected to the housing door which operatively engages said pivot assembly when the housing is in said initial access position, wherein said door drive assembly simultaneously opens and closes the housing door.

7. The docking unit of claim 1, wherein the housing includes a latch for locking the housing door, said docking unit further comprising:

a cam follower assembly mounted to said tray assembly and operatively engaging the latch of the housing for locking and unlocking the housing door while in said initial access position; and a cam assembly mounted to said bulkhead assembly and operatively engaging said cam follower assembly.

8. The docking unit of claim 7, further comprising:

said cam assembly including a cam motor operatively engaging a cam, wherein said cam engages said cam follower assembly;

a latch flag operatively engaged with said cam assembly having a position indicative of the position of said cam;

a latch locked sensor positioned to interface said latch flag when said tray is in said initial access position and the housing door is locked;

a latch unlocked sensor positioned to interface said latch flag when said tray is in said initial access position and the housing door is unlocked; and a controller coupled to said cam motor and said latch sensors, said controller receiving signals from said latch sensors and controlling said cam motor to lock and unlock the housing door.

9. The docking unit of claim 1, wherein the housing includes a memory device mounted to the housing for storing information of the articles within the housing, said docking unit further comprising:

a communication link mounted to said tray assembly for electrically interfacing said memory device when the housing is placed on said tray assembly; and a processing system electrically coupled to said communication link, wherein said processing system detects the presence of said memory device and the housing when placed on said tray assembly, wherein said processor system thereafter retrieves said stored information from said memory device.

10. The docking unit of claim 9, wherein said information stored in said memory device includes identification and history of the articles in the housing.

11. The docking unit of claim 9, further comprising:

said tray assembly further including a retracted position for laterally receiving the housing before the housing is moved to said initial access position, and said processing system being electrically coupled to control said tray assembly and said door drive assembly and further electrically coupled to said communication link, wherein said processing system periodically polls said communication link for determining the presence of said memory device and the housing and wherein said processing system moves the housing to said initial access position upon detecting the presence of the housing.

12. The docking unit of claim 11, further comprising:

a button coupled to said processing system, and wherein said processing system moves the housing to said initial access position from said retracted position when the housing is detected present and after said button is pressed.

13. The docking unit of claim 12, wherein said processing system comprises:

a controller including a second communication link; and a host computer coupled to said controller through said second communication link, wherein said host computer queries the controller for the status of the housing, wherein said controller respondingly indicates whether the housing is present and if so, the position of the housing on the docking unit.

14. The docking unit of claim 13, wherein said host computer sends an insert command to the controller when the housing is in said initial access position, wherein said controller respondingly opens the housing door and places the housing in said inserted access position.

15. The docking unit of claim 13, wherein said host computer further queries said controller about the articles in the housing and said controller respondingly retrieves said information from said memory device and provides said information to said host computer.

16. The docking unit of claim 13, wherein said host computer sends updated information to said controller, which respondingly writes said updated information to said memory device.

17. The docking unit of claim 13, wherein said host computer sends a retract command to the controller when the housing is in said inserted access position, wherein said controller respondingly moves the housing to said initial access position and closes the housing door.

18. The docking unit of claim 1, further comprising:
   a top plate removeably mounted to said bulkhead assembly; and
   a bottom plate mounted to said bulkhead assembly, wherein said top plate is removed and replaced by a bottom plate of a second docking unit in a stacked configuration.

19. A docking system adjacent a mini environment for maintaining a plurality of substrates in a substantially clean environment and for allowing access of the substrates from the mini environment, the docking system comprising:
   a portable housing, comprising:
      a container having an interior space and an opening,
      a plurality of substrate supports mounted within said container for receiving and supporting the plurality of substrates in spaced relationship relative to each other, and
      a door pivotally mounted to said container for covering said opening when said door is in a closed position;
   a bulkhead assembly defining a port area that is accessible from the mini environment;
   a tray assembly mounted to said bullhead assembly for receiving said housing and for moving said housing between an initial access position adjacent said bulkhead assembly and an inserted access position within said bulkhead assembly while said housing is on said tray assembly: and
   a door drive assembly mounted to said bulkhead assembly for interfacing said door of said housing when said housing is in said initial access position and for opening and closing said housing door, wherein said interior of said housing is accessible via said port area and said mini environment when said door of said housing is open.

20. The docking system of claim 19, further comprising:
   a port door pivotally connected to said bulkhead assembly for separating said port area from ambient air when said port door is in a closed position.

21. The docking system of claim 20, wherein said housing further comprises:
   a door actuator assembly connected to said door of said housing, said door actuator assembly operatively engaging said port door and said door drive assembly so that said port door and said housing door are simultaneously opened and closed by said door drive assembly.

22. The docking system of claim 21, further comprising:
   said door actuator assembly including a pivotal door assembly for pivotally moving said housing door relative to said housing; and
   said door drive assembly including a pivotal key operated actuator which operatively engages said pivotal door assembly when said housing is in said initial access position.

23. The docking system of claim 22, further comprising:
   a track assembly mounted to said box, said track assembly including one or more tracks each having a channel for slidably engaging said pivotal door assembly, wherein after said housing door is opened by said door drive assembly and placed in a stowed position above said housing, said housing door remains stationary in said stowed position while said tray assembly moves said housing into said inserted access position.

24. The docking system of claim 19, further comprising:
   said tray assembly further including a retracted position for laterally receiving said housing, wherein said tray assembly and housing are subsequently moved to said initial access position.

25. A method for positioning a housing in proximity to a selected environment, comprising the steps of:
   positioning said housing in a retracted position atop a movable tray of a docking unit, said housing having a door permitting access to an interior cavity within said housing;
   moving said tray to thereby move said housing to a middle position relative to said docking unit;
   simultaneously pivoting said housing door and a door of said docking unit adjacent to said housing door, and
   moving said tray to thereby move said housing to an inserted position relative to said docking unit, said inserted position being in proximity to said selected environment.

26. A method for positioning a housing, as recited in claim 25, further comprising the step of sensing the position of said tray at said retracted position, said middle position, and said inserted position.

27. A method for positioning a housing, as recited in claim 25, further comprising the step of unlocking said housing door prior to said step of simultaneously pivoting said housing door and said docking unit door.

28. A method for positioning a housing, as recited in claim 27, wherein said step of unlocking said housing door comprises the step of actuating a cam assembly to engage a housing door latch.

29. A method for positioning a housing, as recited in claim 25, further comprising the steps of retracting said tray to said middle position and simultaneously closing said housing door and said docking unit door after said step of moving said tray to said inserted position.

* * * * *